(12) United States Patent
Colson et al.

(10) Patent No.: US 6,883,213 B2
(45) Date of Patent: Apr. 26, 2005

(54) APPARATUS FOR PRODUCING NON-WOVEN FABRIC

(75) Inventors: Wendell B. Colson, Weston, MA (US); Kevin M. Dann, Denver, CO (US)

(73) Assignee: Hunter Douglas Inc., Upper Saddle River, NJ (US)

( * ) Notice: Subject to any disclaimer, the term of this patent is extended or adjusted under 35 U.S.C. 154(b) by 0 days.

(21) Appl. No.: 10/918,641

(22) Filed: Aug. 12, 2004

(65) Prior Publication Data

US 2005/0044677 A1 Mar. 3, 2005

Related U.S. Application Data

(63) Continuation-in-part of application No. 10/621,084, filed on Jul. 15, 2003, which is a continuation-in-part of application No. 09/869,941, filed as application No. PCT/US00/00571 on Jan. 10, 2000, now abandoned.

(60) Provisional application No. 60/154,717, filed on Sep. 20, 1999, provisional application No. 60/155,364, filed on Sep. 20, 1999, provisional application No. 60/155,365, filed on Sep. 20, 1999, and provisional application No. 60/115,600, filed on Jan. 12, 1999.

(51) Int. Cl.$^7$ .............................................. B65H 54/00
(52) U.S. Cl. ........................... 28/101; 28/172.1; 28/176
(58) Field of Search ........................... 28/101, 102, 140, 28/142, 172.1, 190, 194, 176, 149, 151, 152, 192, 193, 195; 156/425–433, 436, 439, 441, 161, 162, 169, 172, 173, 178, 174, 175; 242/364.9, 439, 443, 443.1, 444, 134, 151, 140

(56) References Cited

U.S. PATENT DOCUMENTS

| | | | | |
|---|---|---|---|---|
| 1,338,164 A | * | 4/1920 | Angier | 156/430 |
| 1,518,120 A | * | 12/1924 | Rhoades | 28/176 |
| 1,951,301 A | * | 3/1934 | Angier et al. | 156/430 |

(Continued)

FOREIGN PATENT DOCUMENTS

| | | |
|---|---|---|
| CA | 889808 | 1/1972 |
| DE | 30 46 432 | 8/1982 |
| DE | 30 46 431 | 9/1982 |
| EP | 0 255 596 | 2/1988 |
| EP | 0 292 266 A2 | 11/1988 |
| EP | 0 470 584 A2 | 2/1992 |
| EP | 0 885 803 A2 | 12/1998 |
| GB | 1 440 081 | 6/1976 |
| GB | 1 463 969 | 2/1977 |
| GB | 2 041 028 A | 9/1980 |
| JP | 63-267525 A | 11/1988 |
| JP | 1-210318 A | 8/1989 |
| WO | WO 80/02850 | * 12/1980 |
| WO | WO 00/41523 | 7/2000 |
| WO | WO 01/21383 A1 | 3/2001 |
| WO | WO 01/21399 A | 3/2001 |
| WO | WO 01/21877 A1 | 3/2001 |
| WO | WO 01/21877 | * 3/2001 |

Primary Examiner—A. Vanatta
(74) Attorney, Agent, or Firm—Dorsey & Whitney LLP

(57) ABSTRACT

An apparatus for applying weft yarns in a cross direction to warp yarns assembled on a beam in parallel aligned relationship and having an adhesive scrim thereon includes a supply roll of the warp yarns on such a beam which are fed downstream of the apparatus by first laying the warp yarns onto a transfer belt to reduce the tension in the yarns and controlling them for application of the weft yarns. A transfer belt and warp yarns are first folded between folding bars into a cylindrical configuration where they are formed around the perimeter of an elongated mandrel having a heated section at its upstream end and a cooling section at its downstream end. Weft yarns are wrapped around the warp yarns and the supporting transfer belt within a rotating tube having a plurality of longitudinally and circumferentially spaced spools of weft yarn disposed on its outer surface.

13 Claims, 47 Drawing Sheets

U.S. PATENT DOCUMENTS

| | | | | |
|---|---|---|---|---|
| 2,093,206 A | * | 9/1937 | Muller | 57/7 |
| 2,797,728 A | * | 7/1957 | Slayter et al. | 156/175 |
| 3,041,230 A | * | 6/1962 | Diehl | 156/172 |
| 3,493,455 A | * | 2/1970 | Lebolt et al. | 28/101 |
| 3,496,053 A | | 2/1970 | Bascom et al. | 161/57 |
| 3,538,564 A | | 11/1970 | Skoler et al. | 28/72.2 |
| 3,591,434 A | | 7/1971 | Hartstein | 156/178 |
| 3,663,331 A | | 5/1972 | Solbeck | 156/181 |
| 3,686,048 A | | 8/1972 | Schirtzinger | 156/161 |
| 3,736,210 A | * | 5/1973 | Kaczerginski | 242/441.2 |
| 3,737,950 A | | 6/1973 | Bolliand et al. | 19/65 T |
| 3,753,842 A | | 8/1973 | Pittman | 161/57 |
| 3,950,583 A | * | 4/1976 | Patin | 28/101 |
| 4,132,828 A | | 1/1979 | Nakamura et al. | 428/366 |
| 4,202,718 A | * | 5/1980 | Mizutani et al. | 156/171 |
| 4,265,691 A | * | 5/1981 | Usui | 156/172 |
| 4,411,722 A | * | 10/1983 | Yazawa et al. | 156/167 |
| 4,460,633 A | | 7/1984 | Kobayashi et al. | 428/110 |
| 4,498,941 A | | 2/1985 | Goldsworthy | 156/148 |
| 4,511,424 A | * | 4/1985 | Usui | 156/426 |
| 4,578,141 A | * | 3/1986 | Gidge et al. | 28/101 |
| 4,687,528 A | | 8/1987 | Held | 156/150 |
| 4,794,855 A | | 1/1989 | Okajima et al. | 100/154 |
| 4,906,784 A | | 3/1990 | Skoler | 528/125 |
| 5,061,545 A | | 10/1991 | Li et al. | 428/195 |
| 5,097,783 A | | 3/1992 | Linville | 114/103 |
| 5,536,356 A | | 7/1996 | Stuerzel | 156/514 |
| 5,558,016 A | | 9/1996 | De Brock | 100/93 P |
| 5,965,262 A | * | 10/1999 | Whisler et al. | 428/373 |
| 6,227,271 B1 | | 5/2001 | Pourmand et al. | 156/498 |
| 6,494,980 B1 | * | 12/2002 | Rothemeyer et al. | 156/169 |
| 6,805,771 B1 | | 10/2004 | Colson et al. | 156/583.5 |
| 2003/0051795 A1 | * | 3/2003 | Burgess | 156/169 |
| 2003/0233744 A1 | | 12/2003 | Colson et al. | 28/190 |

* cited by examiner

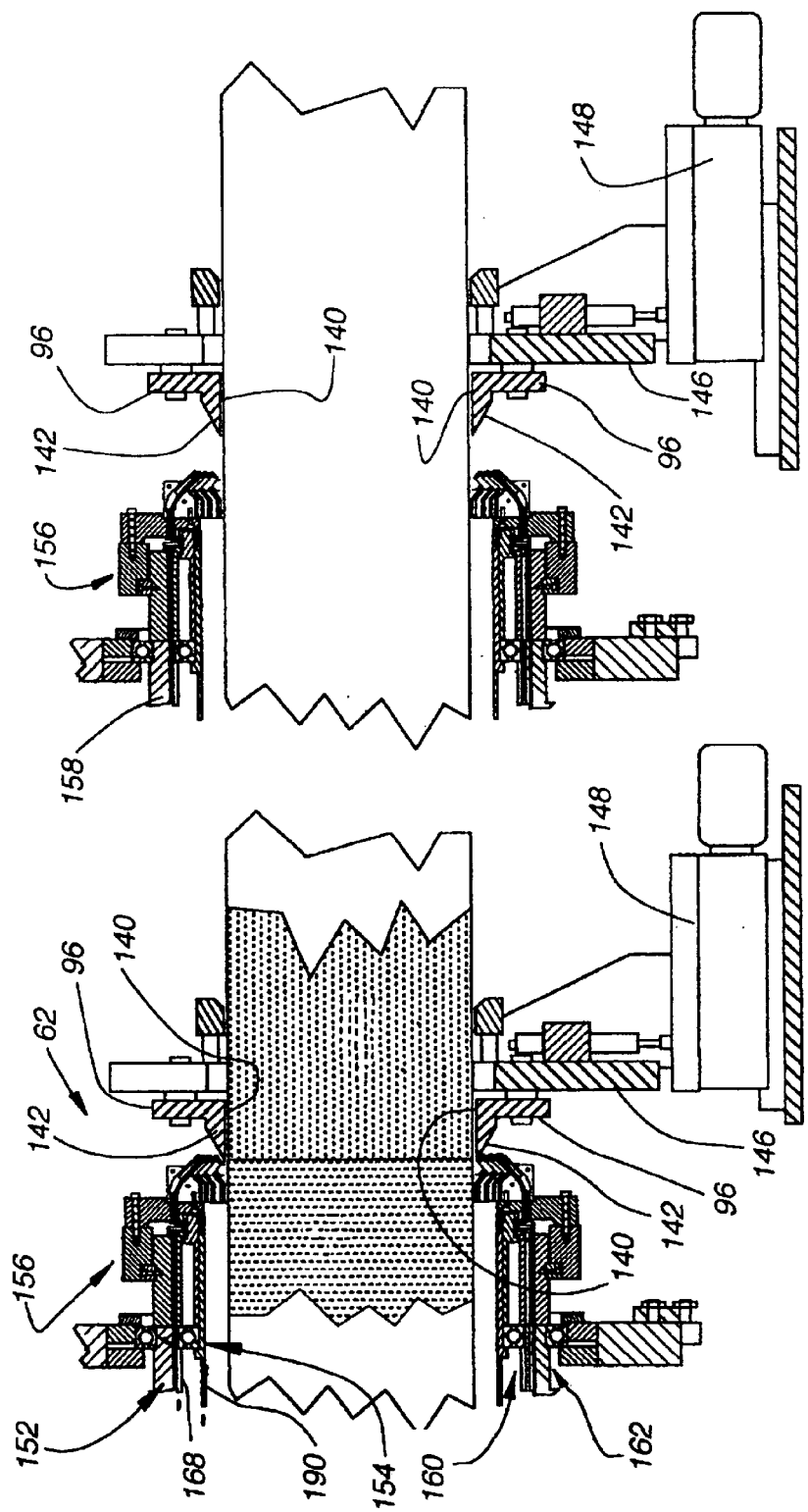

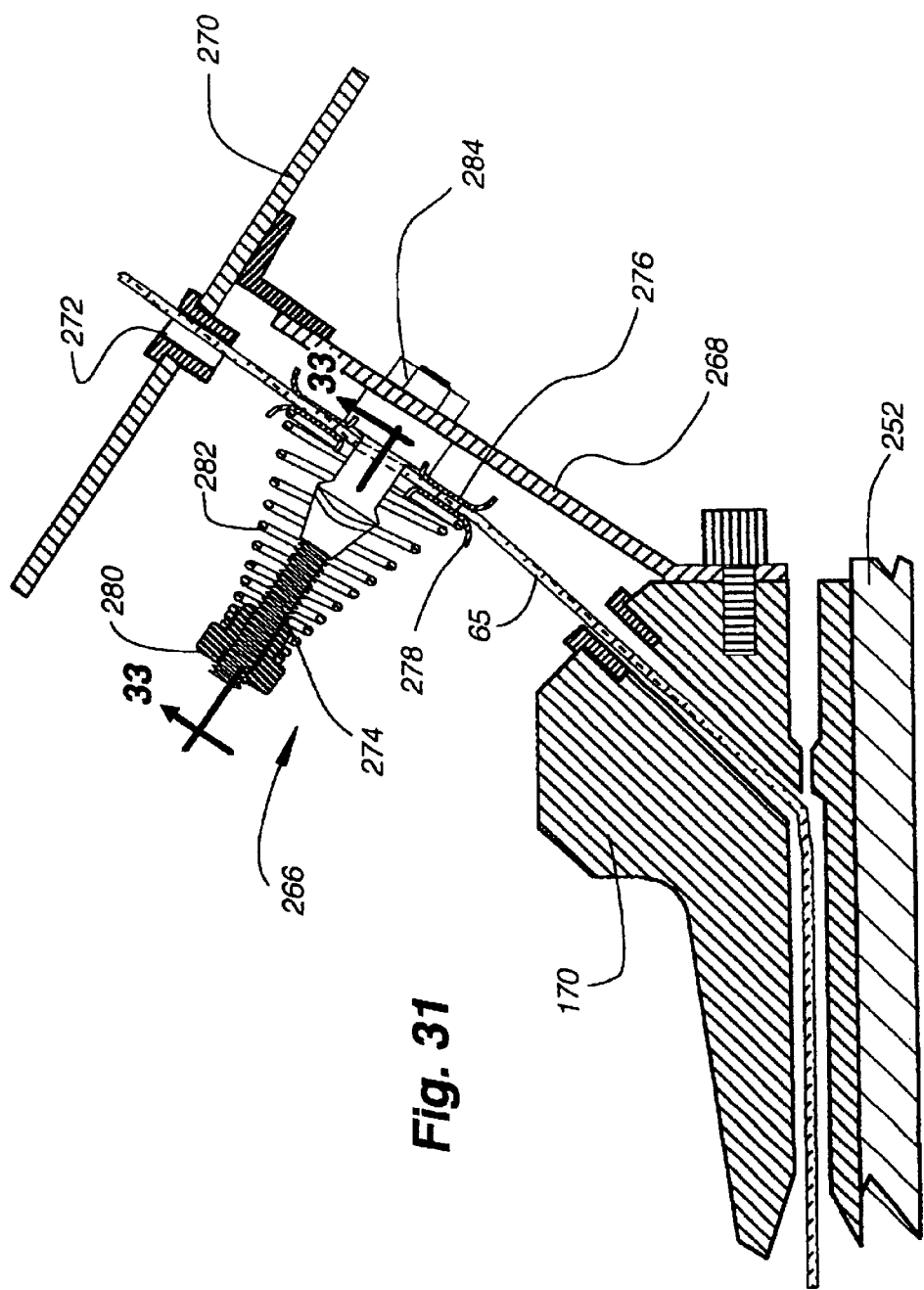

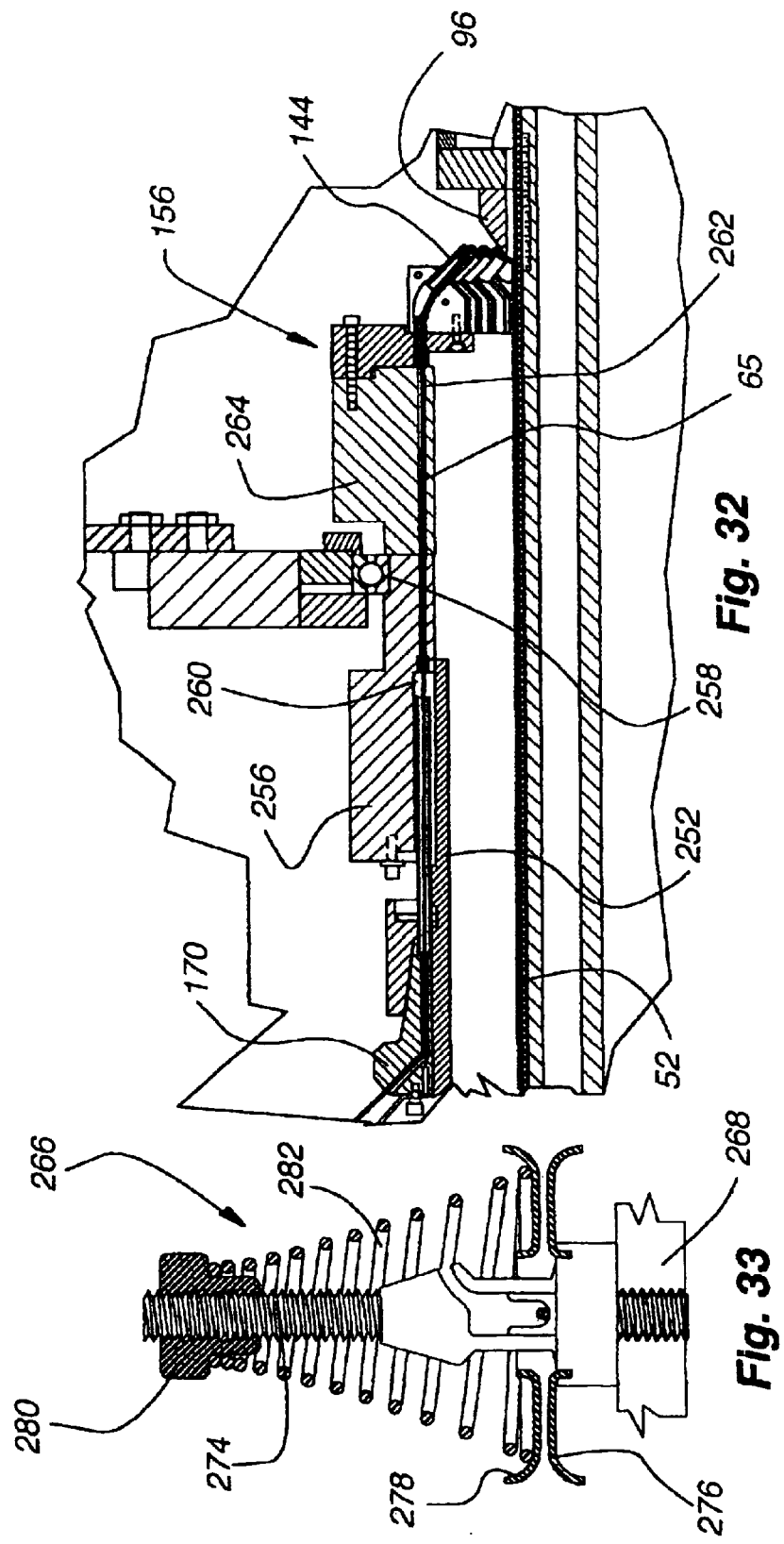

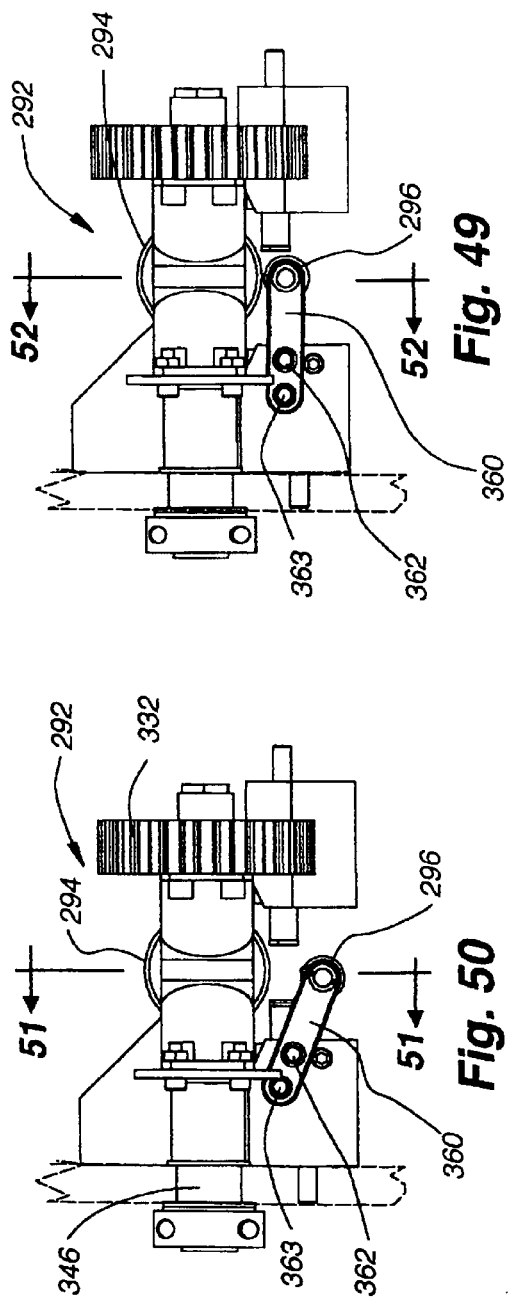
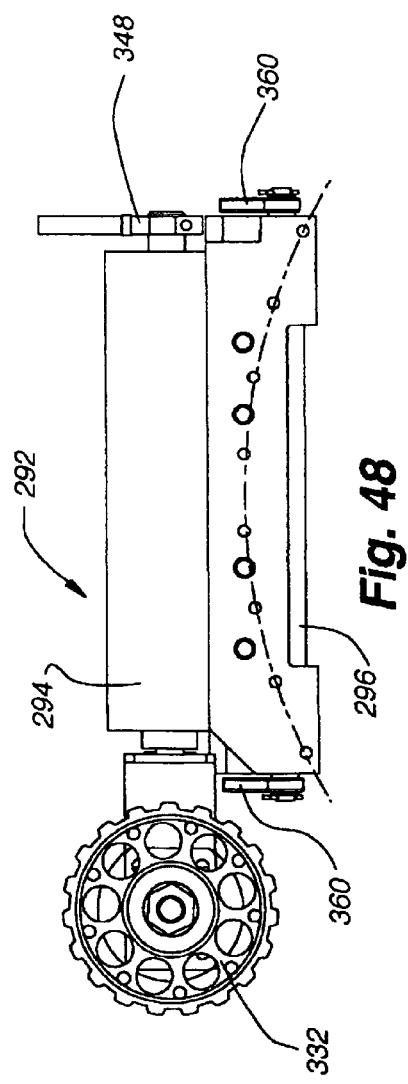

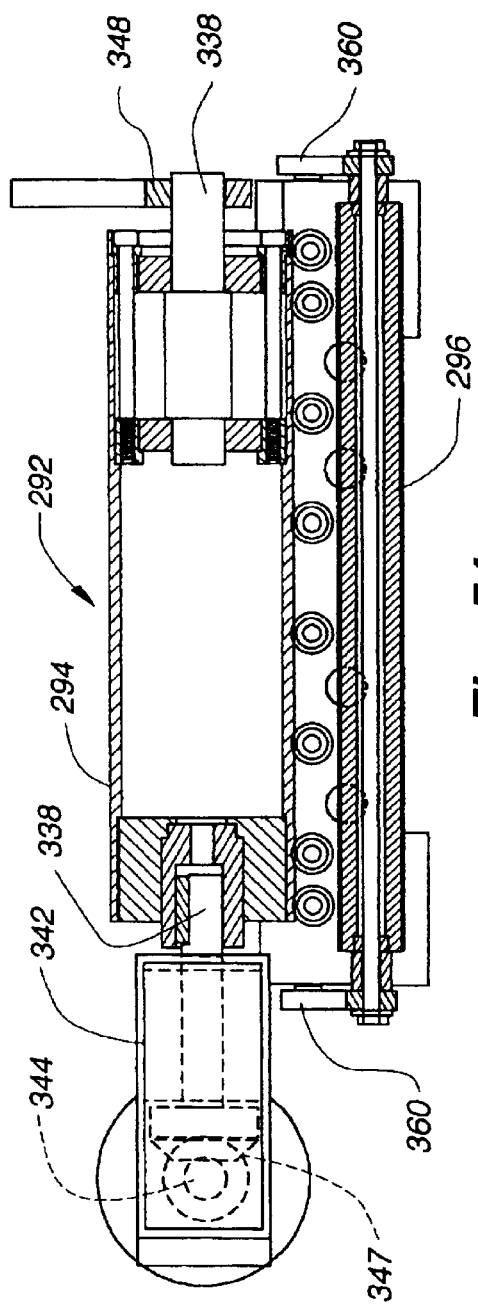
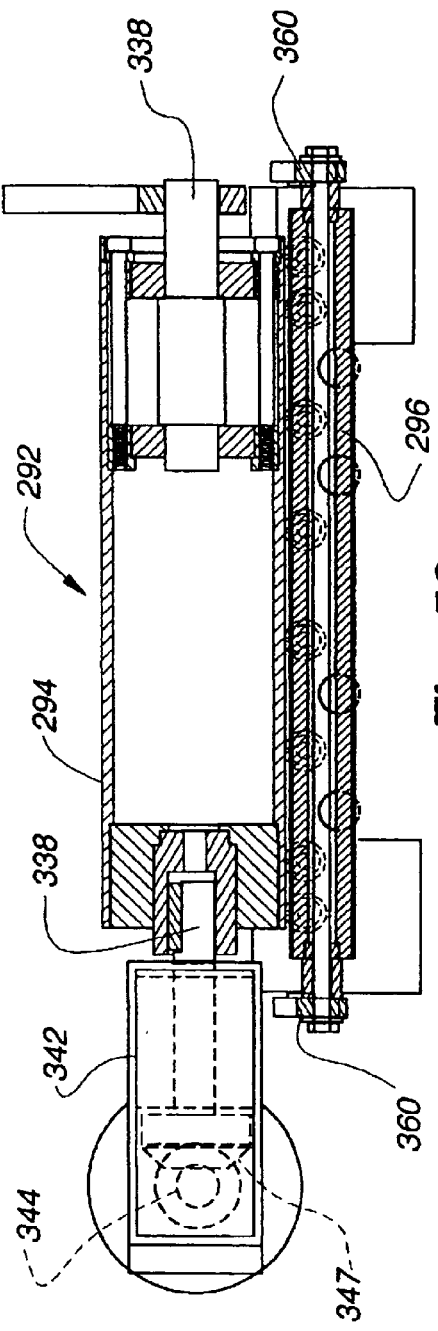

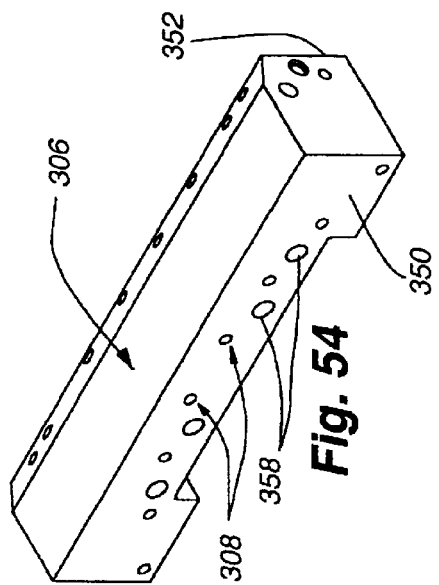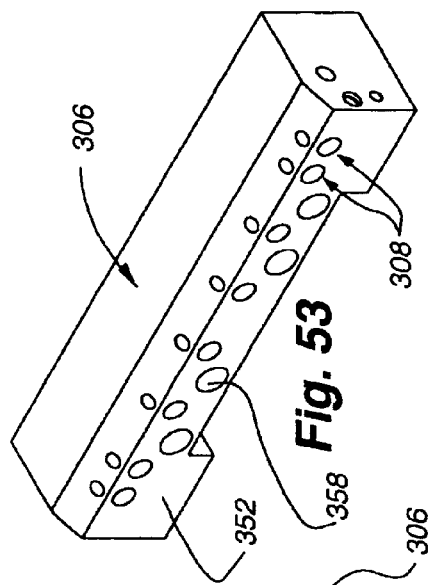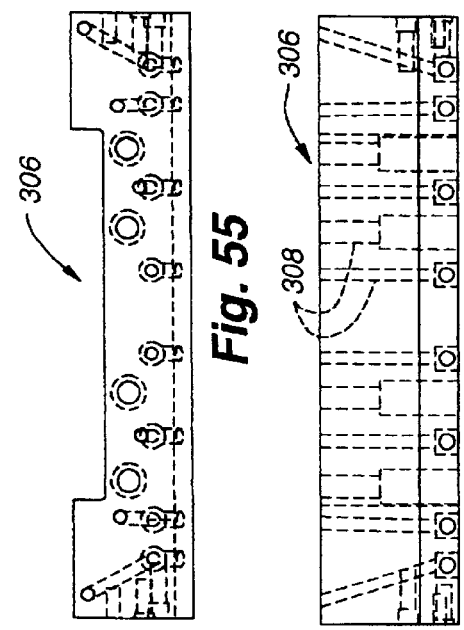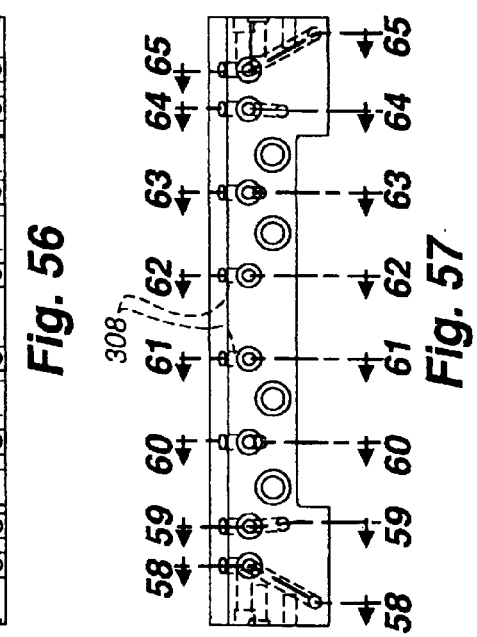

APPARATUS FOR PRODUCING NON-WOVEN FABRIC

CROSS REFERENCE TO RELATED APPLICATIONS

This application is a continuation-in-part of U.S. application Ser. No. 10/621,084 filed Jul. 15, 2003, which is a continuation-in-part of U.S. application Ser. No. 09/869,941 filed 4 Jan. 2002, now abandoned which application is the Section 371 (c) filing of PCT Application No. PCT/US00/00571, filed 10 Jan. 2000. This application also claims domestic priority from the following provisional applications, U.S. 60/115,600, filed 12 Jan. 1999; U.S. 60/154,717, filed 20 Sep. 1999; U.S. 60/155,364, filed 20 Sep. 1999, and U.S. 60/155,365, filed 20 Sep. 1999, the disclosures of which are hereby incorporated herein by reference.

BACKGROUND OF THE INVENTION

1. Field of the Invention

This invention relates generally to textile fabrication apparatus, and more specifically to an apparatus for aligning and depositing weft textile yarns, threads or filaments onto aligned warp textile yarns or filaments while controlling and unifying the tension in the weft yarns to produce non-woven fabrics having the appearance of woven fabrics.

2. Description of Background Art

Traditionally, fabrics having generally perpendicularly extending warp and weft yarns have been woven with a loom so that the yarns extending in one direction pass over and under the yarns extending in the perpendicular direction. The yarn densities in both the warp and weft directions, however, are limited not only by the diameters of the yarns extending in the respective warp or weft directions but by the sizes of the orthogonally-extending yarns over and under which they are woven. Because woven yarns are typically comprised of yarns that extend in parallel and orthogonal directions in regular patterns, these fabrics are generally aesthetically pleasing especially when compared to traditional non-woven fabrics. The weaving of woven fabrics, however, is a relatively time consuming process having maximum production rates of around 10 ft/minute or less making woven fabrics expensive when compared to non-woven fabrics.

Traditional nonwoven fabrics comprise non-aligned, generally randomly orientated yarns that are bound into a fabric mat. These types of fabrics can be produced at extremely high rates of speed up to an order of magnitude greater than woven fabrics. Further, depending on the adhesives used to join the yarns together, traditional non-woven fabrics can have physical properties equal to or in excess of woven fabrics of comparable thicknesses and densities. In variations of the traditional non woven mat fabrics a certain portion of the yarns may be aligned in one or more directions to create fabrics with anisotropic properties. Traditional nonwoven fabrics are generally not particularly aesthetically pleasing and as such are not used very often in applications where appearance is important.

Nonwoven fabrics that comprise a layer of aligned weft yarns and a layer of aligned warp yarns are also known that resemble woven fabrics. The warp and weft yarns of either layer do not intermingle, rather, an aligned planer layer of warp yarns overlies an aligned layer of weft yarns, wherein the two layers are typically joined together by a mechanical, thermal or chemical means, such as adhesive bonding. Because the layers do not intermingle, each yarn is uncrimped as it passes over or under other yarns. The result is a fabric with superior physical characteristic when compared to woven fabrics depending on the manner in which the warp and weft layers are joined together. Further, because the yarns do not pass over and under one another, very high potential fiber densities are potentially possible in both the weft and warp directions. Another advantage of nonwoven fabrics is that they have the potential to be produced faster and cheaper than comparable woven fabrics.

As known in the prior art, a nonwoven fabric having the appearance of a woven fabric can be formed by pulling a sheet of aligned warp yarns over a cylindrical form as weft yarns are wound around the warp yarns. Typically, there is an adhesive on the warp fibers that bind the two layers together. The resulting tubular cloth is then cut in the warp direction and wound onto a take-up roll. For a variety of reasons, however, the prior art machines have not been able to deliver in producing low cost woven-appearing nonwoven fabrics that also have high density yarn counts.

Several of the prior art apparatus for producing woven-appearing nonwoven fabrics were designed to produce fabrics comprised of reinforcing fibers such as fiberglass and were not intended to produce high density woven fabric replacements. U.S. Pat. No. 2,797,728 of Slayer et. al. and U.S. Pat. No. 4,265,691 of Usui each describe an apparatus for making a fiberglass nonwoven fabric for use as a reinforcement for subsequently produced composite materials. The described apparatus are not configured or designed to permit the rapid production of fabrics with tightly compacted warp and weft layers.

PCT publication WO 80/02850 describes an apparatus for producing nonwoven fabric, however, the manner in which the weft yarns are deposited upon the warp yarns is not amenable to the rapid production of fabrics having a dense weft layer. It can be appreciated that even small lateral movement of a weft yarn as it is deposited onto the warp yarns will cause the weft yarn to overlap an adjacent weft yarn, a configuration that is generally unacceptable in a finished high density nonwoven fabric that is intended to resemble and substitute for a dense traditionally woven fabric.

It is to overcome the shortcoming in prior art apparatus that the apparatus of the present invention has been developed.

BRIEF SUMMARY OF THE INVENTION

The apparatus of the present invention takes a beam or roll of aligned side-by-side warp yarns and presents the side-by-side yarns as a substantially flat sheet to a folding section where the sheet is urged into a cylindrical or tubular form so as to longitudinally follow the cylindrical outer surface of a mandrel. While in the cylindrical configuration, the warp yarns are fed through a weft yarn application section of the apparatus where a plurality of longitudinally spaced spool stations are provided with each station containing a plurality of circumferentially spaced supply spools of weft yarn. The yarn from each spool is fed upstream through a tensioning apparatus so that each yarn can be fed through an associated nozzle onto a laydown ring and subsequently onto the outer surface of the warp yarns. The warp yarns are held in adjacent relationship by an outer layer of a thermoplastic adhesive scrim and the thermoplastic adhesive scrim is heated immediately prior to receiving the weft yarns so the adhesive binds the weft yarns to the warp yarns as the weft yarns are laid substantially perpendicularly across the warp yarns. As the resultant fabric having warp and weft yarns progresses downstream of the apparatus, it passes through a cooling section where the adhesive is set to positively position the weft yarns in overlying relationship on the warp yarns.

Once leaving the weft yarn application station, the now cylindrical and tubular fabric sleeve is fed through a cutting and unfolding section where the sleeve is cut longitudinally and unfolded from its cylindrical configuration into a flat continuous sheet of fabric which is ultimately wound onto a roller at the downstream end of the apparatus.

The supply role of warp yarns can be assembled in a Beam Winding Apparatus of the type described in copending U.S. provisional application Ser. No. 60/385,694 filed Jun. 3, 2002, which is of common ownership with the present application the disclosure of which is hereby incorporated by reference. The adhesive scrim is applied to the warp yarns in any known manner.

After the fabric has been formed in the apparatus of the present invention, it can be passed through a laminator where a thin sheet of backup material can be adhesively bonded thereto for integrity and ease of handling.

Other aspects, features and details of the present invention can be more completely understood by reference to the following detailed description of a preferred embodiment, taken in conjunction with the drawings and from the appended claims.

BRIEF DESCRIPTION OF THE DRAWINGS

FIG. 21 is a cross sectional view of the laydown ring as viewed along line 21—21 of FIG. 19.

FIG. 22 is a similar view as FIG. 21 with the weft and warp yarns removed and the ring in its retracted position.

FIG. 31 is an enlarged partial cross sectional view of a rotating tubular assembly utilizing the first alternative embodiment weft yarn tensioning system.

FIG. 32 is a partial cross sectional side view of another portion of the rotating tubular assembly incorporating the first alternative embodiment weft yarn tensioning system.

FIG. 33 is a cross sectional view of the spring tensioner taken along line 33—33 of FIG. 31.

FIG. 48 is a front elevation of the yarn drive unit of FIG. 46.

FIG. 49 is a left end elevation of the yarn drive unit as shown in FIG. 48.

FIG. 50 is a left end elevation similar to FIG. 49 with a nip roller in a non-engaged position.

FIG. 51 is a section taken along line 51—51 of FIG. 50.

FIG. 52 is a section taken along line 52—52 of FIG. 49.

FIG. 53 is an isometric of one side of the yarn orienting block utilized in the tensioner of FIG. 34.

FIG. 54 is an isometric of the opposite side of the yarn orienting block shown in FIG. 53.

FIG. 55 is an inverted front elevation of the yarn orienting block as viewed in FIG. 54.

FIG. 56 is a top plan view of the yarn orienting block as shown in FIG. 55.

FIG. 57 is a rear elevation of the yarn orienting block as shown in FIG. 53.

DETAILED DESCRIPTION OF THE INVENTION

Definitions

Beam: As used herein, a beam refers to any spool that is typically, but not necessarily, cylindrically-shaped that may have end flanges on which a plurality of aligned yarns have been wound.

Yarn: As used herein, a yarn is a continuous strand of one or more fibers or filaments made from any suitable organic or inorganic, natural or synthetic material. Unless otherwise specifically indicated the term "yarn" is not limited to strands that are spun from a plurality of filaments.

Yarn Sheet: As used herein, a yarn sheet refers to the plurality of planar yarns aligned in the warp direction that form the warp layer in the nonwoven cloth produced by the apparatus described herein.

Spool: As used herein, spool refers to any article adapted to hold a quantity of continuous yarn. Typically, yarn is wound onto a spool.

Environment for Apparatus of the Invention

Figure 1:
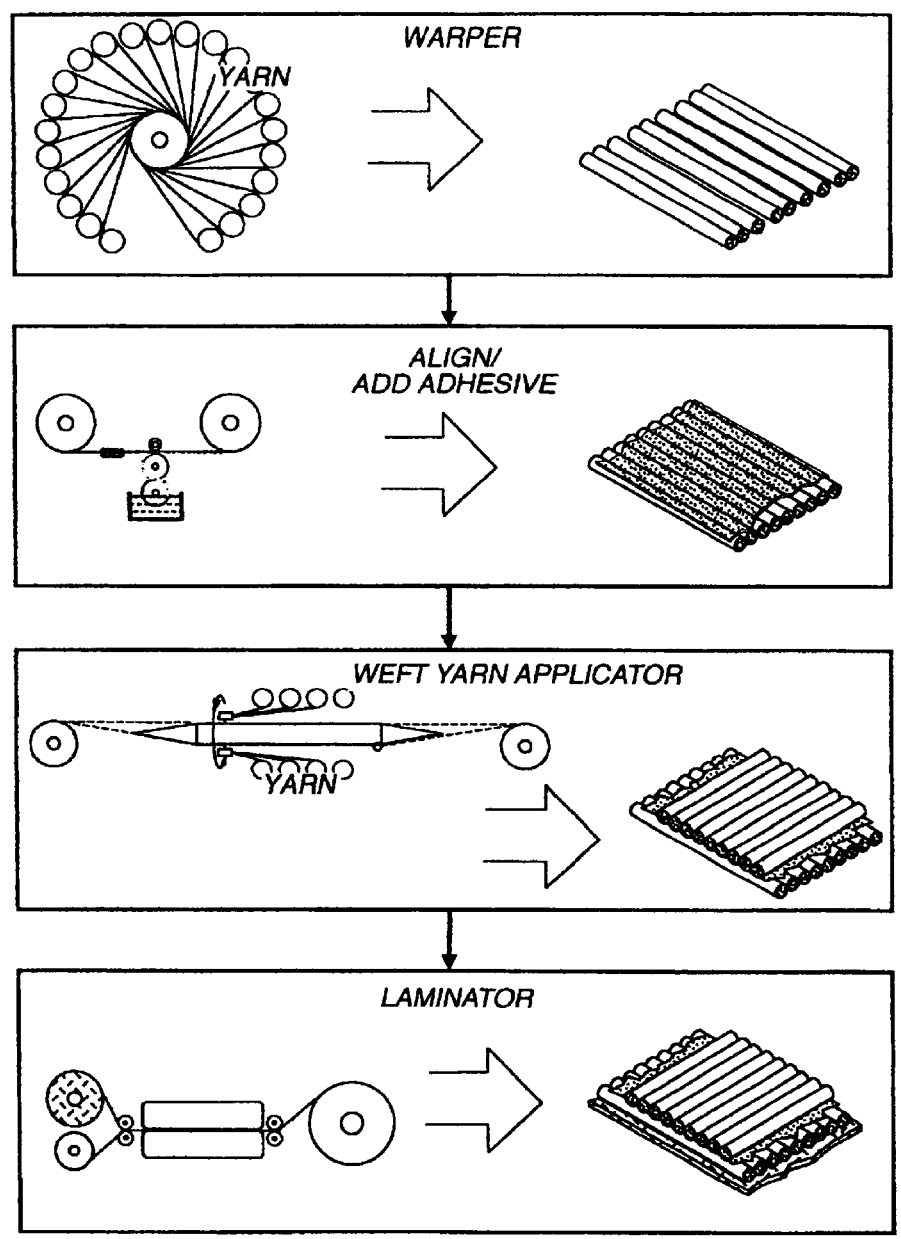
FIG. 1 is flow chart illustrating the various processes pertaining to the fabrication of woven-like nonwoven fabric.

As illustrated in FIG. 1, the apparatus of the present invention is principally concerned with applying weft yarns to a plurality of aligned side-by-side warp yarns in order to produce a non-woven fabric that has the appearance of a woven fabric. The apparatus utilizes a beam of aligned warp yarns that is formed in a warper or beam winding apparatus, and wherein the warp yarns are subsequently coated with an adhesive to hold them in desired aligned relationship. It is the adhesive coated warp yarns that are utilized in the apparatus of the present invention to form the non-woven fabric by wrapping weft yarns therearound in the weft yarn applicator of the present invention. Subsequent to the formation of the non-woven fabric, it can be passed through a laminator where a thin sheet of material can be applied to one surface thereof primarily for handling purposes.

The Apparatus Generally

The apparatus 40 and method of the present invention for applying and securing a layer of weft yarns to an underlying layer of warp yarns is shown generally in FIGS. 2, 3A, 3B, 4A and 4B. It will there be seen that the apparatus includes a supply station 42, a folding station 44, a weft yarn application station 46, a cutting and unfolding station 48, and a take-up station 50.

In the supply station 42, a yarn sheet 52 comprised of aligned warp yarns with a thermoplastic adhesive scrim deposited on its top surface is unwound from a beam 54 at a controlled rate and pulled through the fabrication apparatus. The yarn sheet passes through the folding station 44 where the flat yarn sheet is laid on top of a continuous, flexible Teflon-coated transfer belt 56 and passed between a pair of folding bars 58 that effectively wrap the yarn sheet and transfer belt around a centrally located elongated substantially cylindrical mandrel 60. From the folding station, the wrapped yarn sheet passes through the weft yarn application station 46 where (i) a layer of weft yarn is applied to the outer surface of the yarn sheet by a high speed elongated rotating tubular drum assembly 62 which includes a plurality of yarn spools 64 carrying weft yarn 65, affixed to an outer drum that circumscribes the cylindrically shaped yarn sheet and supporting cylindrical mandrel, (ii) the yarn sheet is heated by hot oil contained within internal fluid chambers and passages in the core of the cylindrical mandrel 60 to soften the thermoplastic adhesive scrim causing it to adhere to the weft yarns to be applied thereto, and (iii) downstream of the core's heated section, the resultant nonwoven fabric is cooled by water that is pumped through other chambers and passages in the mandrel to resolidify the thermoplastic adhesive. From this section, the now tubular fabric passes into the cutting and unfolding station 48 where the fabric is cut longitudinally, i.e. in the warp direction prior to passing through a pair of guide or refolding bars 66 that guide and reform the fabric into a horizontally flat configuration. Finally, the resultant fabric 68 is wound onto a new beam or roller in the take-up station 50.

Each of the stations are described in greater detail below. It is appreciated that variations to the preferred embodiment of the apparatus are contemplated. For example, the supply station 42 could be replaced with portions of a beam winder, such as of the type described in U.S. Patent Application No. 60/385,694 mentioned previously wherein a plurality of spools of yarn are provided to form the warp yarn sheet. In this type of configuration, an additional section would be provided to apply the thermoplastic adhesive to the warp yarns individually or the resulting warp yarn sheet. In other variations, a conventional laminator is provided between the cutting and unfolding station and the take-up station which applies pressure and heat to the nonwoven fabric to further compress and consolidate the fabric, thereby increasing the fabrics strength and other physical properties.

Motors 70, 72 and 74 are used to rotate the tubular drum assembly 62 on which the plurality of weft yarn spools 64 are mounted and these motors are independent of motors utilized to drive the endless belt 56 used to transfer the associated yarn sheet 52 linearly through the weft yarn application station 46. Both sets of motors are controlled, however, by a computerized control system. Accordingly, an operator may vary factors related to the properties and configuration of the resulting fabric 68 such as by varying the rotational rate of the drum assembly versus the linear speed at which the warp yarn sheet is fed through the apparatus. In this instance, the angle of the weft fibers relative to the warp fibers can be varied as well as the density (yarns per unit length) of the weft yarns.

The Supply Station

The supply station 42 is shown in FIGS. 2, 3B, 4B, 5 and 6. It generally comprises (i) a substantially horizontally-disposed beam axle 76 rotatably mounted to a framework 78, and (ii) a brake system 77 for variably limiting the rotational speed of the axle on which the beam 54 of yarn is mounted for unitary rotation.

In operation, the apparatus of the present invention produces fabric at a specified speed (typically from 20–40 ft/min). Accordingly, the aligned warp yarn sheet 52 must be unrolled from the beam 54 at the same rate. When the effective diameter (and circumference) of the yarn on the beam is at its largest, such as when the beam is full, the necessary rotational speed of the beam axle is relatively slow. However, as the effective beam diameter decreases as the warp yarn sheet is unrolled, the rotational speed of the axle will have to increase correspondingly to maintain the set sheet linear payout rate.

If a non-powered beam axle (i.e. no motor attached to it) is utilized in the apparatus, the amount of force necessary to pull the yarn sheet 52 off the beam 54 and overcome any rotational friction inherent in the axle's coupling with the framework of the supply section would change with the effective diameter of the beam. It is appreciated that this force translates into tension of the warp sheet as it is pulled through the apparatus and this tension would vary depending on the effective diameter of the yarn sheet on the beam. It is desirable to produce a fabric wherein the warp yarn sheet on the beam has a constant tension during the fabrication process and ideally the lowest possible tension to assure the yarns are maintained in an aligned and substantially straight configuration. A motor and tensioning rollers to be described later, used to drive the endless transfer belt 56 that carries the warp sheet are driven at a predetermined speed. The brake system 77 is utilized to limit rotation of the beam while the warp sheet is transferred through the apparatus on the transfer belt so that a constant low level tension is maintained in the warp sheet.

Folding Station

Figure 4A:
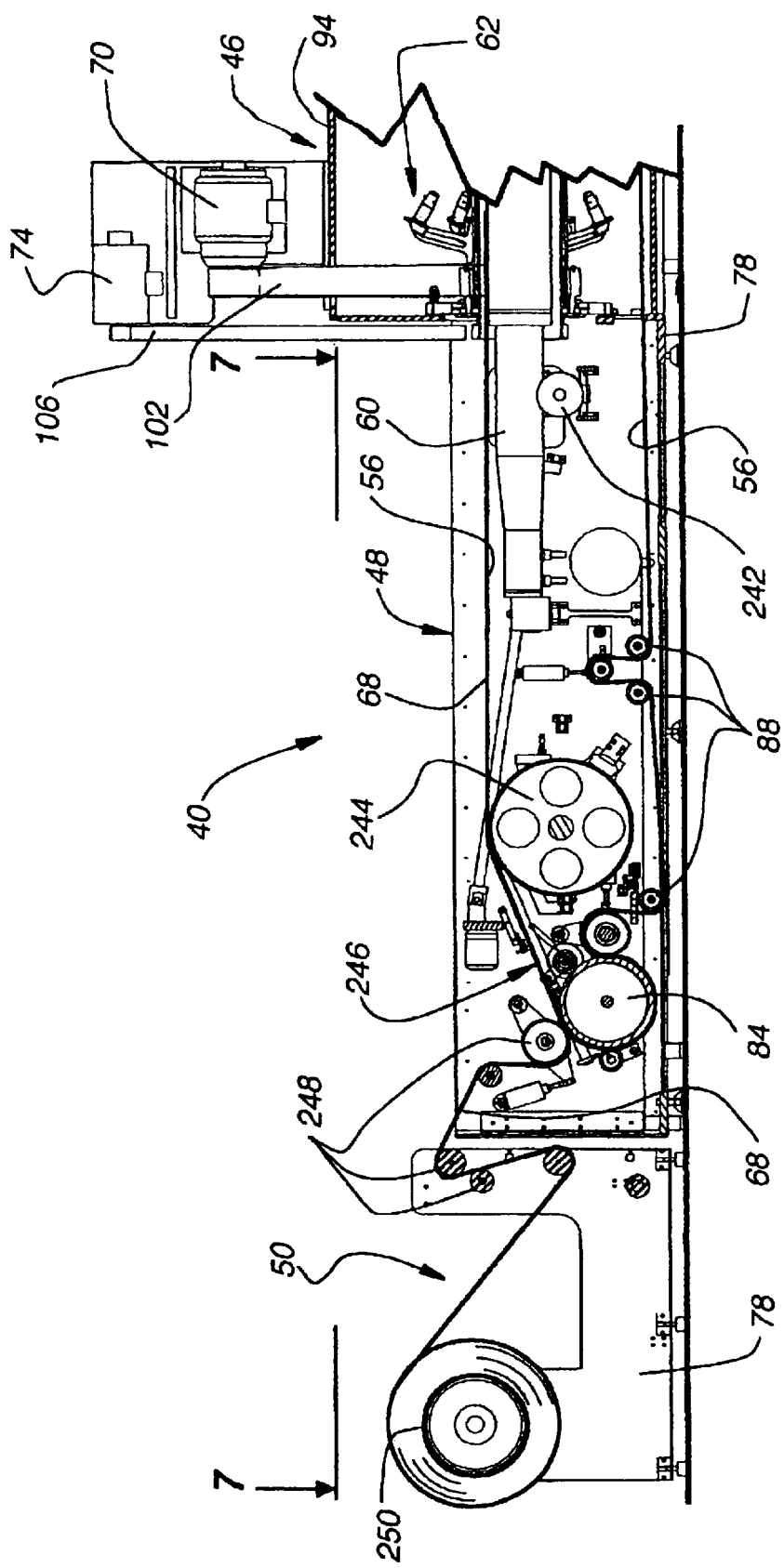
FIGS. 4A and 4B is a cross sectional view taken along line 4—4 of FIG. 2 illustrating the path of the yarn sheet and the transfer belt.
Figure 4B:
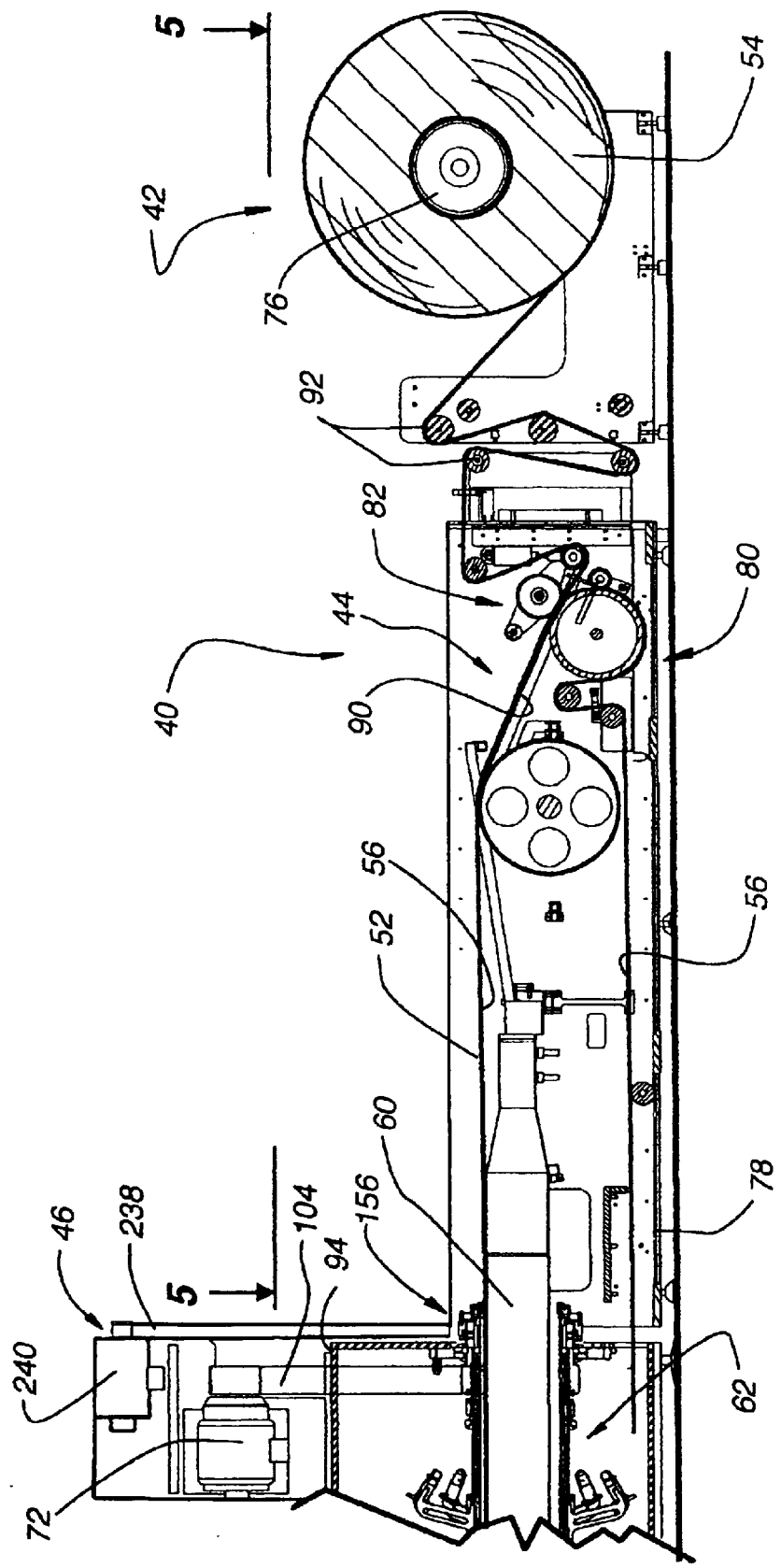
Figure 5:
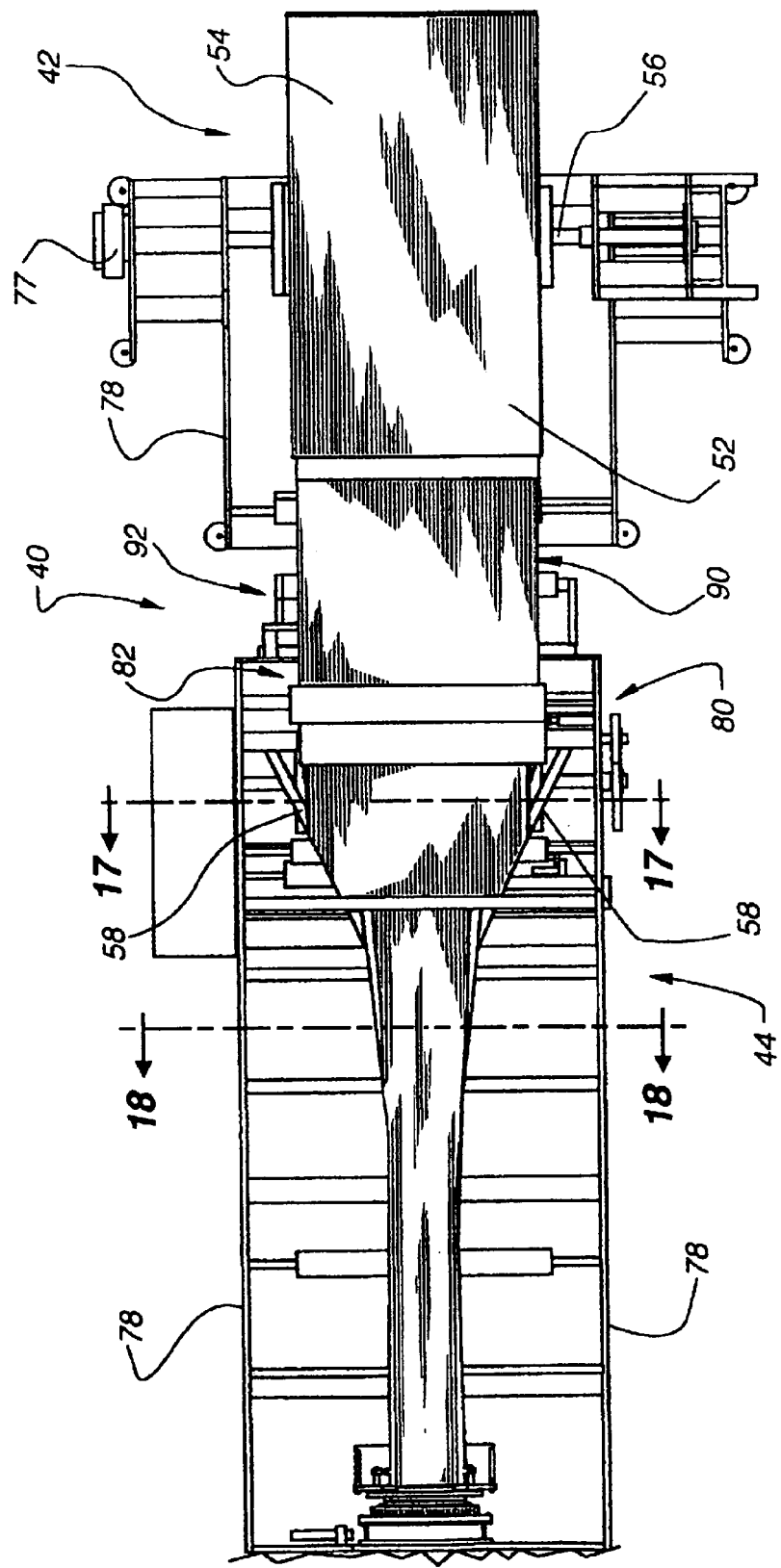
FIG. 5 is a top view of the supply and folding sections with the warp yarn sheet disposed thereon as taken along line 5—5 of FIG. 4B.
Figure 6:
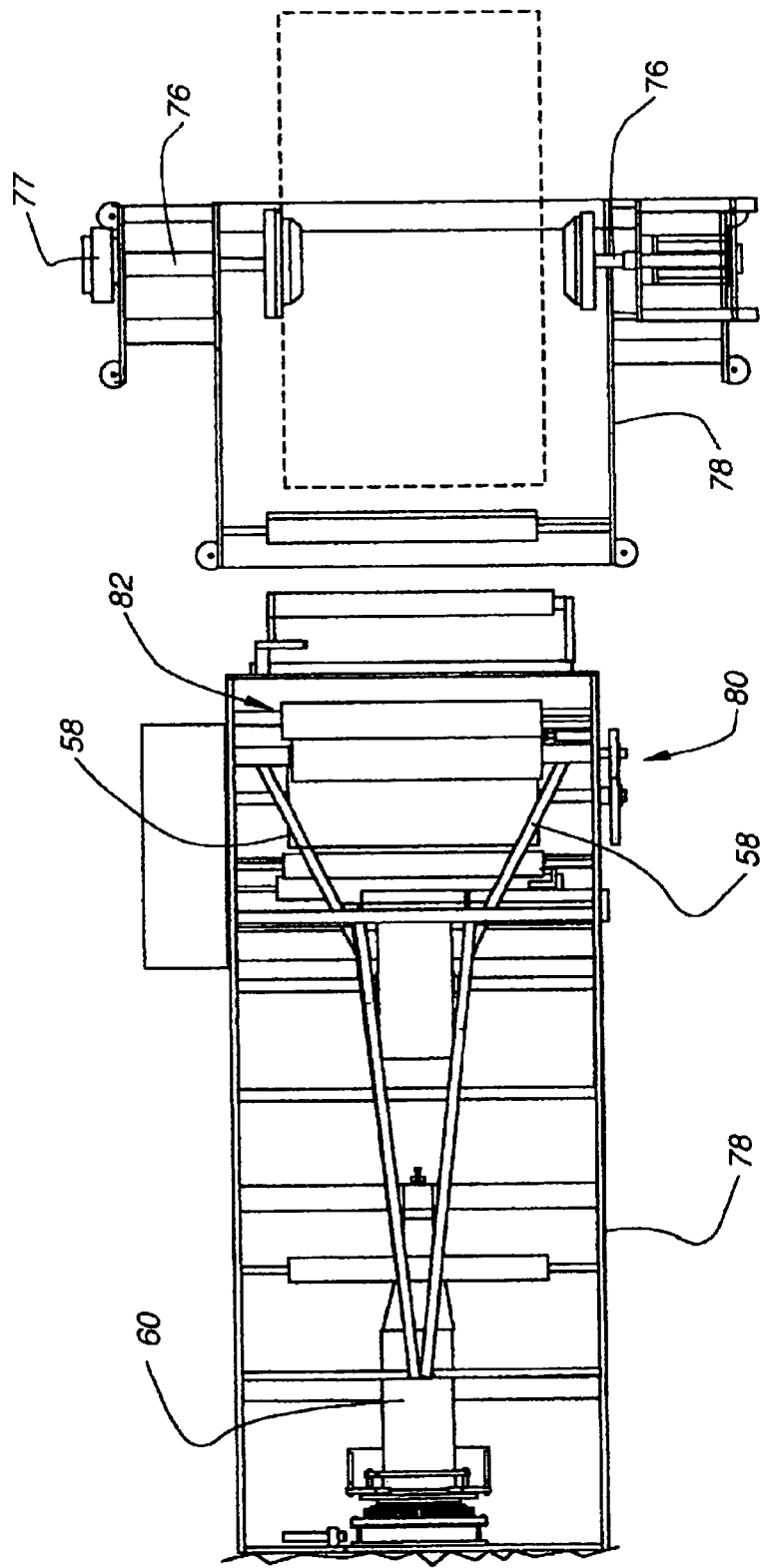
FIG. 6 is a top view of the supply and folding sections of the fabrication apparatus with the transfer belt removed taken along line 5—5 of FIG. 4B.
Figure 7:
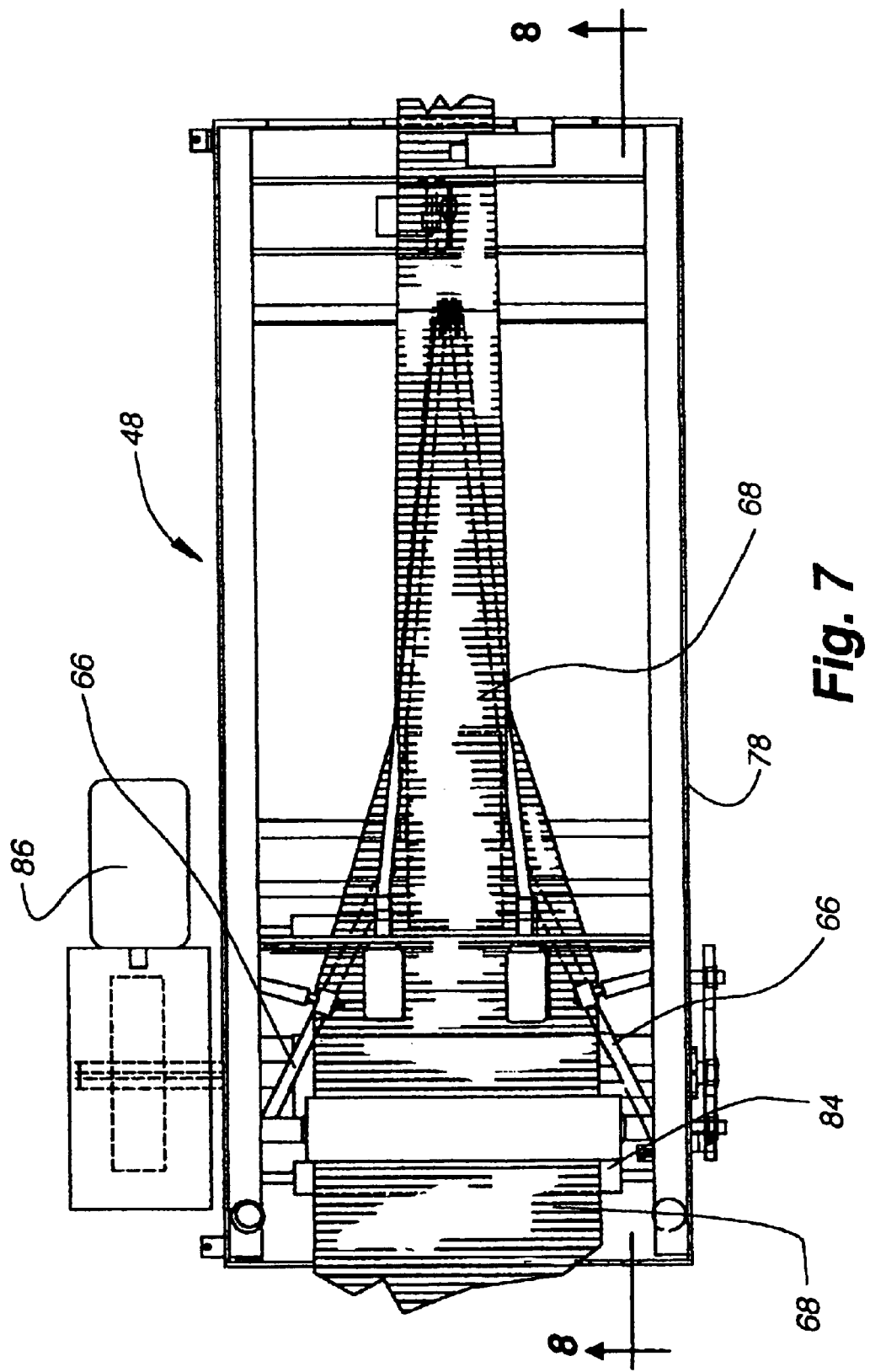
FIG. 7 is a top view of the cutting and folding section and the take-up section of the fabrication apparatus.
Figure 8:
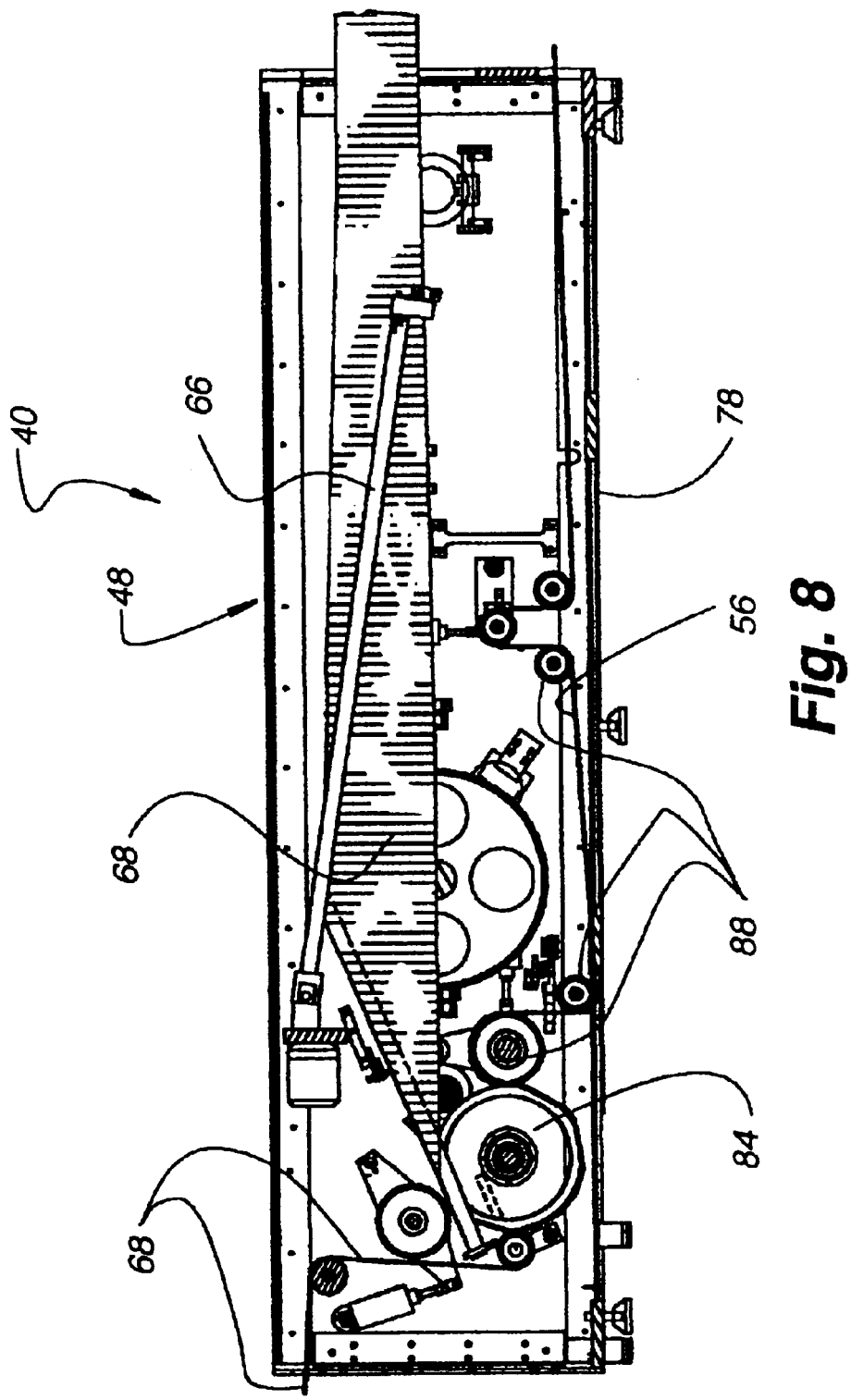
FIG. 8 is a cross section taken along line 8—8 of FIG. 7.

The folding station 44 is best illustrated in FIGS. 4B, 5, and 6, and includes: (i) the framework 78; (ii) the front or upstream end of a transfer belt drive assembly 80; (iii) the front or upstream portion of the cylindrical mandrel 60; (iv) the folding bars 58 and (iv) various rollers and associated hydraulic actuators 82 for guiding the warp yarn sheet to and along the transfer belt with the proper lateral alignment.

The transfer belt drive assembly 80, as is probably best seen in FIGS. 4A and 4B, extends substantially the entire length of the apparatus with the assembly including the flexible Teflon-coated transfer belt 56 which extends around a drive roller 84 at the downstream end of the apparatus with the drive roller being driven in a counterclockwise direction by a motor (not seen) in a housing 86. The transfer belt passes around and through tensioning and dancing rollers 88 to control its passage through the apparatus with the transfer belt having an upper run moving in a downstream direction from the supply roll end of the apparatus to the take-up roll end of the apparatus. The transfer belt has a return run extending along a lower portion of the apparatus which, of course, moves in an upstream direction. At the upstream end of the transfer belt, it has an incline run 90 where the belt moves in a downstream direction and upon which the warp sheet 52 is laid after it has passed through a succession of tensioning and dancing rollers 92 so that a minimum of tension is present in the warp sheet as it is laid on the transfer belt and moved by the transfer belt through the apparatus. As the transfer belt with the warp sheet laid on top thereof approaches the downstream end of the incline run 90, it engages the folding bars 58 which, as possibly best seen in FIGS. 6 and 4B, are convergent in a downstream direction and sloped slightly downwardly in the downstream direction. As the transfer belt and warp sheet pass between the folding bars, they are urged into a cylindrical configuration as seen in FIG. 4B. The belt becomes supported on the upstream end of the mandrel 60 which is also of cylindrical configuration and the belt with the warp sheet thereon wraps substantially entirely around the mandrel with a small gap (not seen) along the bottom of the mandrel.

Once the warp yarn sheet and its Teflon coated fabric carrier belt have been wrapped around the front or upstream end of the cylindrical mandrel and therefore are substantially cylindrically configured, they are advanced into the weft yarn application station 46.

Weft Yarn Application Station

The weft yarn application station 46 is best shown in FIGS. 9–30 and comprises: (i) the framework 78 that includes a protective enclosure 94; (ii) the cylindrical mandrel 60 (as partially described above); (iii) a laydown ring 96 on which the weft yarns are initially wound for deposition onto the warp yarn sheet 52; and (iv) the rotating tubular drum assembly 62 for winding weft yarns onto the laydown ring.

Figure 2:
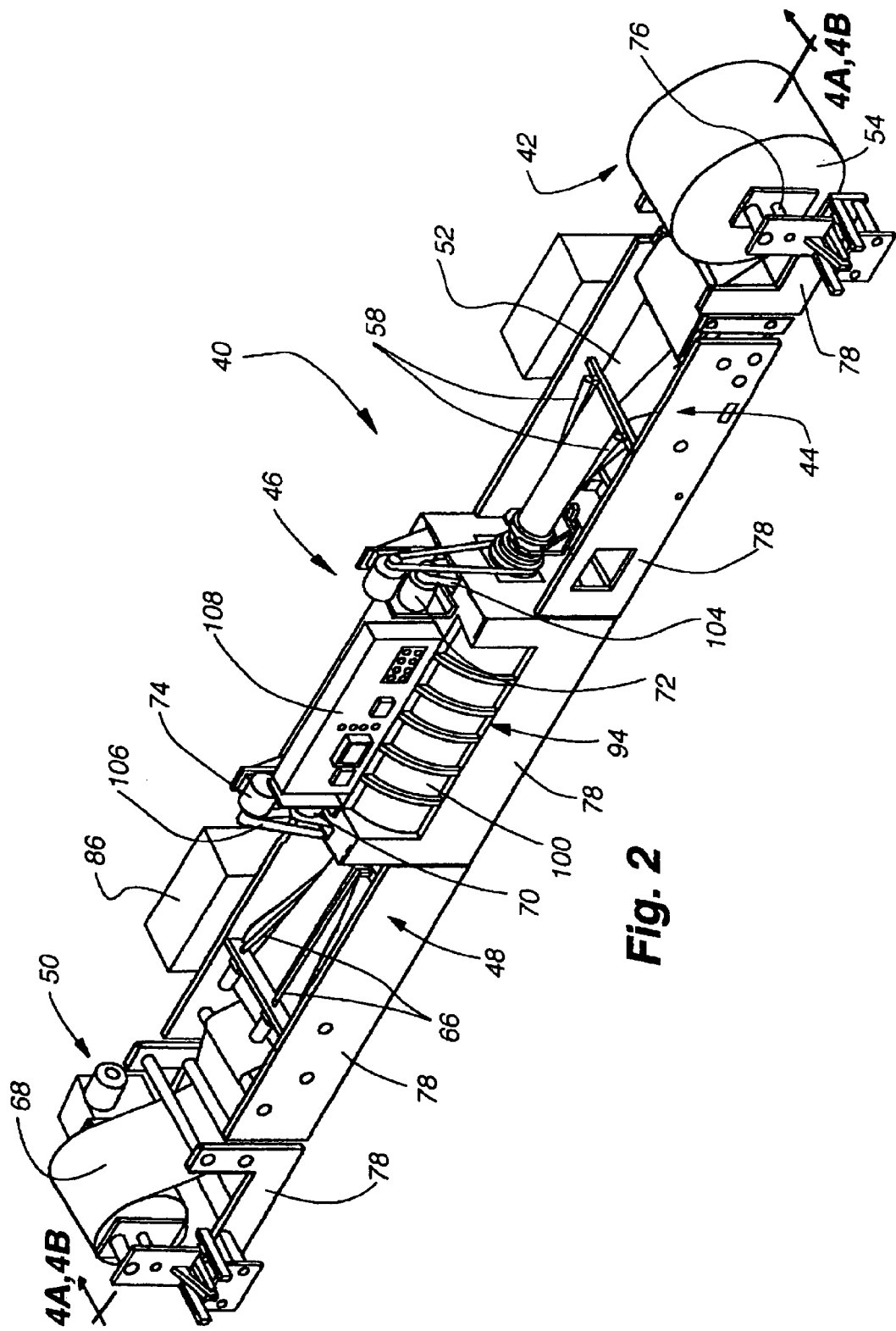
FIG. 2 is an isometric view of the textile fabrication apparatus according to one embodiment of the present invention.
Figure 3A:
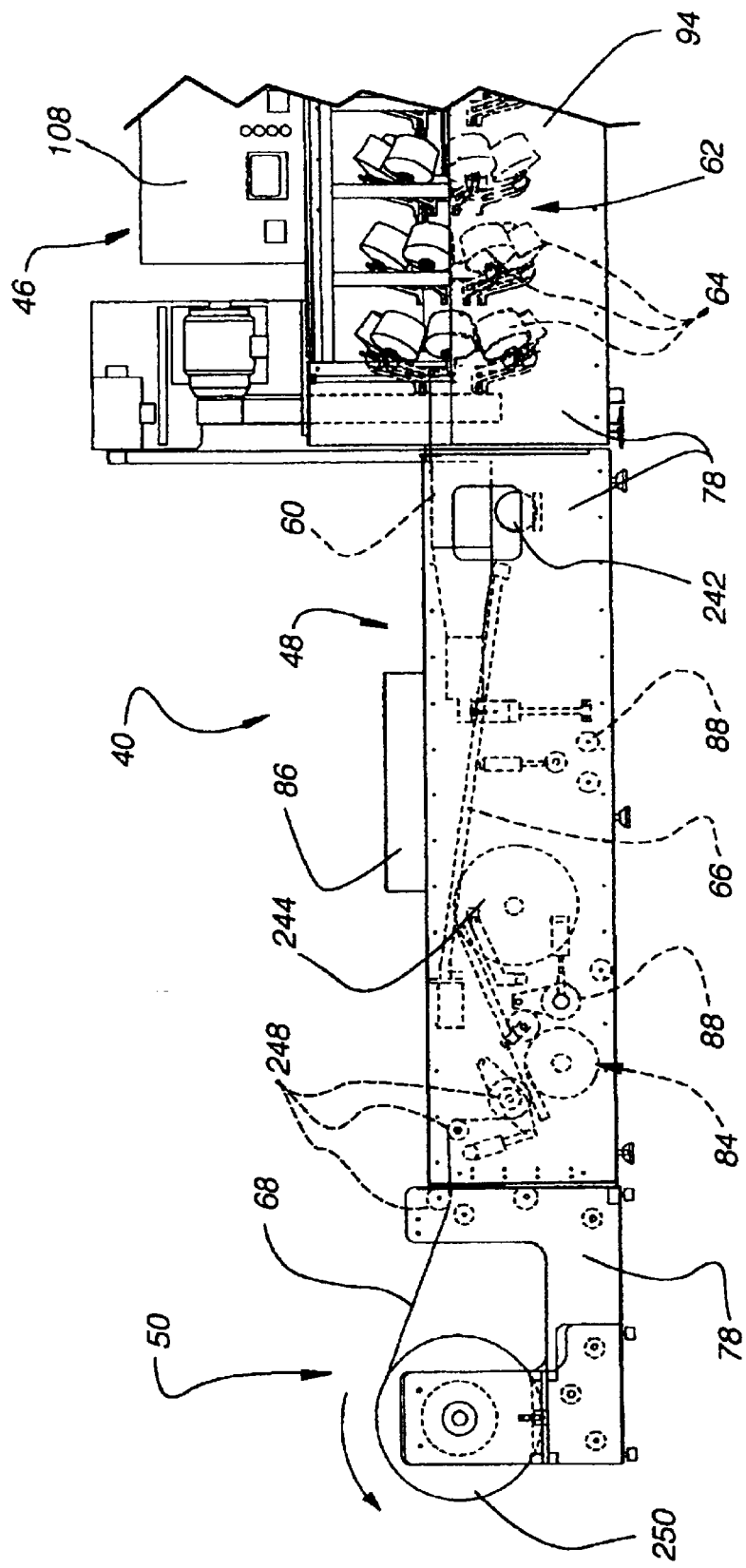
FIGS. 3A and 3B are side views of the fabrication apparatus according to one embodiment of the present invention.
Figure 3B:
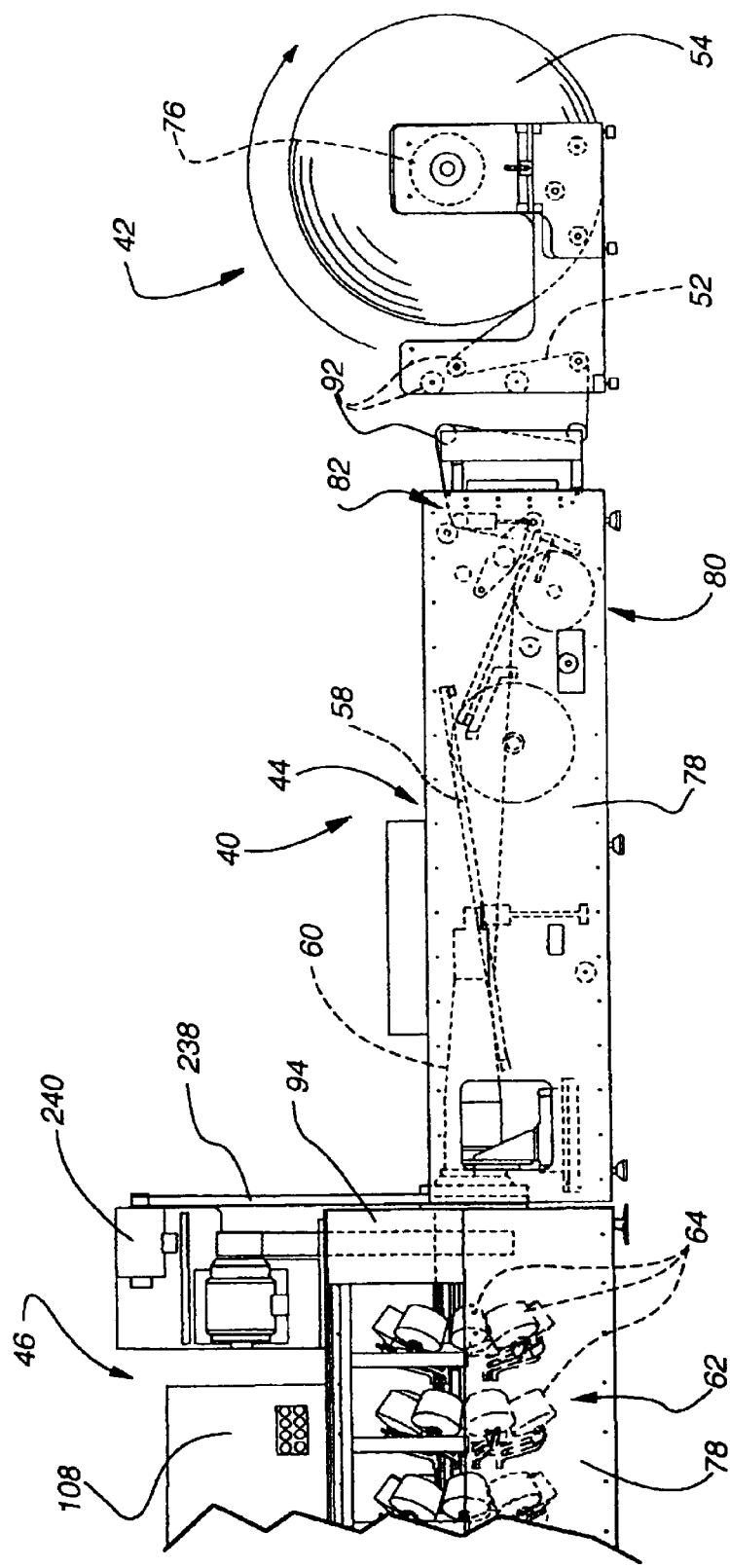

Referring first to FIG. 2, an isometric overview of the apparatus of the present invention is illustrated. The portion of the framework 78 pertaining to the weft yarn application station 46 includes the enclosure 94 adapted to protect operators of the apparatus in case of a failure of the rotating tubular assembly or one of the items attached thereto. It can be appreciated that if a part of the tubular assembly breaks free during high speed rotation, the part would be propelled radially outwardly and could potentially injure an operator if not contained. The protective enclosure is preferably fabricated from reinforced steel and/or aluminum and includes a retractable door 100 that permits the operators access to the spools 64 of weft yarn during setup. The retractable door could include, if desired, a plurality of shatterproof windows (not shown) through which an operator can view the operation of the rotating tubular drum assembly 62. The windows would typically be fabricated from an impact resistant plastic, such as polycarbonate, or a safety glass. Additionally, in the preferred embodiment the drive motors 70, 72 and 74 are mounted high on the framework with associated drive belts 102, 104 and 106, respectively, extending downwardly to couple with the rotating tubular assembly. A user interface 108 including informational readouts and input devices for communicating with the programmable control system are also positioned on the framework 78.

Figure 14:
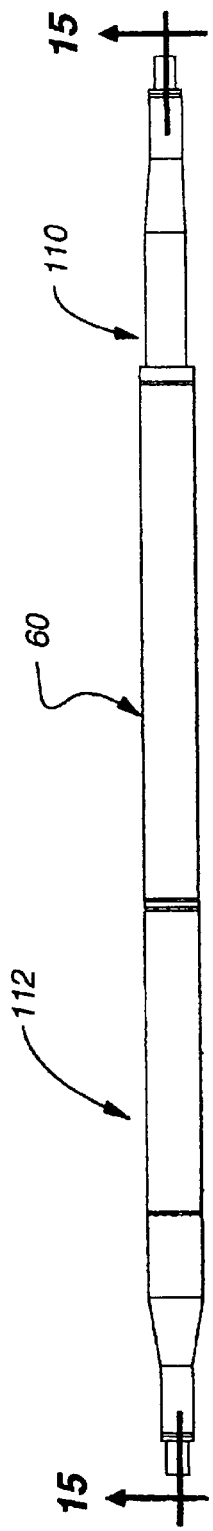
FIG. 14 is a side view of the cylindrical mandrel.
Figure 15:
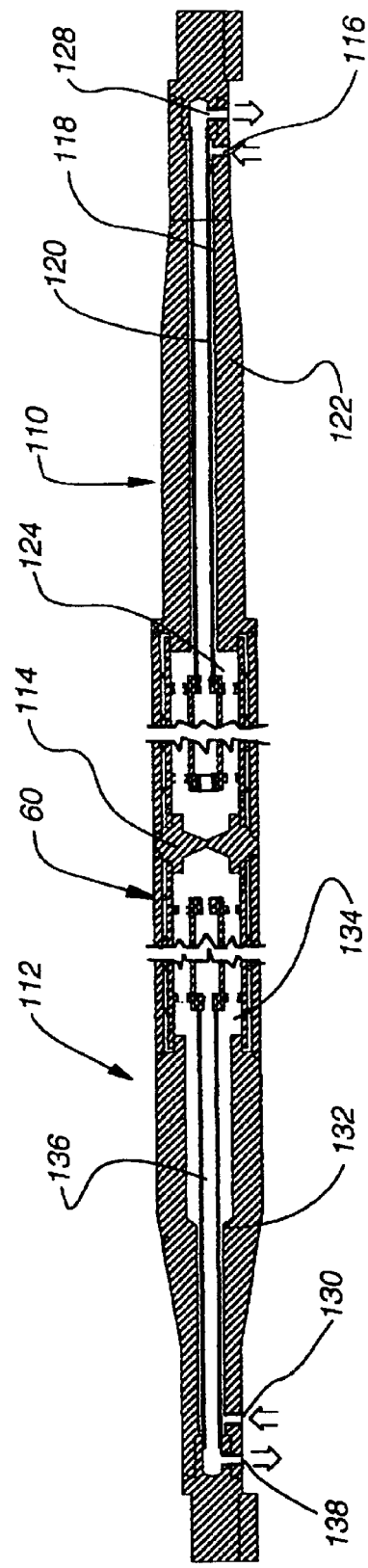
FIG. 15 is a cross sectional view of the interior of the cylindrical mandrel taken along line 15—15 of FIG. 14.

Referring specifically to FIGS. 14 and 15, the cylindrical mandrel 60 includes (i) a heated section 110 and (ii) a cooled section 112. Both sections are generally similar, comprising a network of fluid chambers and passages that terminate in inlet ports and outlet ports. The fluid chambers and passages in the heated section 110 are separated from those in the cooled section by a barrier wall 114 at the longitudinal center of the mandrel. In the heated section of the mandrel, hot oil is pumped into an inlet port 116 located near the front end of the mandrel, from which it flows down an inlet sleeve 118 that generally extends to the center of the mandrel adjacent to an outer metallic cylindrical wall 122 of the mandrel where it then flows around a chamber 124 to an outlet passage 120 interiorly of the inlet sleeve 118. The heat from the hot oil is transferred through the wall 122 of the mandrel and the transfer carrier belt 56 to the warp yarn sheet 52 to soften and melt the thermoplastic adhesive scrim contained on the warp yarn sheet. From the outlet passage, the oil is passed out of the mandrel through an outlet port 128. Although not specifically illustrated, a hot oil reservoir and associated heater are utilized to heat the hot oil to a suitable temperature. A fluid pump (not shown) is provided to pump the oil from the reservoir and through the mandrel. In a preferred embodiment, to melt a copolyester adhesive having a melting point of around 280 degrees F., the surface of the mandrel is maintained at around 325 degrees.

The cooled section 112 of the mandrel comprises fluid chambers and passages generally similar to those utilized in the heated section. Chilled water is passed into an inlet port 130 located near the back or downstream end of the mandrel, down an inlet sleeve 132 and through a chamber 134 before entering an outlet passage 136 from which it flows out of the mandrel through an outlet port 138. The water cools the outer wall of the mandrel above it along with the associated nonwoven fabric and carrier belt 56 to a temperature below the melting point of the thermoplastic adhesive thereby causing the adhesive to solidify and secure the newly applied weft yarns to the warp sheet. Although not shown, a pump is provided to pump the chilled water through the mandrel's cooling section. Additionally, a chilling station is utilized to transfer heat from the water before recirculating it back into the mandrel. The water may contain additives to prevent it from boiling and to minimize the corrosion of the metallic surfaces of the passages and chambers of the cooling section. In an alternative embodiment, water could be pumped directly from a tap into the mandrel and directed down a drain upon exiting the cooling section through the outlet port.

As the warp yarn sheet 52 is being heated by the heated section 110 of the cylindrical mandrel 60, the yarn sheet is transferred on the transfer belt 56 into a cylindrical space beneath the weft yarn laydown ring 96 that encircles the mandrel, the carrier belt and the warp yarn sheet. The laydown ring is best illustrated in FIGS. 21 and 22 and includes an inside cylindrical surface 140 spaced above the warp sheet 52 by about 0.005–0.015". It is to be appreciated that it is desirable to have the inside surface as close as possible to the outer surface of the warp yarn sheet without contacting the warp yarn. Practically, however, a small gap must be maintained to account for any localized variations in the thickness of the warp yarn sheet and the Teflon-coated transfer belt. The laydown ring also includes a frustoconical or sloped surface 142 on which the weft yarns 65 are deposited by weft yarn nozzles 144 of the rotating tubular assembly 62 (described in detail below) before sliding therefrom in a downstream direction onto the surface of the warp yarn sheet. The frustoconical surface tapers rearwardly or in a downstream direction and radially inwardly, terminating at an intersection with the inside cylindrical surface 140 of the laydown ring.

The laydown ring's radial spacing is fixed relative to the mandrel 60. However, the ring is mounted to a linearly slidable frame 146 having a hydraulic actuator 148 that is mounted to the framework 78 of the apparatus to selectively move the frame and ring longitudinally in an upstream/downstream direction relative to the mandrel. Accordingly, when setting up the apparatus, such as threading the weft yarn through the weft yarn nozzles 144 as will be explained in more detail later, the laydown ring 96 can be moved upstream away from the weft yarn nozzles to a retracted position, permitting easier operator access. In the normal operational downstream position, the frustoconical surface 142 of the ring is positioned directly beneath the nozzle outlets with only a small amount of spacing between them.

Operationally, weft yarns 65 from each nozzle 144 being utilized are laid down and wrapped at least partially around the frustoconical surface 142 at the same longitudinal location, pushing the previously laid weft yarn down the frustoconical surface in a downstream direction. Eventually, the loops of weft yarn are pushed by subsequent loops off the edge of the frustoconical surface and down onto the surface of the downstream moving underlying warp sheet. The density of the weft yarns is directly related to the linear speed at which the yarn sheet is moving longitudinally downstream compared with the speed the weft yarns are being wound onto and pushed off the edge of the laydown ring. For instance, to maximize the weft density of the fabricated fabric, the speed of the belt must be equal to the speed that loops of weft yarn are wrapped around the ring times the diameter of the weft yarn. Any slower speed will result in an overlap of weft yarns. Faster carrier belt speeds resulting in a greater linear speed of the warp sheet will result in fabrics wherein the weft yarns are spaced from each other creating fabrics with lower weft densities.

The laydown ring 96 offers several advantages over laying the yarns directly onto the warp sheet itself from the yarn nozzles 144. First, because the yarns are laid onto the sloped surface 142 of the ring with the ability to move down the slope, they can be placed closer together without the risk of overlap of two or more loops of yarn. For example, if a yarn from a subsequently located nozzle is laid on a previously laid yarn from an adjacent nozzle in a partially overlapping relationship due to small but undesirable movements in the yarn during the high speed winding operation, the previously laid yarn is pushed down the slope, making room for the subsequently-laid yarn to be positioned flush against the sloped frustoconical surface of the ring. In contrast, if a weft yarn were to be laid directly onto the surface of the warp sheet from a nozzle, it would be substantially fixed in place by the softened thermoplastic adhesive and possibly out of position. Accordingly, if the next loop of weft yarn were to partially overlap a previously laid loop, the previously laid loop would not slide forwardly to permit the subsequent loop to lie flat against the sheet. Further, if there is sufficient thermoplastic adhesive on the warp sheet, the overlapped subsequent loop of yarn may become fixed to the previously laid loop creating a defect in the resulting fabric. It is appreciated that the subsequently laid loop on the laydown ring will not move rearwardly, because of the loop being deposited on the yarn sheet behind it. Ultimately, the ring provides more precisely aligned and dependable weft layers for a given degree of variability within the fabric fabrication apparatus when compared to a similar apparatus wherein the yarns are laid directly onto the warp yarn sheet.

The use of the sloped surface 142 on the laydown ring also helps minimize the amount of tension in the weft yarns 65 as they are deposited on the warp yarn sheet 52. Low tension in the fabric in both the warp and weft directions is important to help ensure the dimensional integrity of the resulting fabric. For instance, if the weft yarns are laid down on the warp yarns under high tension, the weft yarns would contract as the tension is released when, for example, the weft yarns are cut to create a flat fabric sheet in the cutting and unfolding section. This contraction could cause localized nonlinear deviations of the warp yarns that are visually unappealing. A certain amount of tension is necessary in the process of wrapping the weft yarns around the warp sheet, although as described below, the tension is maintained at the lowest possible levels because of the design of the rotating tubular assembly as will become more apparent hereafter. However, since the weft yarn loops are laid on the laydown ring at a first diameter of the frustoconical sloped surface and slide onto the warp sheet which has a smaller diameter, much of the tension in the loop is relieved as the loop slides down the sloped surface and onto the warp sheet. Although the loops of weft yarn are still under some tension when they are pushed off the ring onto the warp yarn sheet, the amount of tension is reduced somewhat by friction between the frustoconical surface and the yarn such that the yarn loop relaxes somewhat as it moves from a larger diameter portion of the sloped surface to a lower diameter portion and ultimately onto the warp yarn sheet. It is to be appreciated, however, that the weft yarn is laid down onto the warp sheet under enough pressure to ensure that the yarns are circumferentially straight.

Figure 26:
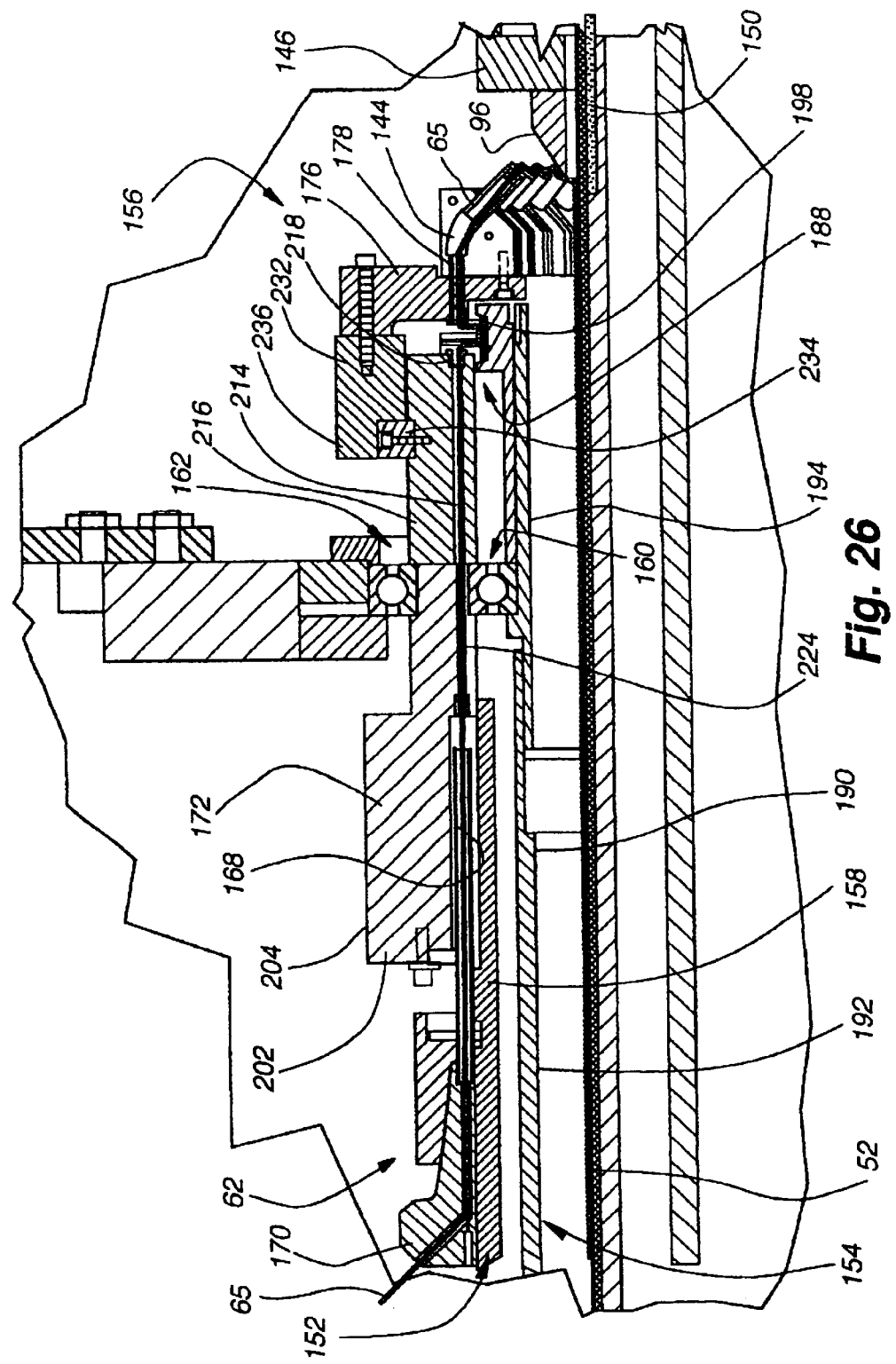
FIG. 26 is a cross sectional view taken along line 26—26 of FIG. 23.
Figure 27:
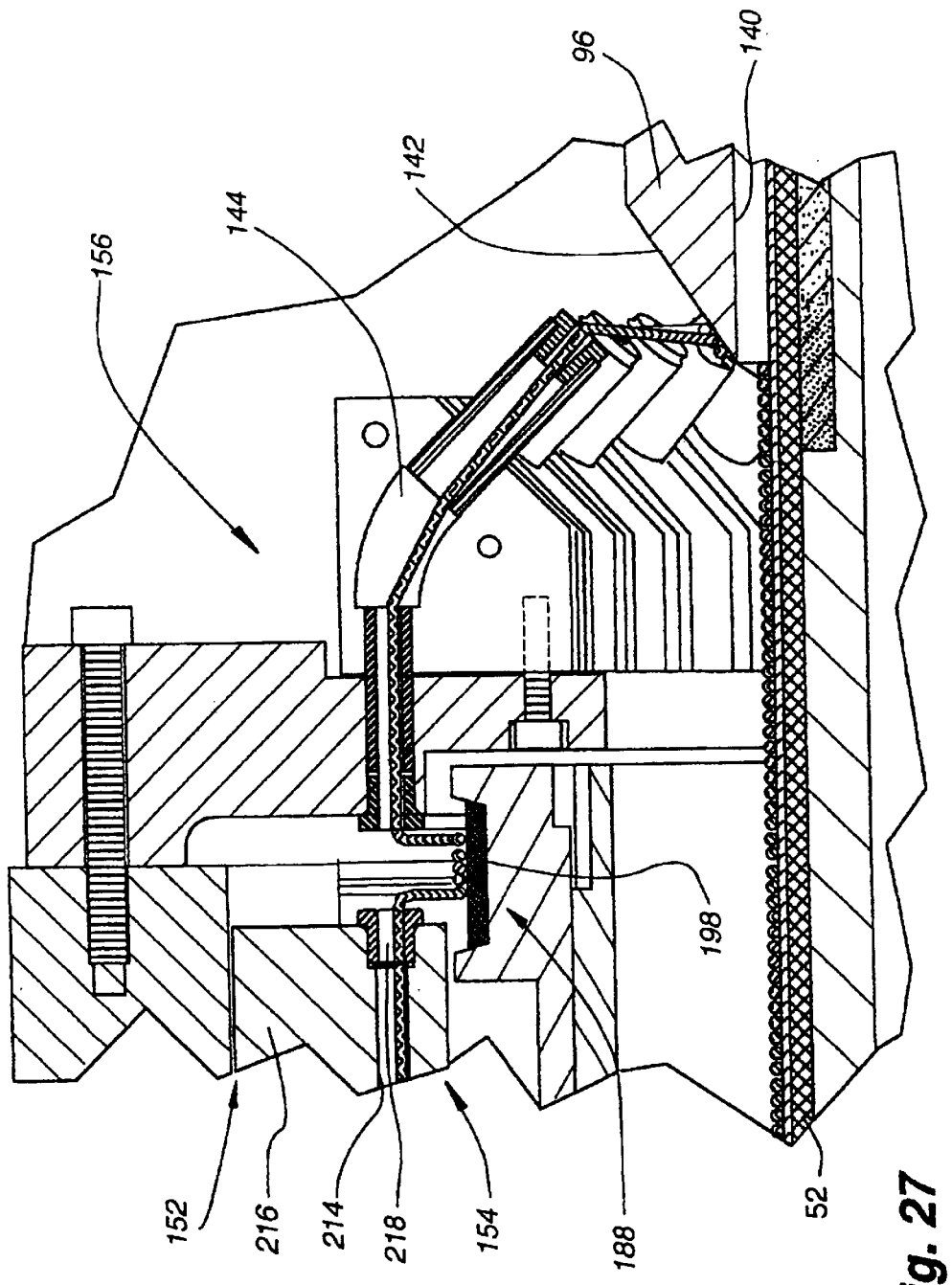
FIG. 27 is an enlarged cross sectional view taken along line 26—26 of FIG. 23.
Figure 28:
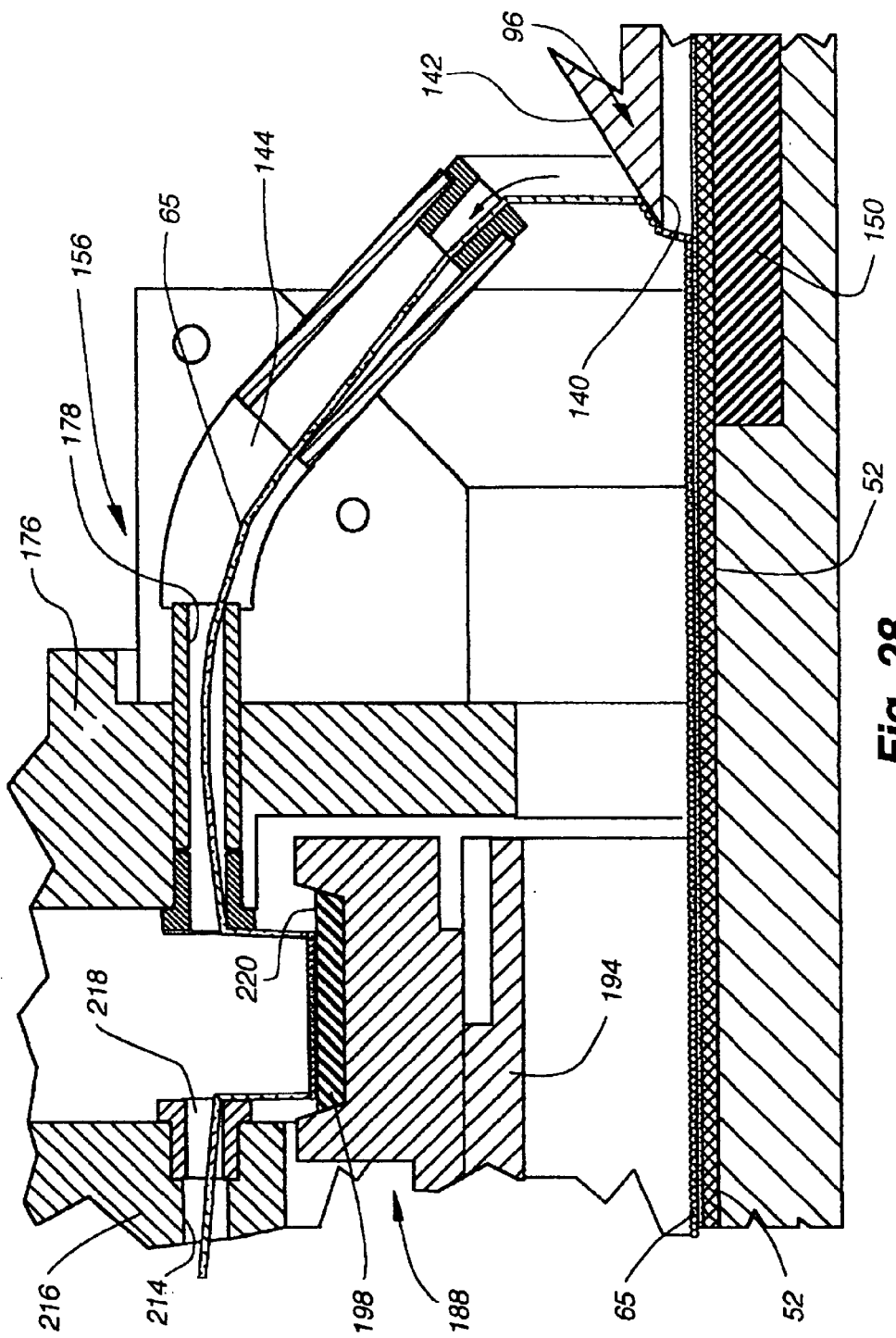
FIG. 28 is an enlarged cross sectional view taken along line 26—26 of FIG. 23.

As best shown in FIGS. 26 and 28, a resilient ring 150 made of an elastomeric material is placed within a recess in the mandrel 60 directly below the laydown ring 96 (when the laydown ring is in its downstream operational position). The resilient ring 150 extends longitudinally a little in front of the front side of the laydown ring and a little beyond the rear edge of the laydown ring. The surface of the resilient ring is substantially flush with the surface of the steel mandrel. In a preferred embodiment, the resilient material comprises a silicone rubber although any elastomeric material or sponge that can tolerate the elevated temperatures of the mandrel can be utilized. As described above, the typical spacing between the top surface of the warp sheet and the bottom surface of the laydown ring is 0.005" to 0.015". A defect in the warp sheet, such as a knot or fold, or a defect in the Teflon-coated transfer belt 56, such as fold or crease, could cause the spacing to disappear in the location of the defect. When such a defect is present, the resilient material of the ring 150 compresses inwardly so that the defect can pass therethrough without hindering the continued operation of the fabrication apparatus.

The rotating tubular assembly 62 is provided to simultaneously and rapidly wind a large number of spools of weft yarn 65 under controlled levels of tension onto the laydown ring 96 for eventual deposition onto the surface of the warp sheet 52 to form the nonwoven fabric. The rotating tubular assembly is illustrated in FIGS. 9–16, 19, and 21–29. The rotating tubular assembly comprises: (i) a rotating outer tube subassembly 152; (ii) a rotating inner tube subassembly 154; (iii) a nozzle head subassembly 156; and (iv) four motor and drive belt combinations for rotating and controlling the speed of the subassemblies.

A preferred embodiment of the rotating tubular assembly 62 is capable of rotating at up to 600 RPM and laying down weft yarn 65 from up to forty-eight separate circumferentially and axially spaced spools 64 simultaneously. Depending on the yarn configuration utilized, the fast rotational speed combined with the large number of spools permits high quality non-woven fabric to be produced at a rate of 2040 feet a minute. This compares very favorably to weaving looms for woven fabrics which are typically limited to production speed of no greater than 10 feet per minute.

Referring primarily to FIGS. 2, 9, 10, 12, 13, 16, 21, and 22, the outer tube subassembly 152 includes: (i) an elongated tube 158 rotatably mounted on the framework 78 via pairs of inner 160 and outer 162 bearings positioned near each end of the tube; (ii) six longitudinally or axially spaced weft yarn stations 164 with each station having eight spider arms 166 circumferentially spaced around the outer tube 158 with distal ends adapted for holding spools 64 of weft yarn 65; (iii) longitudinally-aligned conduits 168 and associated inlet blocks 170 for feeding the weft yarns from the yarn stations towards the front or upstream end of the outer tube assembly; (iv) upstream 172 and downstream 174 belt drive rings for interfacing with drive belts; and (v) a nozzle head subassembly mounting ring 176 with a plurality of passages 178 therein through which the weft yarns can pass. A total of forty-eight spools 64 of weft yarn 65 are attached to the exterior of the outer tube 158 of the outer tube subassembly 152 at the six longitudinally spaced weft yarn stations 164 over an approximately 12-foot length. Each station includes eight spider arms 166 that are equally circumferentially spaced around the exterior surface of the outer tube. The distal end of each of spider arm has a spindle 168 adapted to receive a spool 64 of yarn. Each spindle extends forwardly or upstream and is slanted radially inwardly such that the face of an attached spool is angled toward the exterior of the outer tube 158. The spindles each have outwardly biased lock fingers 170 that releasably secure a yarn spool to it and prevent the spool from sliding off the spindle, especially when the rotating tubular assembly is stationary. As the assembly spins, potentially significant centrifugal loads are generated. The magnitude of centrifugal loads on a rotating body increase for a given amount of rotating mass as that mass gets farther from the axis of rotation. Ideally, the spools of yarn are located as close to the axis of rotation as possible, however this consideration is offset by (1) the desire to fit a large number of spools to the rotating tubular assembly and (2) the desire to use larger spools of yarn (with greater diameters) so that the apparatus can operate for longer periods between spool replacement. In the illustrated preferred embodiment, the spider arms elevate the spools above the surface of the outer tube a short distance but which is great enough to accommodate relatively large spools.

The spindles 168 on each spider arm 166 at each of the six stations are located the same distance from the outer tube's axis of rotation. Accordingly, approximately the same centrifugal force is acting on each yarn of each spool at a given station as it is pulled off the spool and fed to a respective weft yarn nozzle at the front or upstream end of the rotating tubular assembly. In contrast, if several layers of spools were stacked on top of each other, a greater centrifical force would act upon the outermost spools, thereby necessitating a greater force to pull the associated yarn off the spool and feed it toward its nozzle 144 than another spool located closer to the axis of rotation. Accordingly, the tension in the yarns 65 pulled from outer spools 64 would be greater than that from inner spools. It is to be appreciated that it is desirable that all yarns deposited on the warp sheet 52 have substantially the same tension, otherwise visual defects in the fabric could result when the weft yarns of the fabric are cut to form a flat sheet.

Figure 12:
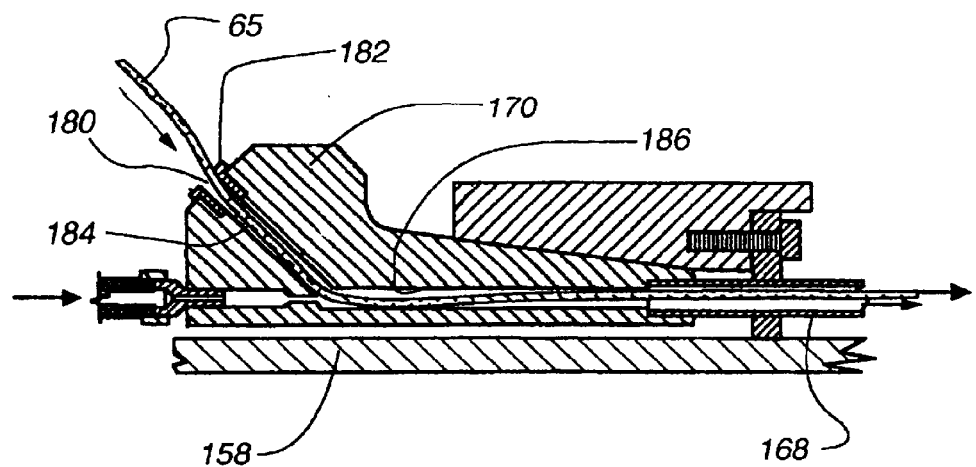
FIG. 12 is a cross sectional view a portion of the tubular assembly taken along line 13—13 of FIG. 11.
Figure 13:
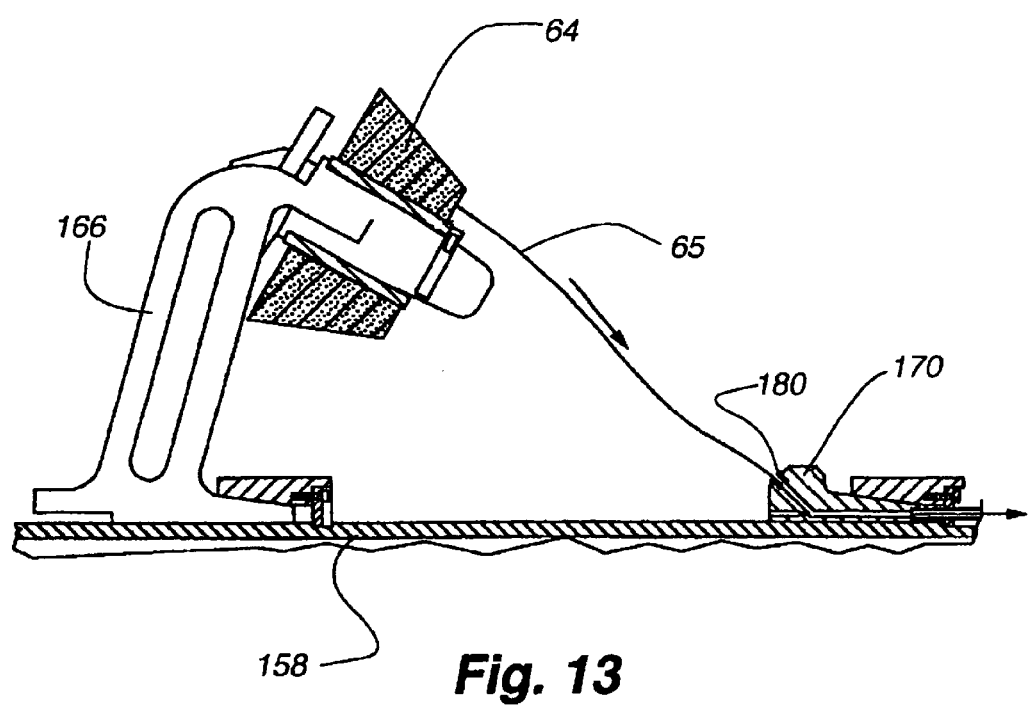
FIG. 13 is a cross sectional view a portion of the tubular assembly taken along line 13—13 of FIG. 11.
Figure 16:
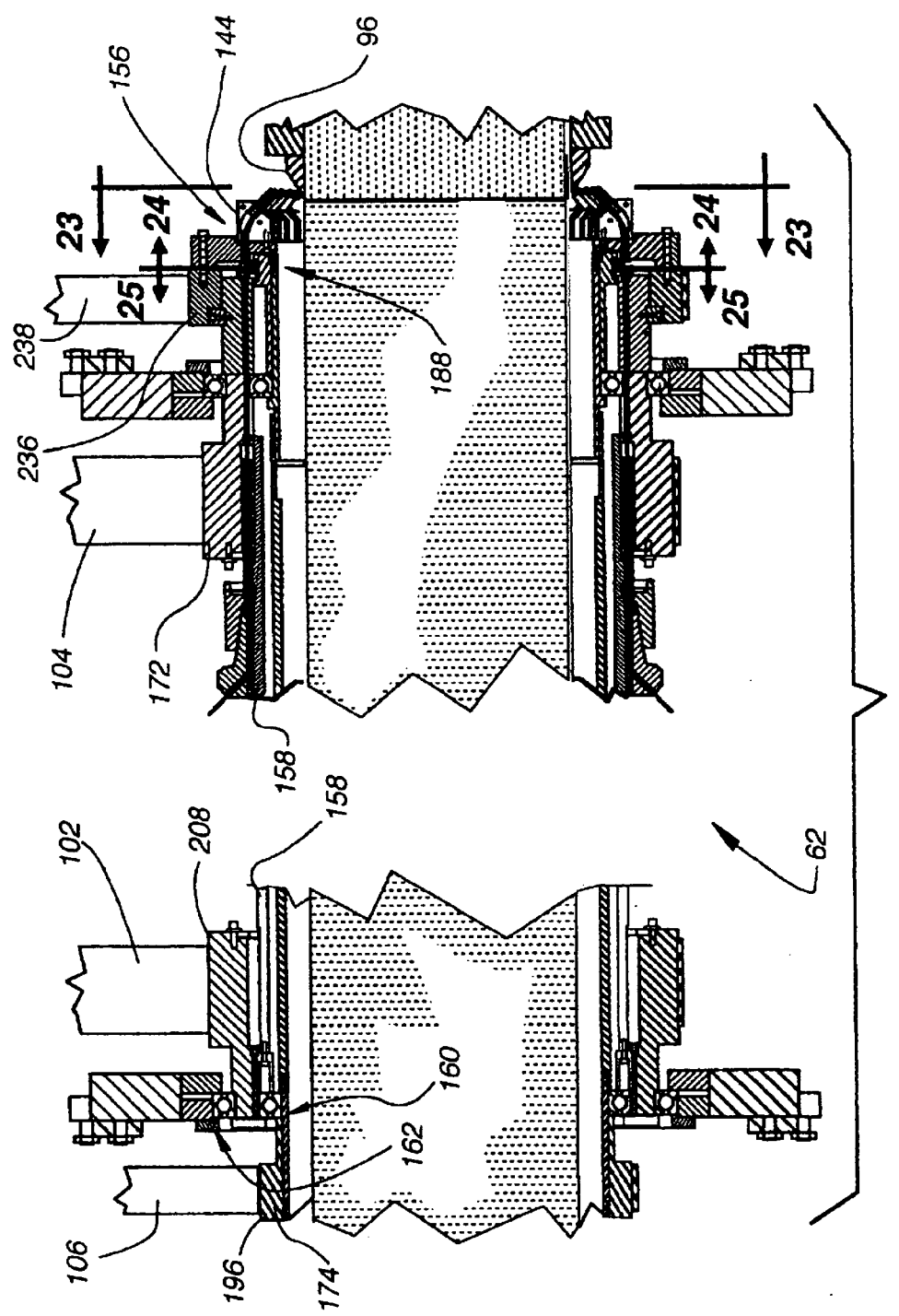
FIG. 16 is a partial cross sectional view of the weft yarn application section taken along line 16—16 of FIG. 9.
Figure 17:
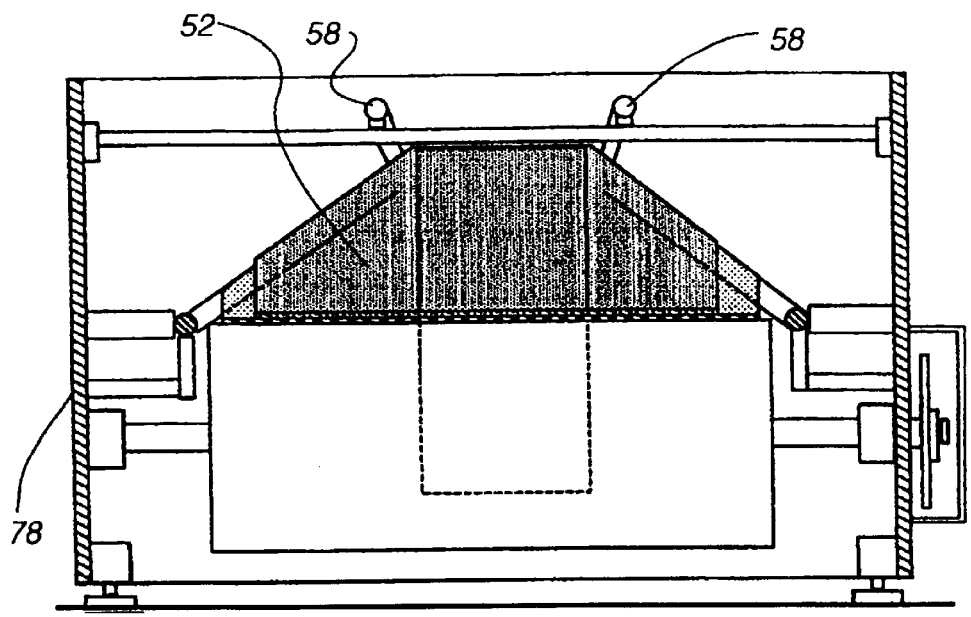
FIG. 17 is a cross sectional view of the folding section taken along line 17—17 of FIG. 5.
Figure 18:
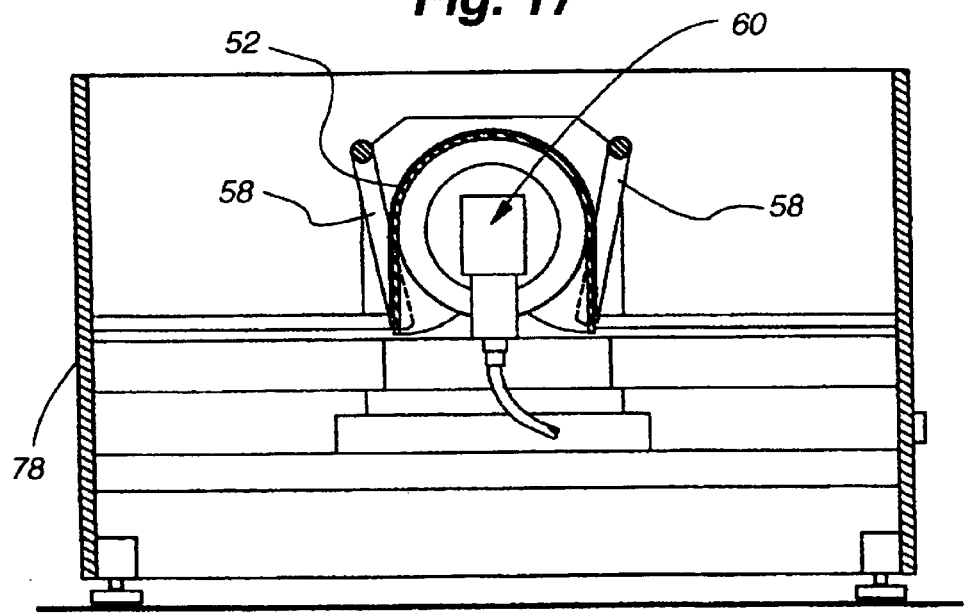
FIG. 18 is a cross sectional view of the folding section taken along line 18—18 of FIG. 5.
Figure 19:
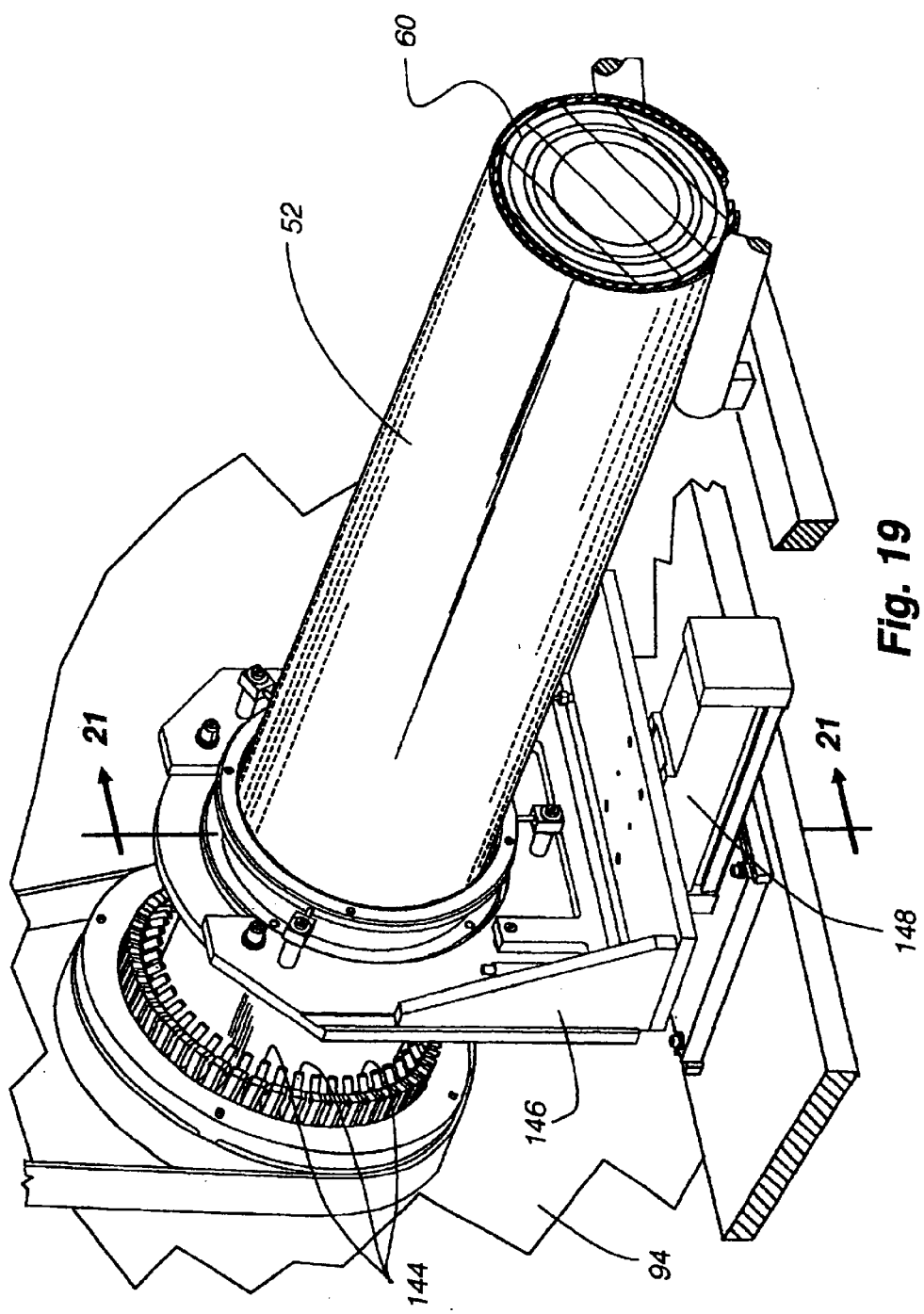
FIG. 19 is a partial isometric view of the fabrication apparatus illustrating the laydown ring assembly.
Figure 20:
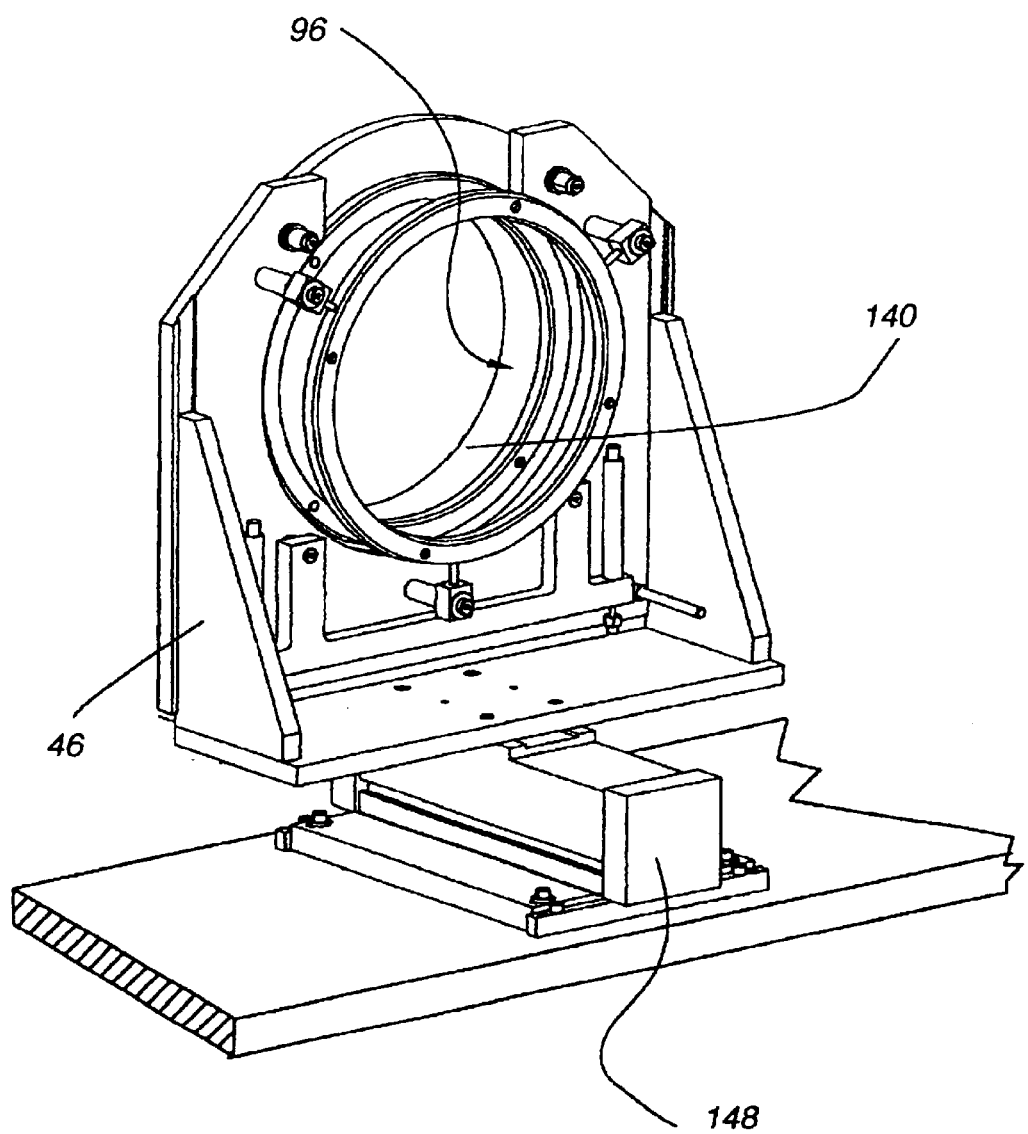
FIG. 20 is an isometric view of the laydown ring assembly.
Figure 23:
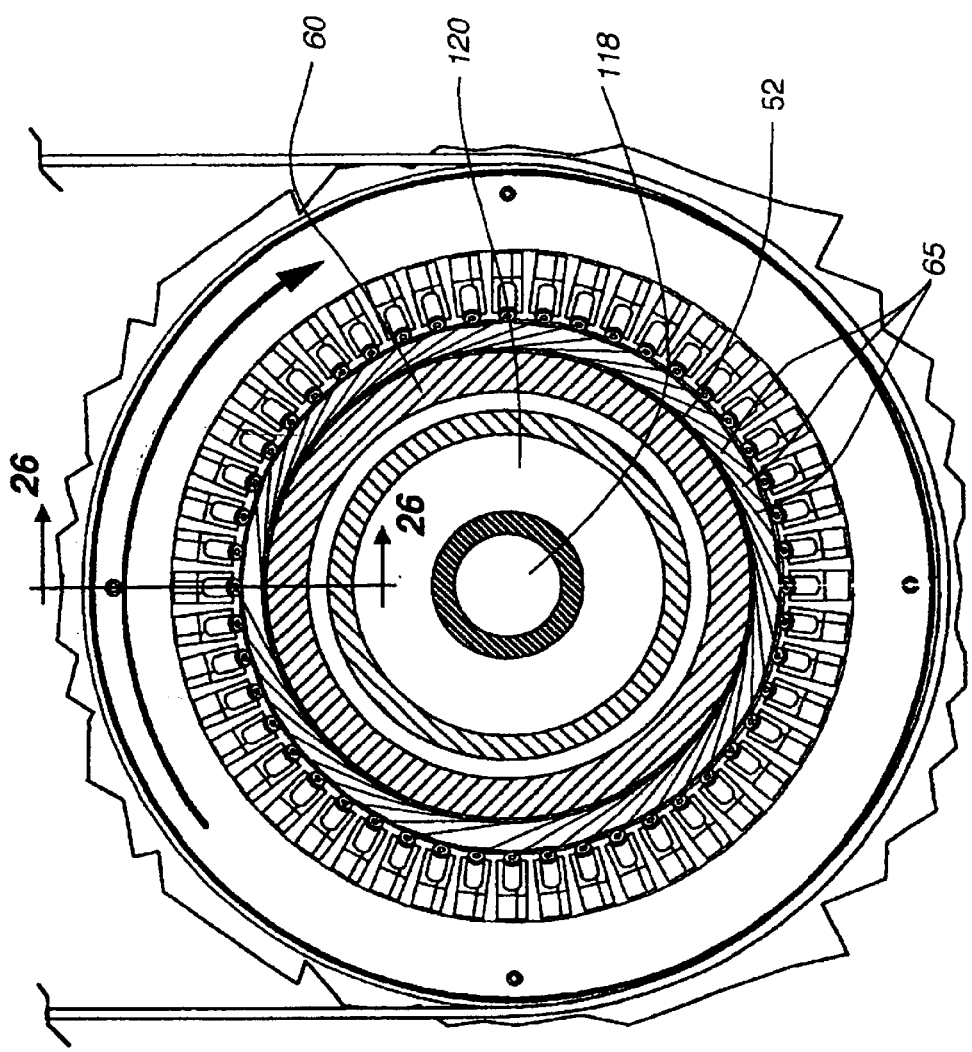
FIG. 23 is an end view of the rotating tubular assembly illustrating the weft yarn nozzles.
Figure 24:
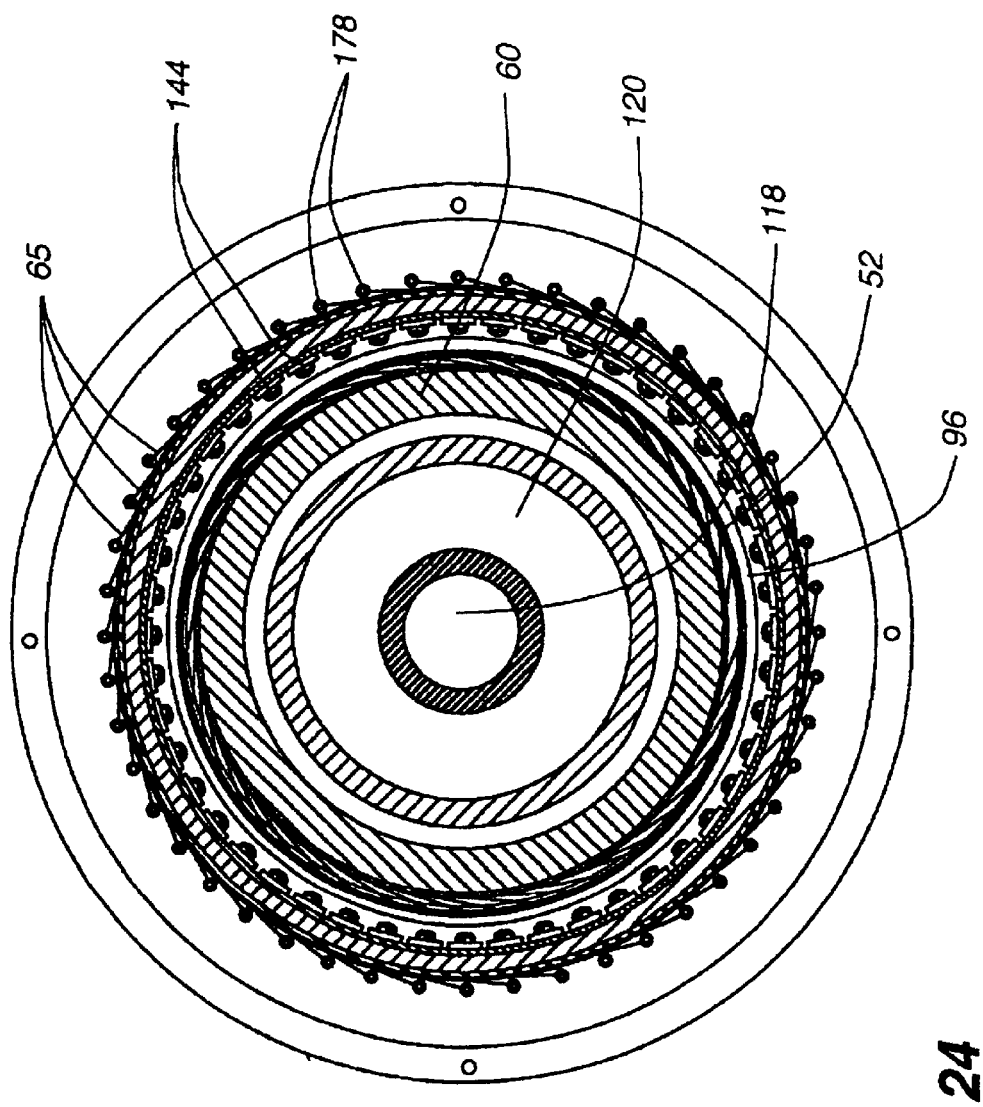
FIG. 24 is a cross sectional view of the rotating tubular assembly taken along line 24—24 of FIG. 16.
Figure 25:
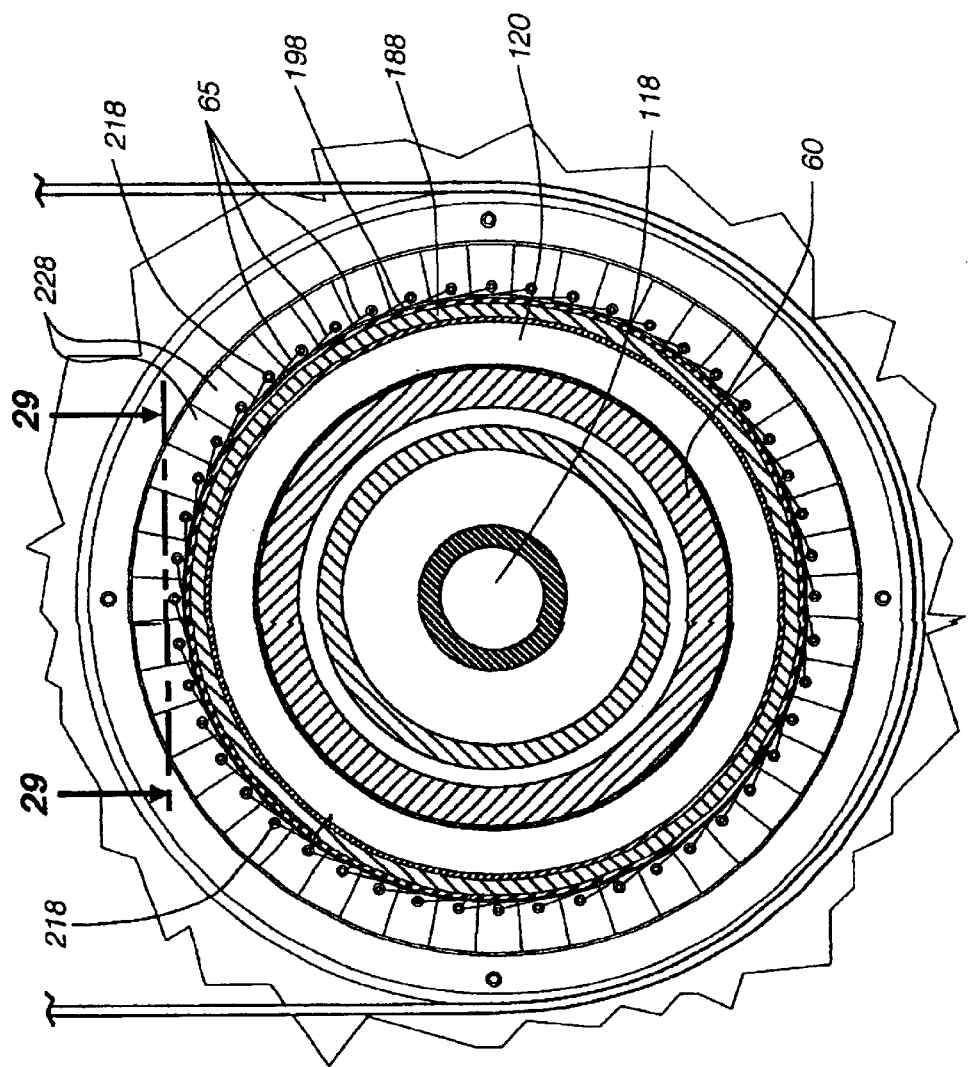
FIG. 25 is a cross sectional view of the rotating tubular assembly taken along line 25—25 of FIG. 16.

Referring to FIGS. 12, 13, and 16, the yarn 65 from each spool 64 is passed through an associated inlet block 170 mounted to the top of the outer tube 158 and fed upstream toward the front or upstream end of the outer tube and its associated weft yarn nozzle 144 via a linear rigid longitudinally-aligned conduit 168. The inlet block includes an inlet opening 180 with a plastic (or ceramic) bushing 182 press fit therein to minimize the friction between the yarn and the sides of the block and prevent fraying. A passage 184 extends downwardly and forwardly from the inlet opening 180 until intersecting with a longitudinally aligned passage 186 which matingly receives the end of the conduit 168 therein at the upstream end of the block. The block's longitudinally aligned passage 186 is open at the block's downstream end as well, and is adapted to receive a nozzle attached to a compressed air line (FIG. 12) to assist in threading or feeding of the yarn into the inlet opening 180 and down the conduit 168 when the apparatus is initially set up and threaded. To advance the yarn through the inlet block and conduit during setup, the nozzle with compressed air flowing through it is temporarily placed in the back end opening of the longitudinally-aligned passage 186. The compressed air flowing through the passage creates a vacuum at the inlet 180, which pulls the yarn therefrom to the intersection with the longitudinally aligned passage. From there, the yarn is pushed by the flow of compressed air down the conduit toward an associated nozzle.

In operation as the outer tube subassembly 152 is rotating at high speed, the yarn 65 contained within the conduits 168 will be forced radially outwardly against the outside of the conduit by centrifical force acting on the yarn. The contact between the inner conduit wall and the yarn will increase the force necessary to pull the yarn from the spool to the associated nozzle, thereby increasing the effective level of tension in the yarn. It will be appreciated that since yarns from spools at the downstream end of the rotating outer tube 158 travel a greater distance in a conduit 168 than yarns from spools attached to more upstream located stations, a higher amount of force will be required to pull them through the conduit. The different lengths of conduit will result in different levels of tension developed in the yarns. As discussed above, the tension in the yarns should be similar when laid down upon the laydown ring 96 and subsequently the warp sheet 52 to ensure uniformity and visual appeal of the finished fabric. Accordingly, the inner tube subassembly 154 with a tension equalization mechanism 188 is provided to help ensure that the tension in all of the weft yarns 65 is essentially equal as they are fed through the weft yarn nozzles 144 and around the laydown ring 96.

Figure 9:
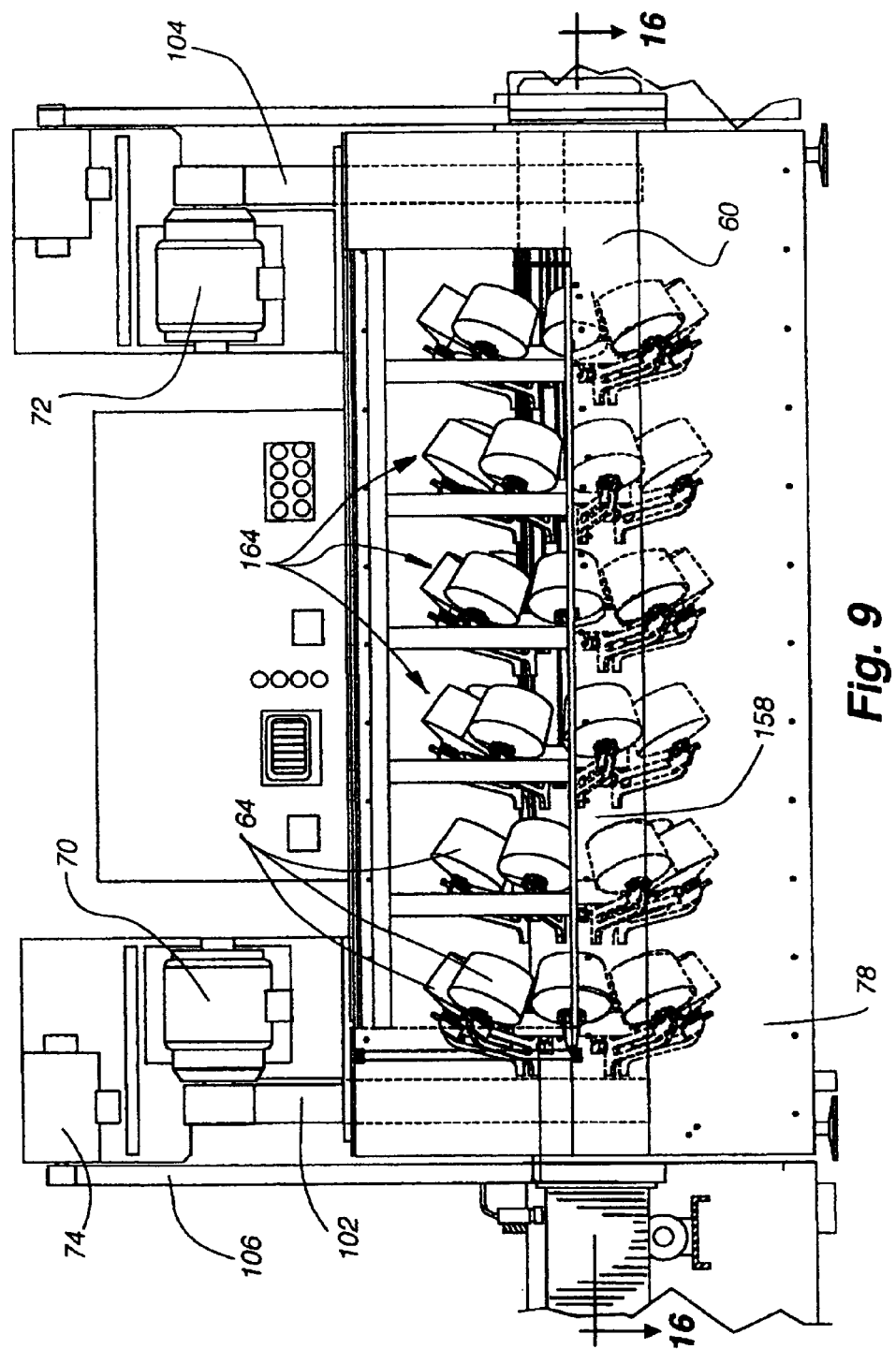
FIG. 9 is a side view of the weft yarn application section.
Figure 10:
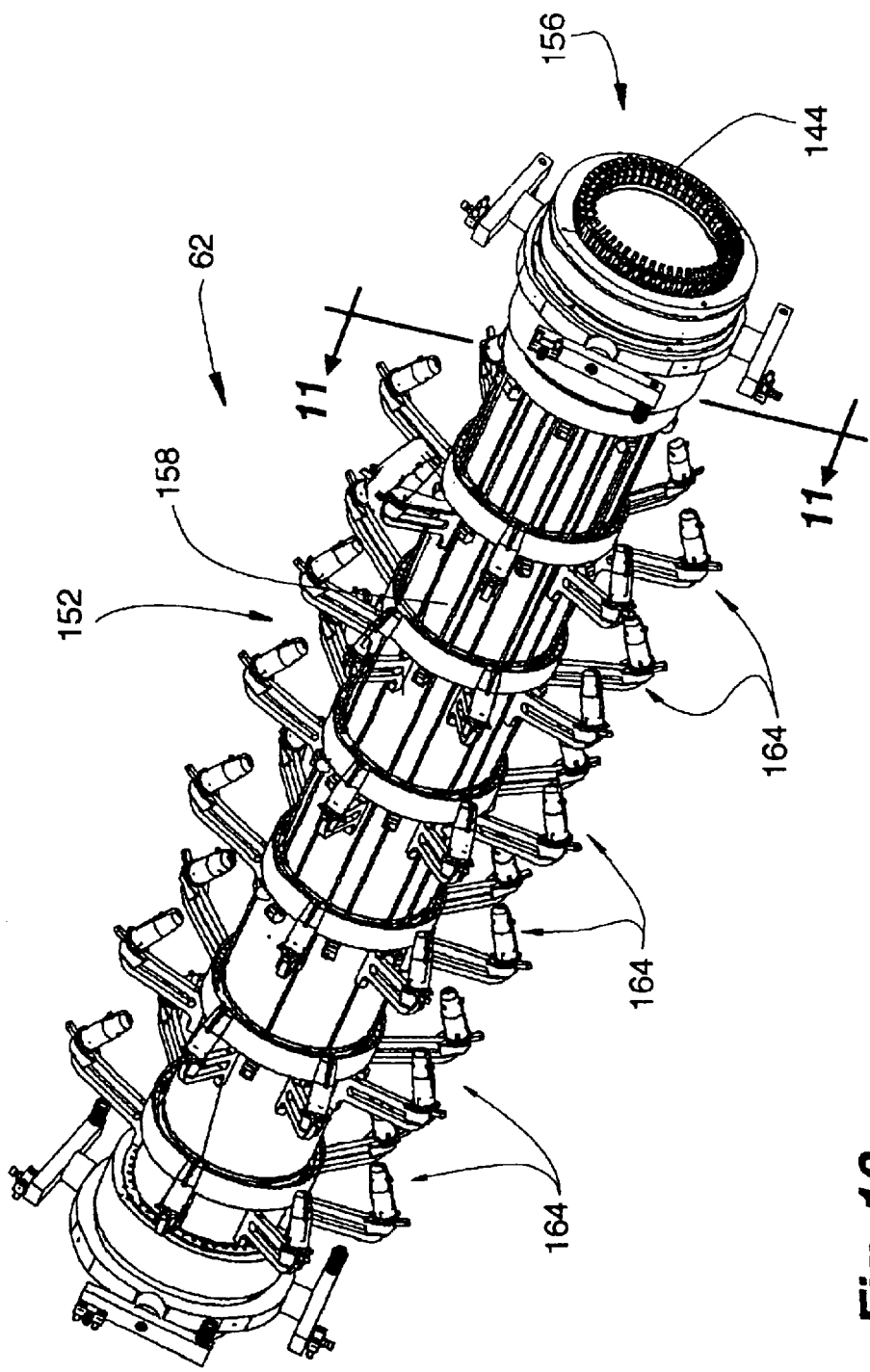
FIG. 10 is an isometric view of the rotating tubular assembly.
Figure 11:
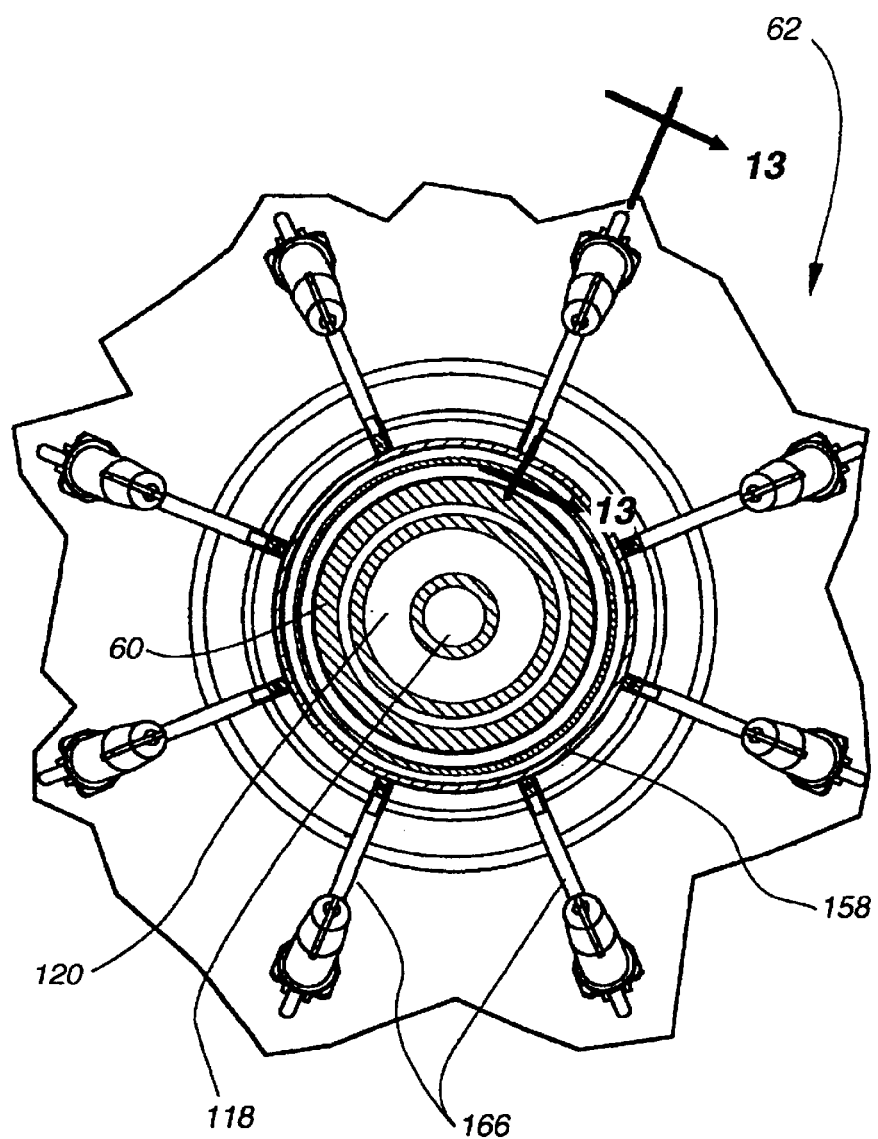
FIG. 11 is a cross sectional view of the rotating tubular assembly taken along line 11—11 of FIG. 9.

The inner tube subassembly 154, as probably best seen in FIG. 26 with supporting information in FIGS. 4A and 9, is a cylindrical tube or inner tubular member 190 that circumscribes the mandrel 60 and is supported interiorly of the outer tube subassembly 152 by the pair of inner ring bearings 160 which are disposed adjacent to opposite ends of the rotating tubular assembly 62. The cylindrical tube 190 has a main cylindrical body 192 extending substantially the entire length of the cylindrical tube 190 with cylindrical axial extensions 194 at each end affixed thereto for unitary rotation therewith. The inner races of the pair of inner ring bearings 160 are secured to the associated extension cylinders 194 so that while the inner tube subassembly is operatively connected to the outer tube subassembly in radially spaced relationship therewith and in a manner such that they could pivot or rotate relative to each other, in operation of the apparatus they actually rotate in unison.

The downstream end of the inner cylindrical tube 190 has a flange 196 defining a axially crowned circumferential surface for receipt of a drive belt (FIGS. 4A and 9) which extends upwardly and wraps around the drive shaft of a drive motor 74 which is provided to rotate the inner tube subassembly at a preselected speed.

The inner tube subassembly 154 serves as a base for the tensioning mechanism 188 to encourage uniform tension in the weft yarns 65 as they are laid onto the warp sheet 52 as illustrated in FIGS. 6–29. The tensioning mechanism comprises (i) the afore-noted inner cylindrical tube 190 that is coupled with the outer tubular member 158 through the inner set of ring bearings 160; (ii) a rubber lined traction ring 198 attached to the inner cylindrical tube proximate its upstream end; and (iii) the motor 74 and the belt 106 for controlling the rotation of the inner tubular member independently of the outer tubular member.

The inner tubular member 190 extends to the downstream end of the outer tube 158 as best shown in FIG. 4A. As mentioned previously, the downstream end of the inner tubular member is flanged at this location and includes the longitudinally crowned circumferential surface 196 adapted to frictionally receive the drive belt 106. The drive belt passes around the drive shaft of the inner tube drive motor 74 that is secured to the framework 78 of the apparatus at the downstream end. The drive motor is electronically coupled to the control system for the apparatus to selectively and precisely control the rotational speed of the inner tubular member.

The outer tubular member 158 has a conduit termination ring 202 at its upstream end as will be described in more detail hereafter with the termination ring having an axially crowned circumferential surface 204 adapted to receive the drive belt 104. The opposite or downstream end of the outer tubular member also has an axially crowned circumferential surface 208 for receipt of the corresponding drive belt 102 and the motors 70 and 72 respectively are mounted above the axially crowned circumferential surfaces on the framework so that the drive belts operatively engaged with the drive shafts of the motors can extend downwardly and engage the axially crowned circumferential surfaces to rotatably drive in unison or individually the outer tubular member. The two drive motors 70 and 72 are controlled by the control circuit for the apparatus so as to be driven in unison, or individually, at a speed proportional to the rotational speed of the inner tubular member 190.

The weft yarn 65 from each spool 64 exits its associated conduit 168 within the upstream belt drive ring 172, extends through a passage 214 in a circumferential block 216 that is secured to the belt drive ring for rotation therewith, exits the block 216 through an outlet 218 with a plastic or ceramic bushing press fit therein and wraps around a generally cylindrical rubber coated surface 220 of the traction ring or drum 198 for a selectively variable distance that might approximate, by way of example, about 300 degrees before leaving the traction ring and passing into the nozzle head assembly 176 (described in detail below) and ultimately out of an associated nozzle 144.

Figure 29:
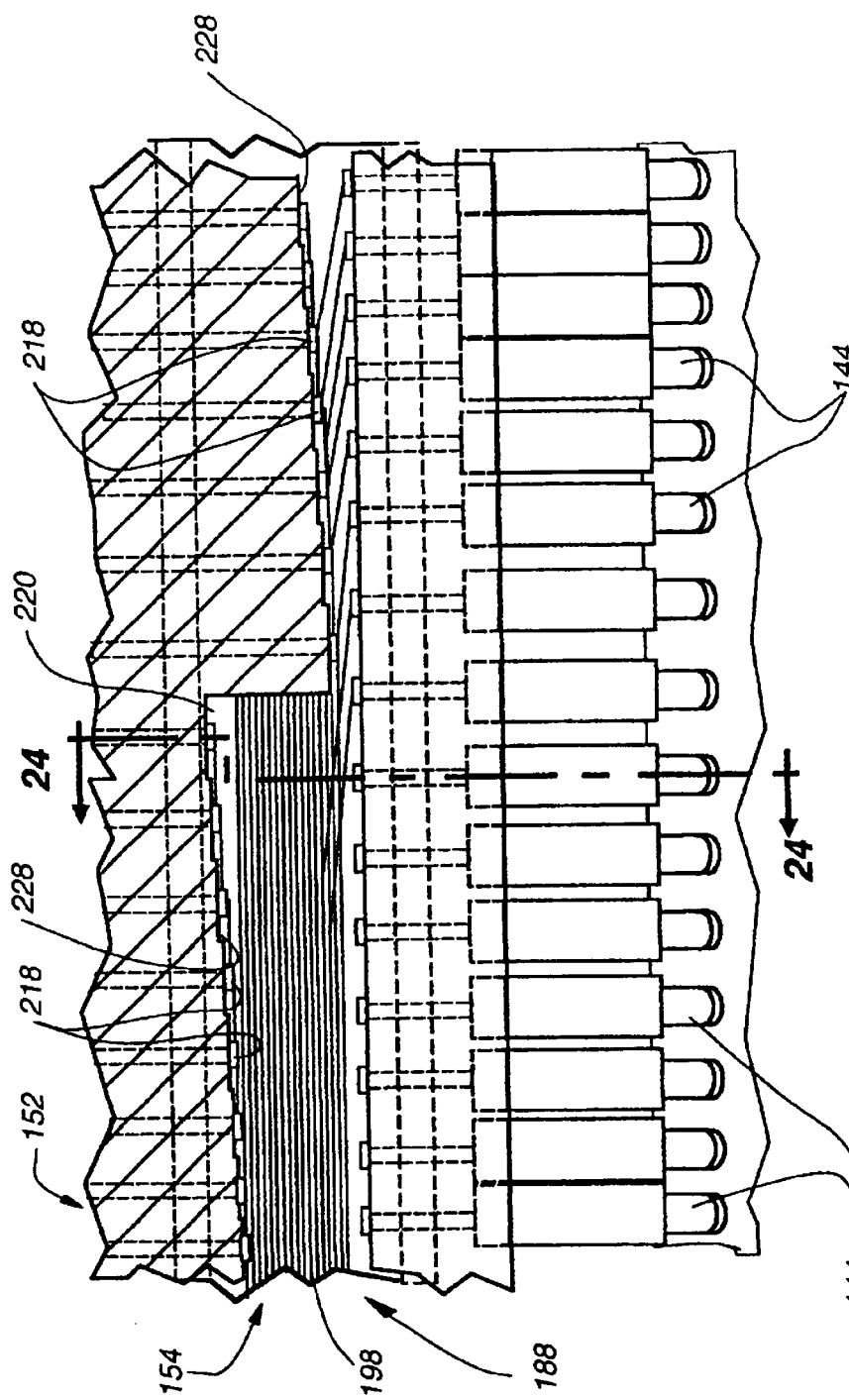
FIG. 29 is a partial cross sectional view of the rotating tubular assembly taken along line 29—29 of FIG. 25.

Operationally, the friction between the rubber of the traction ring 198 and each yarn 65 as it is wrapped around the traction ring causes the traction ring to grip and pull each yarn off its associated spool 64 and through its associated linear conduit 168. A portion of the upstream belt drive ring 172 as illustrated in FIG. 26 is fixedly attached to the upstream end of the outer tube 158 and has passages 224 extending longitudinally through it associated with each weft yarn and in alignment with a passage 214. As can be seen in FIG. 29, the upstream face or end 228 of the circumferential block 216 is stepped with each step being associated with an outlet 218 (FIG. 29). Each step is longitudinally displaced at least 0.020" from an adjacent step in the preferred embodiment providing a maximum longitudinal offset of 0.96" between the first and last outlets. Accordingly, each nozzle 144 overhangs its own longitudinal location or step on the rubber lined portion of the traction ring 198 on which the associated yarn is laid when partially circumscribing the traction ring. This arrangement helps minimize the possibility that the yarns will overlap significantly or become entangled with each other.

The total force applied by the inner tubular member 190 to pull all the yarns 65 off their spools 64 and through their associated conduits is equal to the sum of all individual force amounts necessary to pull each yarn to the traction ring. It is to be appreciated that the force necessary to pull a yarn from a spool to the traction ring is equivalent to the tension level developed in the yarn multiplied by the area of the yarns cross section. As discussed above the yarns from the more downstream stations 164 will require greater force to pull them to the traction ring than yarns from stations located closer to the traction ring, but once passing upstream from the traction ring, the weft yarns will be under substantially the same tension.

Once each yarn has been wrapped partially around the traction ring 198 it is removed from the ring and passed into the nozzle assembly 156 and through its associated nozzle 144 prior to being laid onto and wrapped around the laydown ring 96. The total force necessary to pull each and every yarn off the traction ring when the inner tubular member is rotating at the same speed as the outer tube is the same as the total force necessary to pull every yarn off its respective spool and through its respective conduit. However, the actual force applied to each individual yarn to pull it off the traction ring is equivalent to the total force divided by the total number of yarns. In other words, the tension level in each yarn as it is pulled through its nozzle and laid onto the laydown ring is substantially the same regardless of the longitudinal position of the spool from which the yarn originated along the length of the outer tube.

As mentioned previously, it is desirable to control the tension in the weft yarns 65 as they pass through their associated nozzles 144, and this is accomplished by slightly varying for a short period of time the rotational speed of the outer tubular member 158 relative to the rotational speed of the nozzle assembly 156 which affects the distance around the traction ring that each yarn extends. As probably best seen in FIG. 26, the nozzles 144 are mounted in equal circumferentially spaced relationship on the mounting ring 176 which is secured to a ring bearing 232 that in turn is rotatably supported on an inset bearing 234 seated in the circumferential block 216 described previously through which the weft yarns extend prior to being wrapped on the traction ring. The ring bearing 232 has an axially crowned circumferential surface 236 for receipt of still another drive belt 238 that is driven by the drive shaft of a motor 240 also mounted on the framework 78 vertically above the rotating tubular assembly. This motor is driven at the same speed as the other three motors 70, 72 and 74 in operation of the apparatus but by slightly varying for a short length of time the speed of the motor 240 relative to the speed of the motors driving the outer and inner tubular members, the relative circumferential relationship of the nozzles to designated locations on the traction ring can be varied thereby varying the circumferential distance the yarns are engaged with the traction ring and thus the tension in the yarns upstream from the traction ring toward the yarn nozzles. Accordingly, the yarn tension can be desirably selected by relative rotational speeds of the motors driving the nozzle ring and the outer tubular member until a desired tension is obtained in the yarns upstream from the traction ring and at that point synchronizing the rotational speeds of the nozzle ring and the outer tubular member to maintain the desired tension.

As mentioned previously, prior to laying the weft yarns 65 onto the warp sheet 52 from the laydown ring 96, the transfer belt 56 and warp sheet have moved along the upstream end of the mandrel 60 where they have been heated to a temperature sufficient to soften the adhesive scrim on the warp sheet. Accordingly, as the weft yarns are laid onto the adhesive scrim on the outer surface of the warp sheet, they remain in position and as the transfer belt moves the warp and weft yarns along the mandrel, they ride over the cooling section 112 of the mandrel where the adhesive sets to positively secure the weft yarns to the warp sheet at the locations where the weft yarns were laid onto the warp sheet.

Cutting and Unfolding Station

As the transfer belt 56 moves the warp and weft yarns out of the weft yarn application station, they pass a cutting wheel 242 (FIG. 4A) positioned immediately beneath the mandrel 60 and along its longitudinal centerline so the cutting wheel which is driven by a motor (not seen) can cut the weft yarns 65 along the gap between the lateral edges of the transfer belt along the bottom of the mandrel. The cutting of the weft yarns releases the warp and weft yarn fabric 68 so it can be unfolded from its cylindrical configuration and converted to a flat orientation by the unfolding bars 66.

There are a pair of unfolding bars 66 which are tubular in configuration and rotatably driven about their longitudinal axes. The bars converge and slope upwardly in a downstream direction so that as the transfer belt 56 engages the rotating bars, it is encouraged to unfold from its generally cylindrical configuration to a flat orientation. The folding bars are rotated in opposite directions so that as the bars engage the side edges of the transfer belt, they force the side edges outwardly and upwardly until the belt assumes a flat orientation and at that point in the process the belt crosses over a large idler drum 244 (FIG. 4A) near the downstream end of the apparatus.

After passing over the large idler drum 244, the transfer belt 56 with the fabric 68 on its top surface and in a flat orientation moves down a slight decline run 246 of the transfer belt prior to the belt passing around the drive roller 84 where the fabric is separated from the transfer belt and pulled upwardly around a plurality of idler and tensioning rollers 248 before being wound onto a driven take-up roller or beam 250. The take-up roller is driven at a speed consistent with the speed of the transfer belt so as to not place undue tension in the fabric.

Operation

In operation of the apparatus, the beam 54 of aligned warped yarns having an upper layer of a thermoplastic adhesive scrim is mounted on an axle having a break to selectively resist removal of the warp yarn from the beam. The warp yarns 52 are passed around the plurality of idler and tensioning rollers before being laid upon the top surface of the transfer belt 56 which carries the warp yarns through the weft yarn application station 46. However, before the weft yarns are applied to the warp yarns, the belt with the warp yarns thereon is folded into a cylindrical configuration and moved into surrounding relationship with the longitudinally extending generally cylindrical mandrel 60 having an internal heating section 110 at its upstream end and an internal cooling section 112 at its downstream end. As the belt and warp yarns pass over the heating section, the temperature of the thermoplastic adhesive scrim is elevated until the adhesive becomes tacky and in this condition, the warp yarns are fed into the weft yarn application station.

In the weft yarn application station 46, the plurality of circumferentially spaced spools 64 of weft yarn 65 provided at longitudinally spaced locations are rotated with yarns from each spool moving in the confined conduits 168 in an upstream direction where they pass through the tensioning system 188 prior to passing through the individual circumferentially spaced nozzles 144 which lay the yarns onto the stationary laydown ring 96 that circumscribes the warp yarns in close relationship therewith.

The laydown ring has the frustoconical surface 142 that tapers inwardly in a downstream direction so that the yarns deposited thereon are urged in a downstream direction and are pulled off the downstream edge of the frustoconical surface onto the warp yarns moving linearly therebeneath. The weft yarns adhere to the tacky adhesive scrim as they are laid in position in a substantially perpendicular relationship with the warp yarns.

The fabric 68 of warp yarns with overlying weft yarns moves linearly along the weft yarn application station and across the cooling section 112 of the mandrel where the temperature is dropped to cure the adhesive, thereby positively holding the weft yarns in position on the warp yarns.

It is to be appreciated that the fabric 68 of warp and weft yarns is in a cylindrical configuration as it leaves the weft yarn application station and immediately passes over the rotary cutting wheel 242 which cuts the weft yarns along the bottom edge of the cylindrical fabric along the gap between the lateral edges of the transfer belt.

After the fabric has been cut by the cutting wheel, it is encouraged to unfold from its cylindrical form into a flat elongated sheet by the pair of rotating unfolding rods, and as soon as the fabric and transfer belt have been flattened out, they pass over the idler drum 244 and a slightly further distance downstream where the transfer belt returns in an upstream direction, the fabric is separated therefrom and passes over the plurality of idler and tensioning rollers before being wound onto the take up drum or beam 250.

Alternate Embodiment

Figure 30:
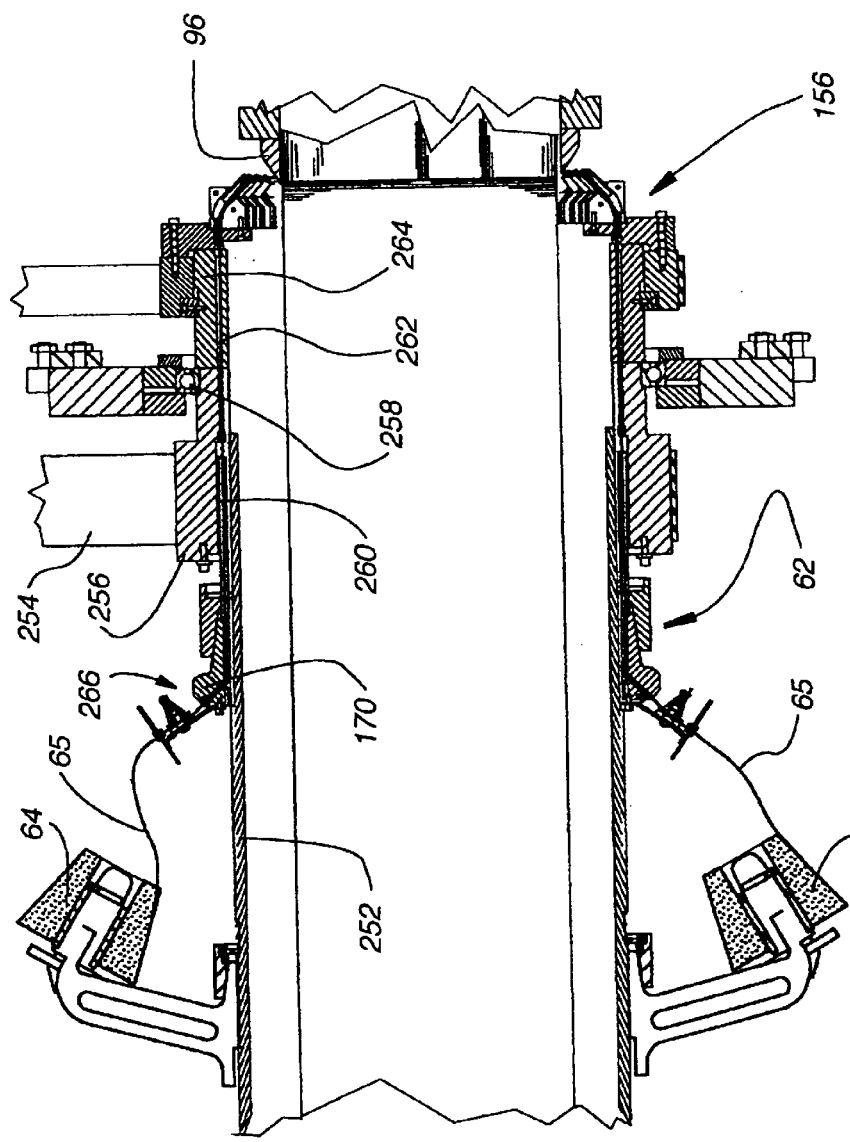
FIG. 30 is a partial cross sectional side view of the rotating tubular assembly illustrating a first alternative embodiment weft yarn tensioning system.

An alternative embodiment of a tensioning system is shown in FIGS. 30–33. FIG. 30 is a fragmentary section looking at the upstream end of a rotating tubular member 252 which is similar in many ways to the previously described embodiment. In other words, there are a plurality of stations of spools 64 with the spools on the rotating tubular member with only one station being seen. The spools as in the previously described embodiment have weft yarn 65 which is fed upstream through a conduit system 168 as previously described so that the yarns ultimately pass through one of a plurality of equally circumferentially spaced nozzles 144 from which the yarns are deposited onto the laydown ring 96 and from there onto the warp yarns 52 carried along the mandrel 60 by the transfer belt 56. In this embodiment, however, there are not inner and outer rotating tubular members as in the prior embodiment, but rather only one rotating tube 252 that is rotatably driven by a belt 254 passing around a conduit termination ring 256 which forms part of the rotating tube at its upstream end and is rotatably supported within the framework 78 of the apparatus by a pair of ring bearings 258 (only one being seen). Passages 260 through the termination ring 256 are aligned with associated passages 262 through a circumferential block 264, and again, the nozzle assembly 176 is rotatably mounted on the circumferential block 264 identically to the previously described embodiment. The nozzle assembly is rotatably driven again by the motor 240 even though the speeds of the motors 70 and 72 are synchronized so that they rotate at identical speeds.

The tension in the yarn 65 in this embodiment is controlled by conventional adjustable tensioners 266 which are secured to the yarn inlet blocks 170 associated with each spool of weft yarn. A bracket 268 having a plate 270 with an eyelet 272 therethrough is secured to each inlet block so that yarn emanating from the associated spool 64 passes through the eyelet, the tensioner and subsequently into the inlet block from which it passes upstream to an associated nozzle 144.

The tensioner 266 itself is a conventional thread or yarn tensioner which is best seen in FIG. 33 to have an upstanding threaded rod 274, a lower fixed ring plate 276, an upper adjustable ring plate 278, a cap screw 280 threaded onto the rod, and a coil spring 282 disposed between the cap screw and the adjustable ring plate. The threaded rod passes through the bracket 268 so that a nut 284 can secure the tensioner to the bracket in the position illustrated best in FIG. 31.

In using the tensioner, a weft yarn emanating from a spool 64 and passing through the eyelet 272 in the plate 270 is threaded between the fixed and adjustable ring plates before being inserted into the inlet block 170. The tension in the yarn is adjusted by moving the cap screw 280 up or down the threaded rod thereby affecting the pressure by which the adjustable ring plate 278 is compressed against the fixed plate 276 and thereby yieldingly resisting movement of the yarn 65 which passes slidably therebetween. The tension in the yarn passing through the tensioner is manually set such that the tension in each of the yarns emanating from its associated nozzle 144 is substantially the same. As will be appreciated, since the spools that are positioned most downstream have associated yarns extending through conduits 168 over a significant distance, there is more friction and thus tension placed in the yarns, than the yarns associated with spools at more upstream positions. Accordingly, the compression or resistance set in the more downstream yarns by the tensioners would be less than for the tensioners associated with the upstream spools. By adjusting the tension of the yarn of each spool, however, it will be seen that the tension in the yarns emanating from the nozzles can be substantially equalized for uniform application to the warp yarns passing beneath the laydown ring.

Second Alternate Embodiment

The second alternate embodiment of the weft yarn tensioner can be incorporated into a portion of the first described embodiment of FIGS. 1–29. The apparatus commencing with the lay down ring 96 and extending upstream as well as everything extending downstream from the outer rotating tubular drum assembly 62 would be identical except the rotating inner tube subassembly 154 would not be required nor would the motor 72 that rotates the inner tubular drum assembly be needed. In other words, weft yarns 65 are again supplied on spools 64 and delivered upstream in the same manner as that of the embodiment of FIGS. 1–29. The weft yarns, however, are tensioned in a different manner but again to be delivered under uniform tension to the lay down ring with a tensioning unit 290 as shown in FIGS. 34–66 and as will be described in detail hereafter. Generally speaking, weft yarns moving upstream from the spools 64 are delivered to yarn drive units 292 which include a rotating cylindrical yarn drive roller 294 and a cylindrical nip or pinch roller 296 between which the yarns are passed so the cylindrical yarn drive roller pulls weft yarns 65 from their spools and delivers each yarn at the same speed to an associated yarn nozzle 144 for deposition onto the lay down ring 96 and subsequently onto the warp sheet 52 as described previously. There are in fact six yarn drive units 292 spaced circumferentially around the tensioning unit 290 with each yarn drive unit being adapted to advance eight weft yarns to their associated yarn nozzles. By using yarn drive units of the type described in detail hereafter which are each driven at a uniform speed, yarns are delivered to the lay down ring at a uniform speed and tension regardless of the distance the yarn has traveled upstream from its yarn spool.

Figure 34:
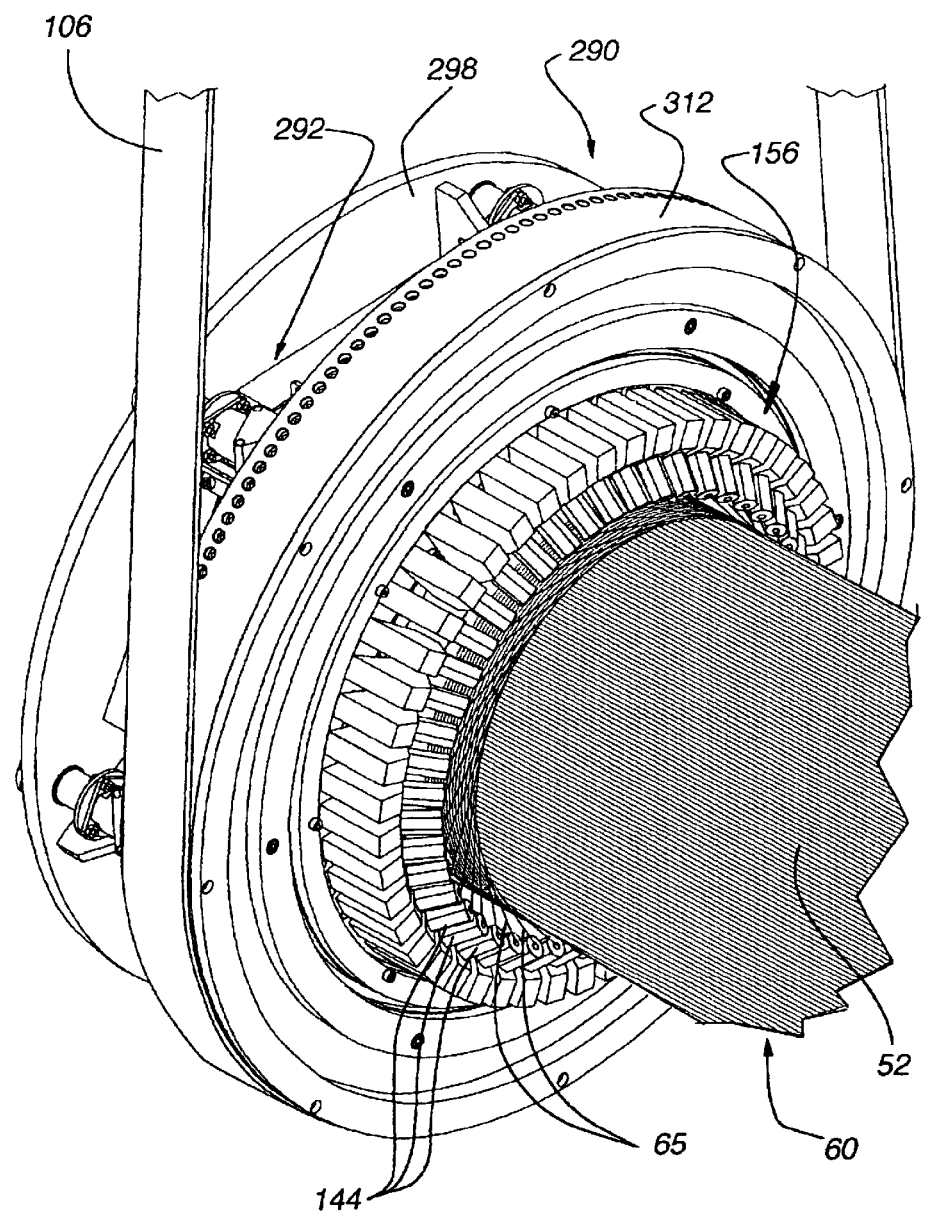
FIG. 34 is a fragmentary isometric of a second alternate embodiment of a weft yarn tensioning system.
Figure 35:
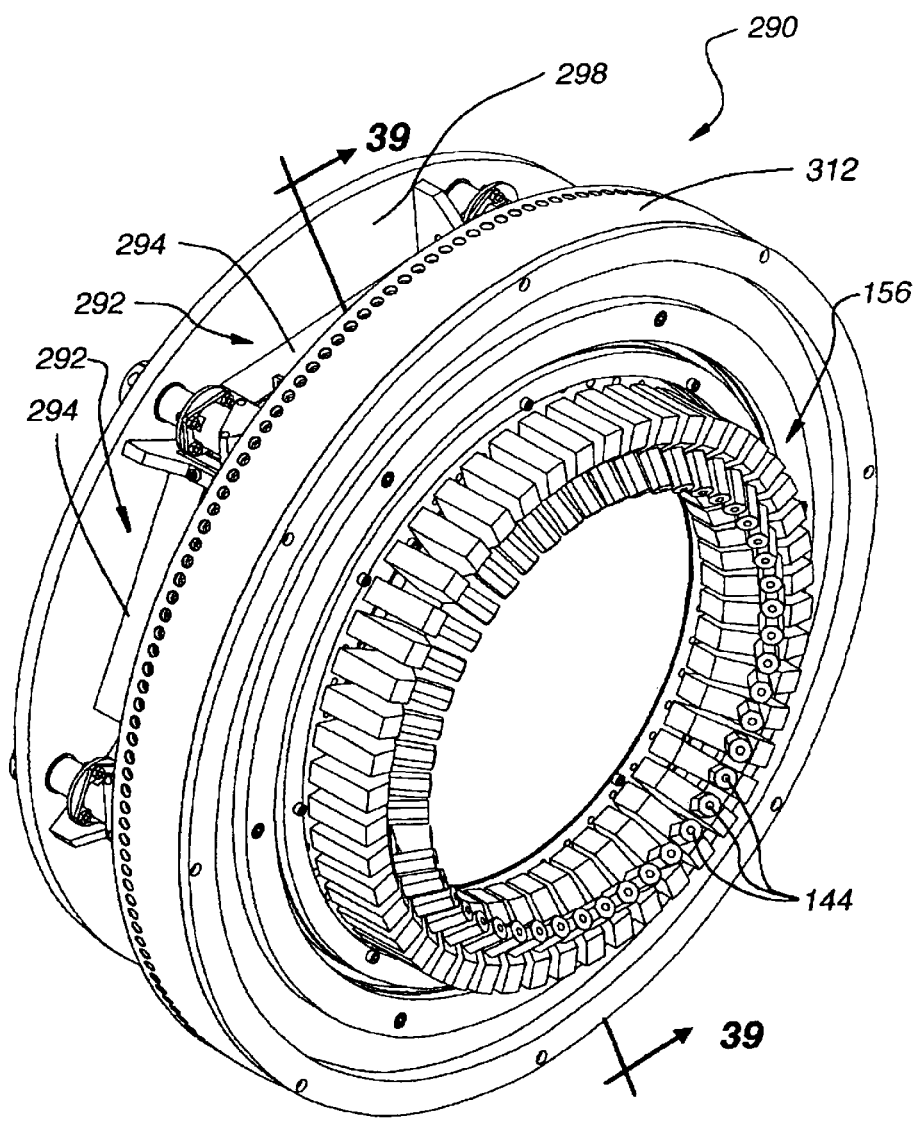
FIG. 35 is an isometric similar to FIG. 34 with the warp yarns and drive belt for the weft yarn tensioning system having been removed for clarity.
Figure 36:
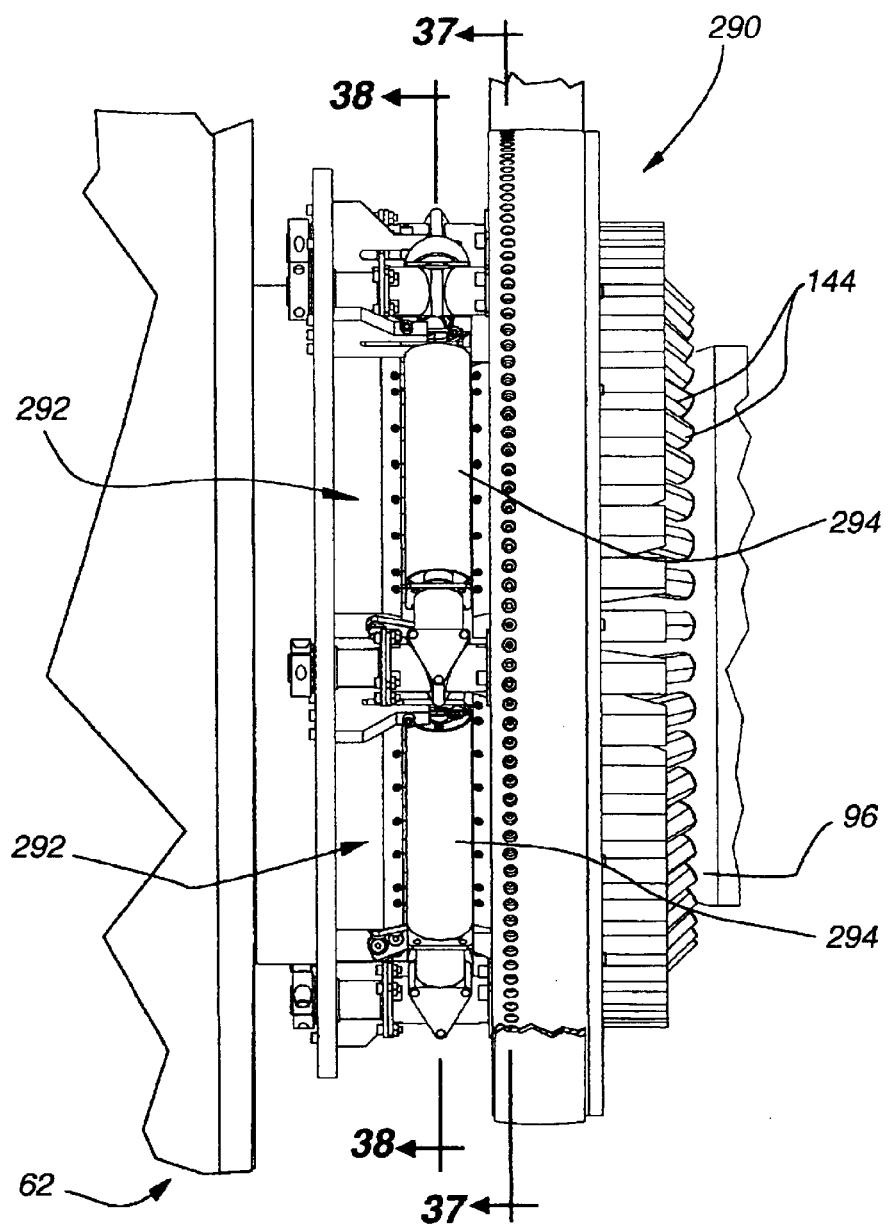
FIG. 36 is a fragmentary side elevation of the tensioner of FIG. 34.
Figure 37:
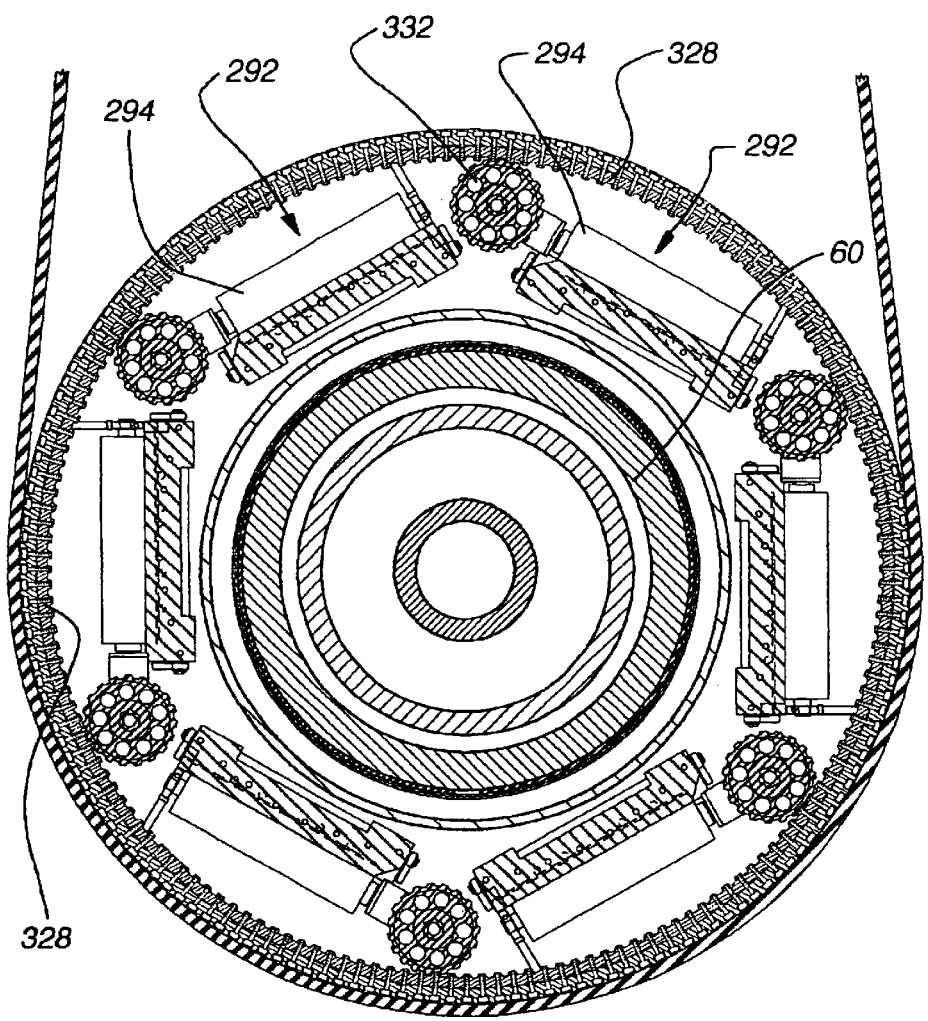
FIG. 37 is a fragmentary section taken along line 37—37 of FIG. 36.
Figure 38:
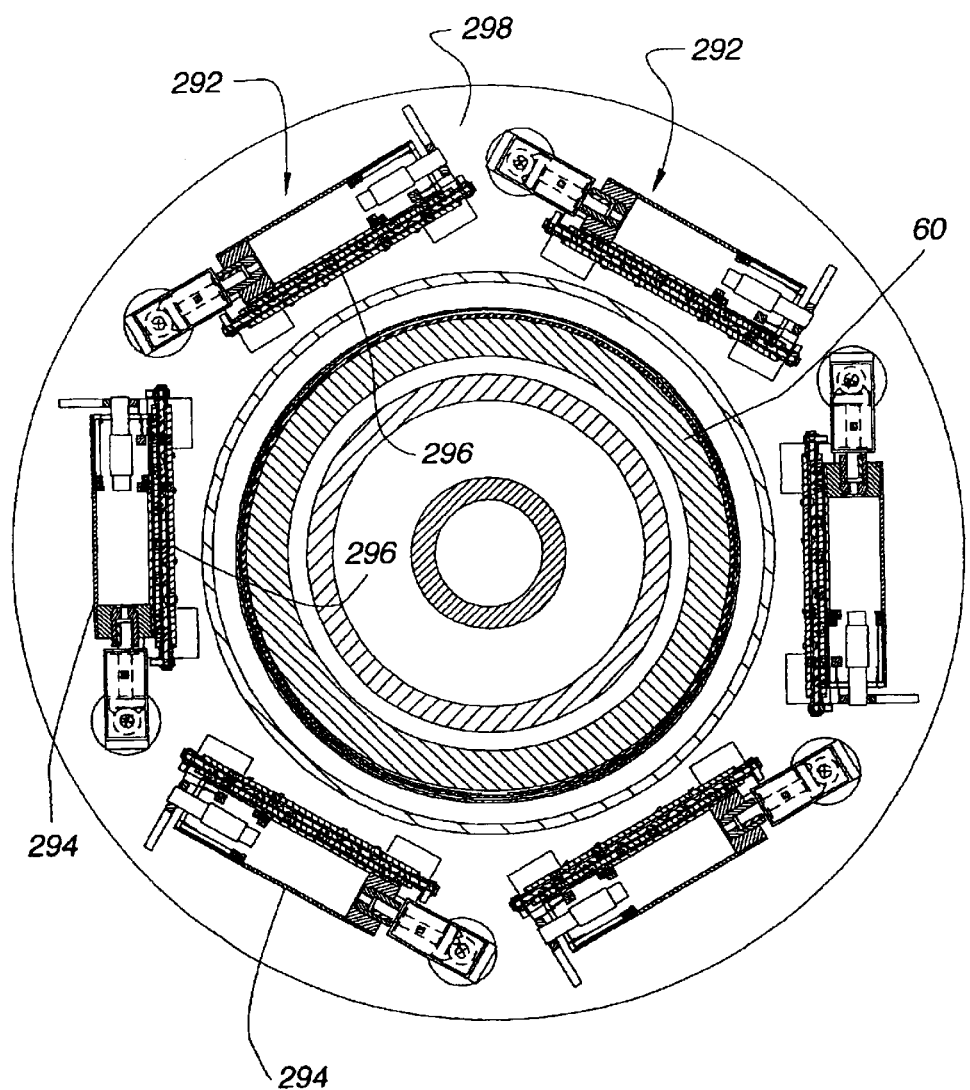
FIG. 38 is a section taken along line 38—38 of FIG. 36.
Figure 39:
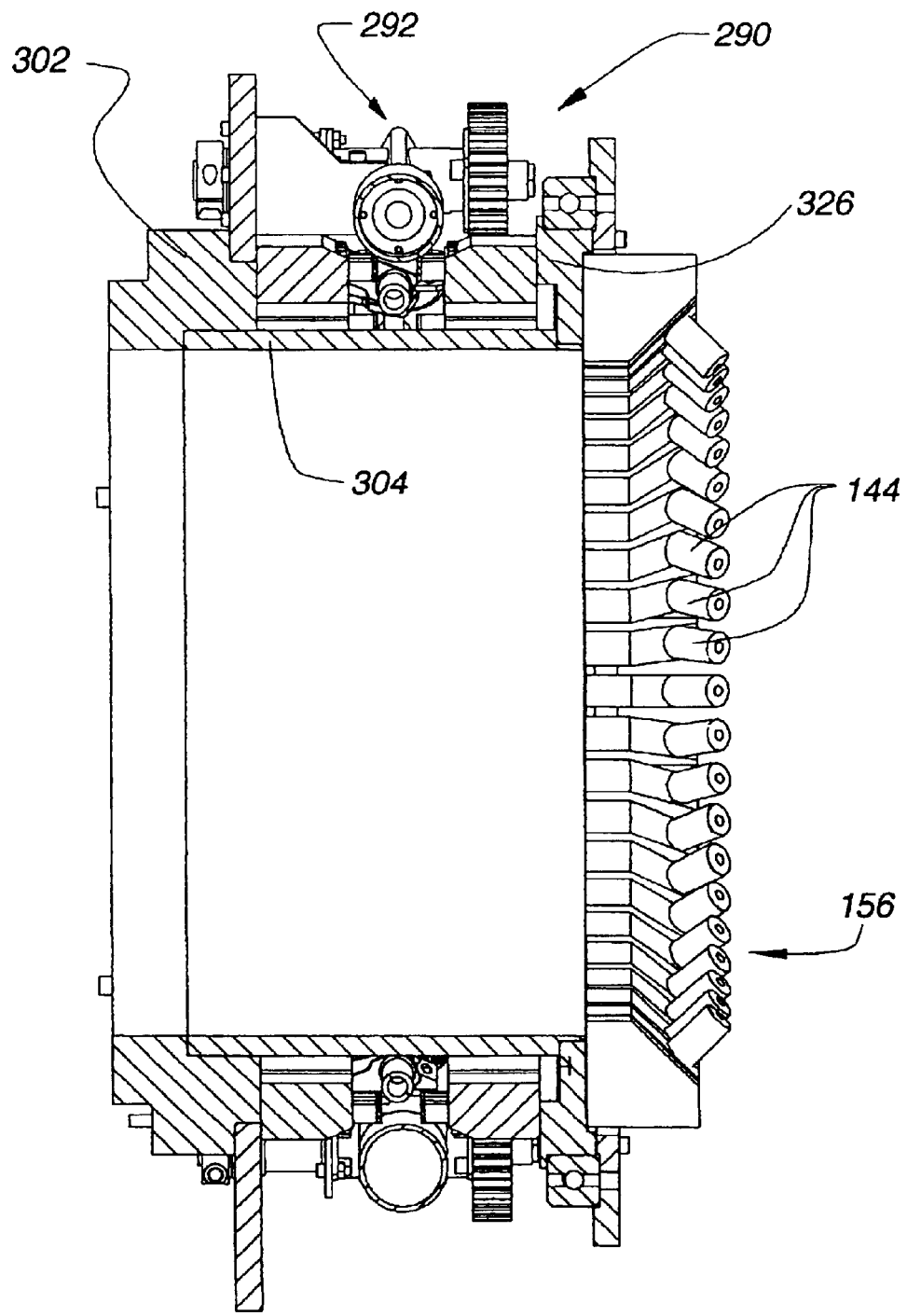
FIG. 39 is a section taken along line 39—39 of FIG. 35.

With reference to FIG. 34, the tensioning unit 290 is illustrated in its mounted position circumscribing the cylindrical mandrel 60 on which the warp sheet 52 is longitudinally disposed. The warp sheet is moved downstream through the tensioning unit as the tensioning unit applies weft yarns 65 in a cross direction to the warp sheet. The tensioning assembly can be seen to include a radial mounting ring 298 on which are mounted six circumferentially spaced yarn drive units 292 that advance and feed weft yarn fibers upstream to the nozzle assembly 156 that was described previously in connection with the first-described embodiment of FIGS. 1–29. The yarn drive units 292 are driven in unison by the drive belt 106 connected to the motor 74 described previously in connection with the first-described embodiment. As will become clear later, rotation of the drive belt 106 uniformly operates each yarn drive unit so that each of the forty-eight weft yarns 65 being advanced upstream is delivered to the lay down ring 96 at a desired and uniform speed so as to be laid down on the warp sheet under uniform tension. FIG. 35 illustrates the tensioning unit 290 of FIG. 34 in slightly more clarity through the removal of the mandrel with the warp sheet 52 thereon and the drive belt 106.

Figure 44:
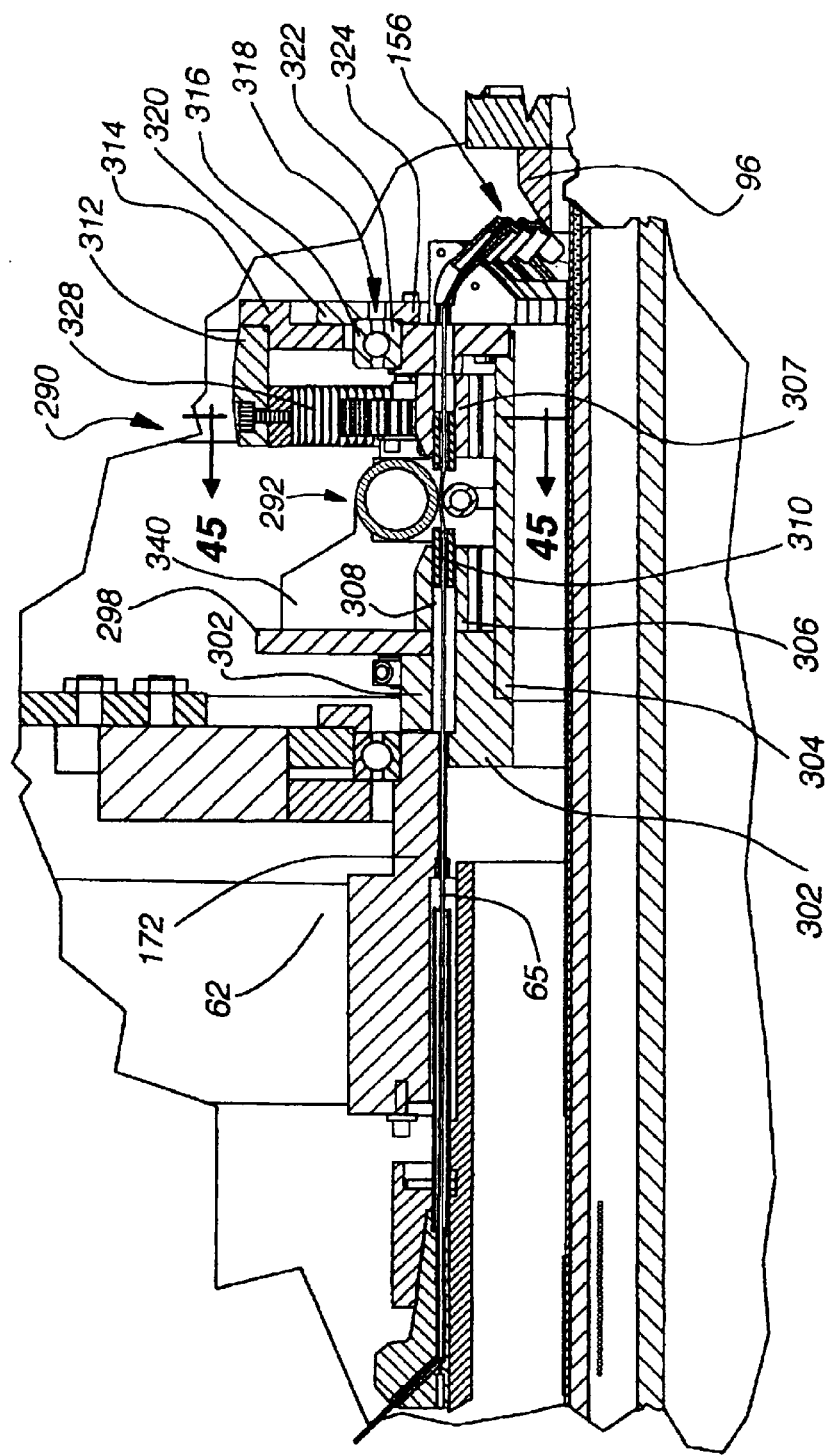
FIG. 44 is a cross-sectional view similar to FIG. 26 illustrating the tensioning unit of FIG. 34 as it relates to other components of the apparatus of the invention.

With reference to FIG. 44, the cross-section of the tensioning unit 290 illustrates the passage of the weft yarns 65 through the tensioning unit and onto the lay down ring 96. The afore-noted radial mounting ring 298 is secured to an extension ring 302 in any suitable manner such as by welding with fasteners, or the like, along the inner edge of the radial mounting ring. The extension ring is secured to the upstream belt drive ring 172 of the outer tubular assembly 62 at its upstream end in any like suitable manner. An extension sleeve 304 is secured in a radially inner notch along the upstream end of the extension ring 302 so as to protrude upstream from the extension ring in circumscribing relationship with the mandrel 60. As will be appreciated, the extension ring and the extension sleeve secured thereto both rotate in unison with the upstream drive belt ring 172 of the outer tubular assembly 62. The radial mounting ring 298 also rotates in unison with the upstream drive belt ring 172 through its connection to the extension ring 302.

Each yarn drive unit 292 is associated with a yarn orienting block 306 and a yarn re-orienting block 307 with each yarn drive unit, yarn orienting block and yarn reorienting block being circumferentially spaced in upstream alignment with the radial mounting ring 298 so as to be oriented somewhat tangentially to the extension sleeve 304. The yarn orienting blocks 306, which will be described in more detail later, are secured to the radial mounting ring to rotate in unison therewith and have passages 308 therethrough for receipt of weft yarn 65 from various ones of the spools 64 downstream from the tensioning unit 290. Each yarn orienting block in the described embodiment has eight passages 308 for individual receipt of a weft yarn and each passage is lined with a low friction internal sleeve 310 so the yarn can slide smoothly through the yarn orienting block.

As mentioned previously, the yarn drive units 292 are adapted to advance the forty-eight weft yarns upstream for delivery to the lay down ring 96 and do so by engaging each yarn with a cylindrical yarn drive roller 294 in a yarn drive unit with the yarns being urged against the surface of the yarn drive roller with a nip roller 296. The yarn drive rollers are driven rotationally about their longitudinal axes by the motor 74 and its drive belt 106 which drivingly engages an axially crowned ring 312 mounted on a closure ring 314 that is in turn secured to the outer race 316 of a bearing 318 by an outer race confinement ring 320. The outer race confinement ring, closure ring, and crowned ring are all joined together in any suitable manner such as by welding, with fasteners, or the like. The inner race 322 of the bearing 318 is secured to an inner race confinement ring 324 and an upstream anchor ring 326 (FIG. 39) which is in turn secured to the extension sleeve 304 so the anchor ring, inner confinement ring, and inner race of the bearing rotate in unison with the upstream drive belt ring 172.

An internal ring gear 328 having radially inwardly directed teeth is anchored to the inner radial surface of the axially crowned ring 312. While the ring gear could take numerous forms, in a preferred embodiment of the invention as shown best in FIGS. 41, 42 and 45, it is a flexible band that could be made of nylon, metal, or the like secured to the radially inner surface of the axially crowned ring with a plurality of fasteners 330 around the periphery of the crowned ring. As will be explained in detail later, the internal ring gear operatively engages a gear wheel 332 associated with each yarn drive unit 292 to drive the yarn drive rollers 294 at a uniform predetermined speed independently of the speed of rotation of the outer tubular assembly 62. The weft yarns 65 emanating from the yarn drive units 292 after passing through an associated re-orienting block 307 are fed into associated apertures or passages 334 of a yarn redistributing ring 336 to which the nozzle assembly 156 is mounted. Each passage 334 through the redistributing ring is aligned with a yarn nozzle 144 in the nozzle assembly 156 so the yarns can be passed through an associated yarn nozzle and onto the lay down ring 96 as described previously. The yarn re-orienting blocks are secured to the downstream face of the re-distributing ring 336 in any suitable manner.

Figure 43:
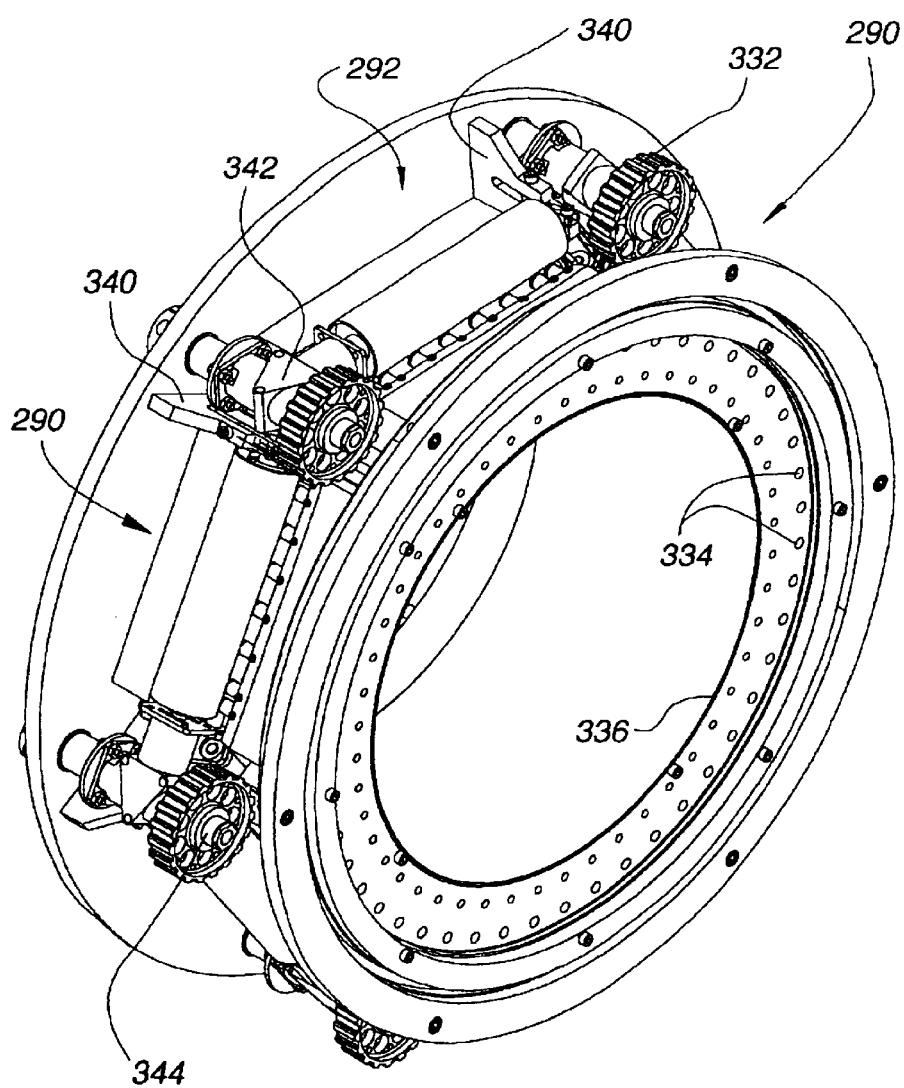
FIG. 43 is an isometric similar to FIG. 35 with components of the tensioner having been removed for clarity.

The yarn drive units 292 are identical and can be seen best in FIGS. 46–52. They are also shown mounted in circumferentially spaced relationship on the radial mounting ring 298 in FIG. 37. Each yarn drive unit includes a cylindrical yarn drive roller 294 having a two piece axle shaft 338 removably journaled at one end in a mounting gusset 340 and at its other end in a bevel gear housing 342 for rotative movement about its longitudinal axis (FIG. 43). The drive roller is preferably a steel or aluminum roller even though rollers made of other materials may be as suitable. The bevel gear housing in addition to receiving the axle shaft 338 of a drive roller receives a drive shaft 344, perpendicular to the axle shaft 338, on one end of which is mounted a gear wheel 332 and whose opposite end defines a bearing 346 for receipt in an aligned opening through the radial mounting ring 298. Each drive unit is mounted on the radial mounting ring via the drive shaft 344 and its associated bearing 346 at one end and the mounting gusset 340 which can be welded or otherwise secured to the upstream face of the radial mounting ring at the other end (FIG. 50). Bevel gears 347 (FIGS. 51 and 52) in the bevel gear housing 342 convert in a conventional manner rotational movement of the drive shaft 344 via the gear wheel 332 into rotative movement of the drive axle 338 along the axis of the cylindrical roller which is perpendicular thereto. Accordingly, the cylindrical roller is rotated at a predetermined speed related to the rotational speed of the gear wheel 332.

The gear wheels 332 have teeth around their periphery adapted to mate with and engage the teeth of the internal ring gear 328 when the yarn drive units 292 are mounted on the radial mounting ring 298. Accordingly, as the axially crowned ring 312 is rotated by the motor 74 and its drive belt 106 thereby rotating the internal ring gear, each gear wheel associated with a yarn drive unit is in turn rotated in the same direction imparting rotary movement to the drive shaft 344 of the drive unit and through the bevel gear housing 342 rotative movement to the cylindrical roller 294. It will, therefore, be appreciated from the above that each yarn drive roller 294 is rotated about its axle shaft independently of the speed of rotation of the outer tubular assembly 62 even though each yarn drive unit 292 is rotated with the outer tubular assembly at a speed of rotation determined by the motor 72.

Figure 45:
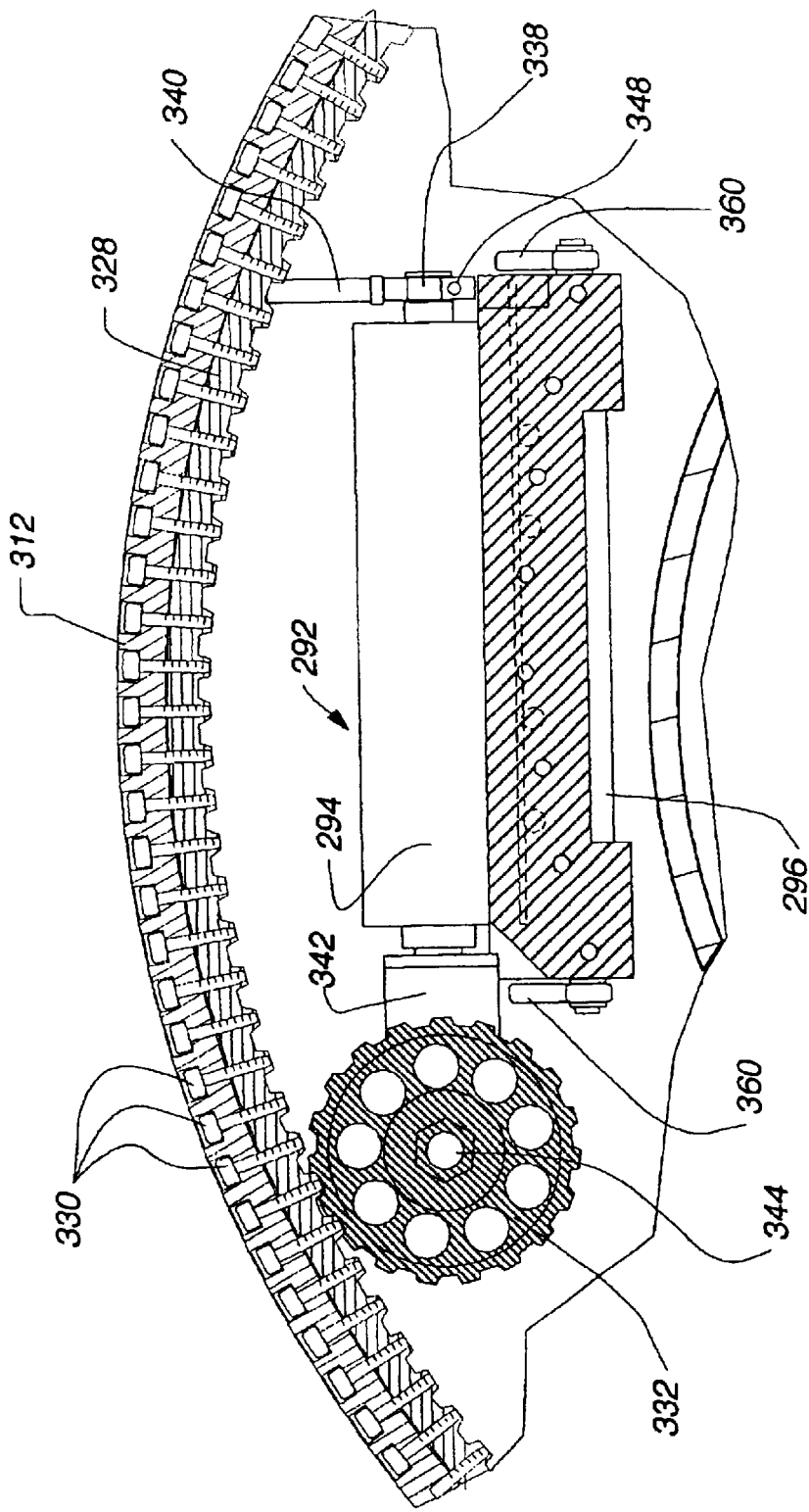
FIG. 45 is an enlarged fragmentary section taken along line 4545 of FIG. 44.
Figure 47:
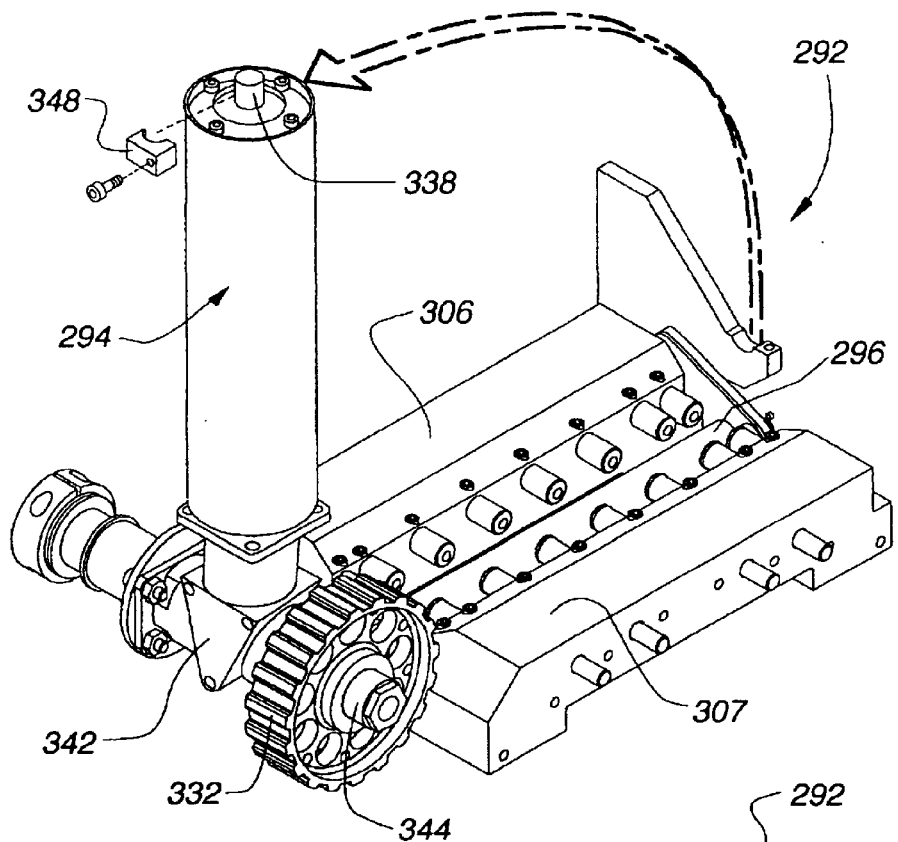
FIG. 47 is an isometric similar to FIG. 46 with the yarn drive unit in an open position.
Figure 46:
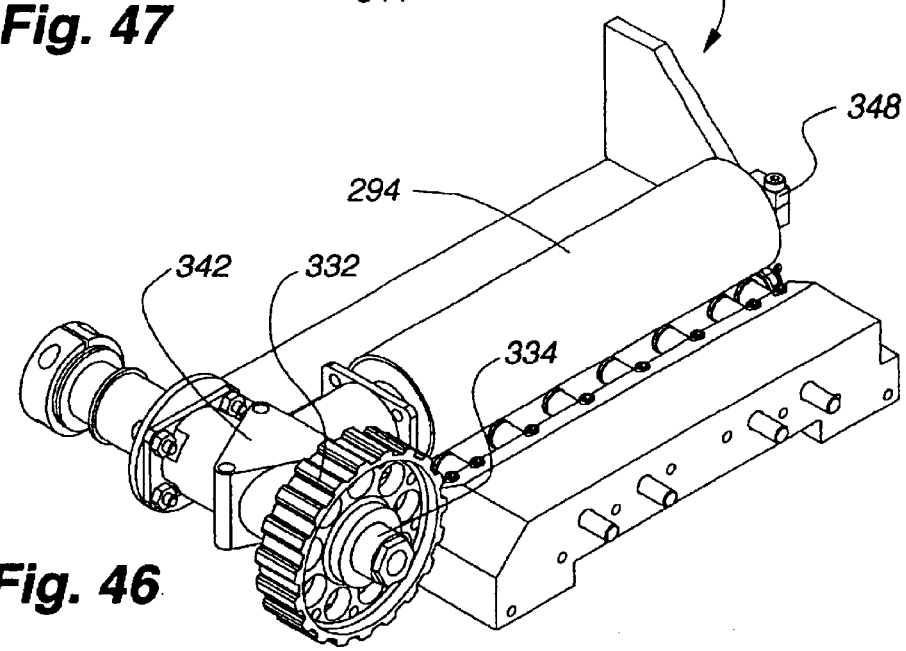
FIG. 46 is an isometric of the yarn drive unit utilized in the tensioner of FIG. 34.
Figure 65:
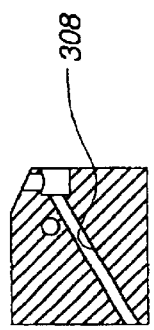
FIG. 65 is a section taken along line 65—65 of FIG. 57.
Figure 64:
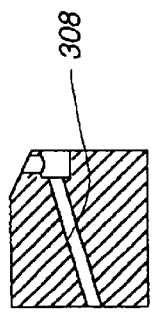
FIG. 64 is a section taken along line 64—64 of FIG. 57.
Figure 63:
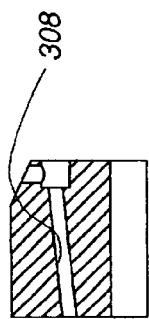
FIG. 63 is a section taken along line 63—63 of FIG. 57.
Figure 62:
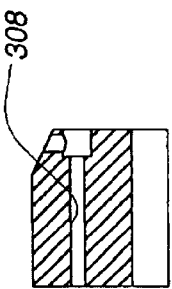
FIG. 62 is a section taken along line 62—62 of FIG. 57.
Figure 61:
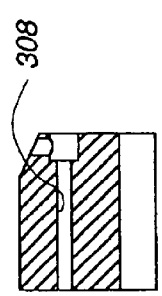
FIG. 61 is a section taken along line 61—61 of FIG. 57.
Figure 60:
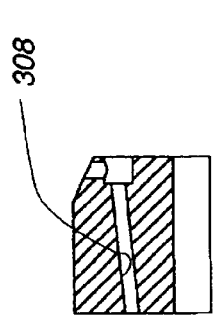
FIG. 60 is a section taken along line 60—60 of FIG. 57.
Figure 59:
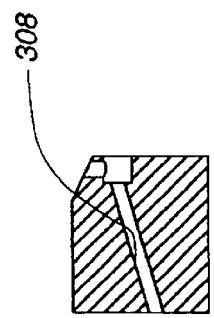
FIG. 59 is a section taken along line 59—59 of FIG. 57.
Figure 58:
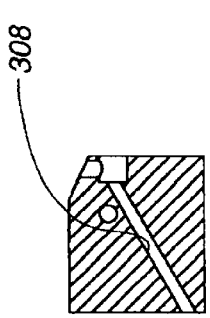
FIG. 58 is a section taken along line 58—58 of FIG. 57.
Figure 66:
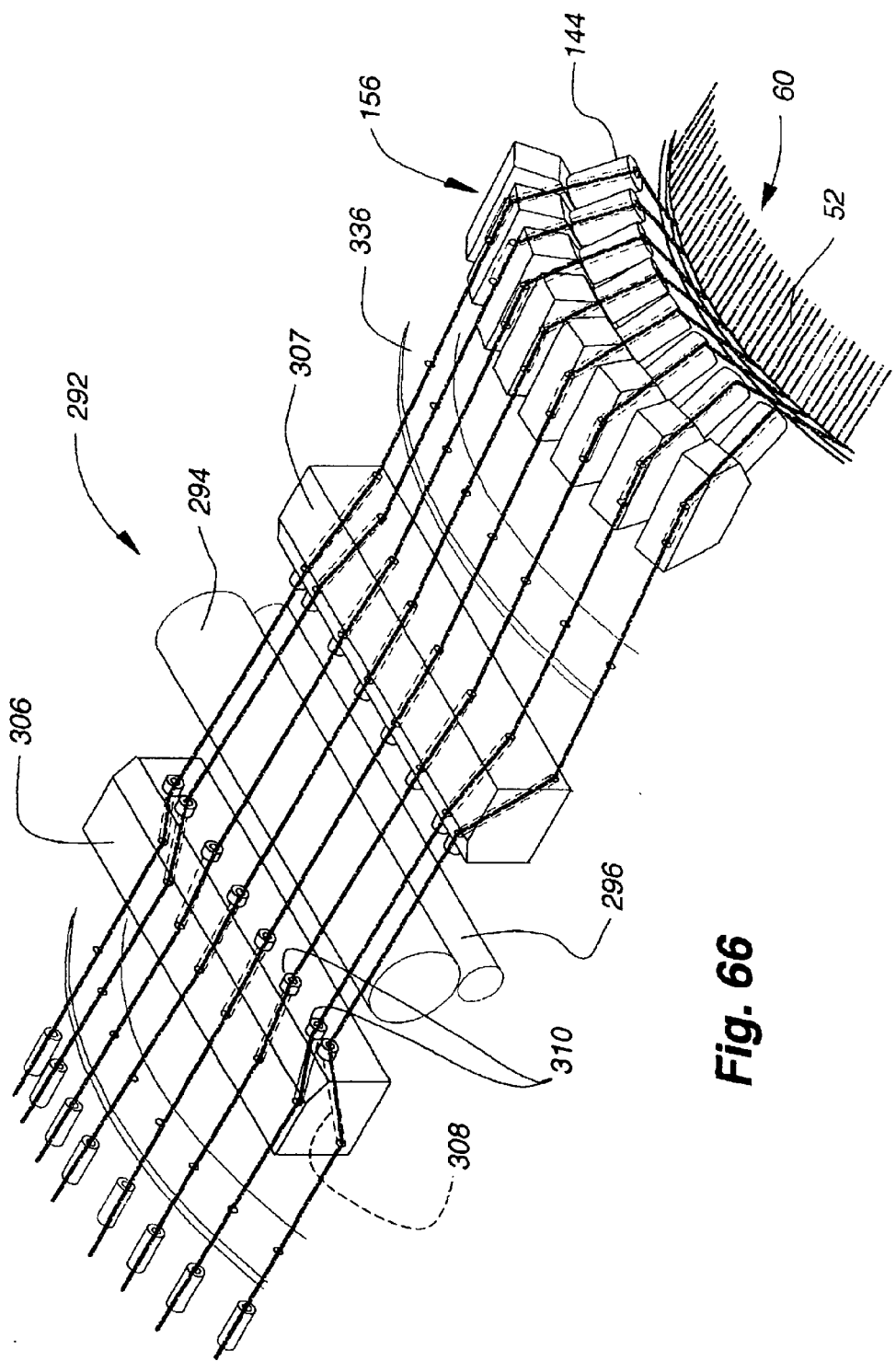
FIG. 66 is a fragmentary diagrammatic isometric illustrating yarns passing through a yarn drive unit.

The bevel gear housing 342 is pivotally mounted on the drive shaft 344 for each yarn drive unit so the cylindrical yarn drive roller 294 can be pivoted upwardly as shown in FIG. 47 from a normal operative position of FIG. 46 during maintenance or threading of the tensioning unit 290 with the weft yarns 65. The free end of the axle shaft of each drive roller is releasably secured to the mounting gusset 340 with a clamp 348 and suitable fastener which can be easily released to move the drive roller from the operating position of FIG. 46 to the maintenance position of FIG. 47. With reference to FIG. 45, a yarn drive unit 292 is shown mounted on the radial mounting ring 298 with its gear wheel 332 in meshed relationship with the inner ring gear 328 which is in turn mounted on the radially inner surface of the axially crowned ring 312.

As mentioned previously, weft yarns 65 moving upstream from associated yarn spools 64 emanate from the upstream end of the upstream drive belt ring 172 and from that location pass upstream into a yarn orienting block 306. A yarn orienting block is associated with each yarn drive unit 292 and each is of identical construction. The blocks are illustrated in FIGS. 53–65. As will be appreciated, the weft yarns emanating from the upstream end of the upstream drive belt ring 172 are circumferentially spaced around the circular upstream end of the drive belt ring 172 but as can be seen with reference to FIGS. 53 and 54, the yarns emanating from an orienting block are in side-by-side coplanar relationship. Accordingly, as the yarns emanate in a circular array from the upstream end of the ring 172, they extend through different angles before being fed into an associated passage 308 in an associated orienting block. It is important that the yarns emanating from an orienting block are coplanar and aligned side-by-side with each other so they can be fed tangentially to an associated cylindrical yarn drive roller 294 which advances the yarns upstream to the nozzle assembly 156.

The downstream face 350 of an orienting block is shown in FIG. 54 to include an arcuate array of eight of the passages 308 into which individual associated yarns 65 can be passed. The passages open through the upstream face 352 (FIG. 53) of the orienting block with the upstream ends of the passages 308 being coplanar and in a straight line so yarns emanating from the upstream face of the orienting block are aligned tangentially to a cylindrical yarn drive roller adjacent thereto. The passages through the orienting block have varied configurations as seen in FIG. 55 to transmit the yarns from the arcuate array that enters the downstream face 350 of the block to the coplanar array emanating from the upstream face 352 of the block. Further, each passage through the orienting block, as mentioned previously, has a low-friction sleeve 310 inserted therein to allow free passage of the yarn through the orienting block. Horizontal passages 358 are provided through the orienting blocks for fasteners so the orienting blocks can be secured to the extension ring 302 for unitary rotation therewith.

The weft yarns, as mentioned previously, are held against the face of the cylindrical yarn drive rollers 294 with the nip roller 296 which is also cylindrical in configuration so as to be engageable with the cylindrical drive roller along its entire length. Each nip roller is mounted on the end of a pair of pivotal arms 360 as probably best seen in FIGS. 49–52 with the pivotal arms being mounted on pivot pins 362 in the ends of an associated orienting block 306. The pivotal mounting allows the nip roller to be pivoted radially outwardly into engagement with the weft yarns 65 (FIGS. 49 and 52) as they pass across the surface of the drive roller 294 when the outer tubular assembly 62 is rotated above a predetermined speed. In other words, the centrifugal force applied to the nip roller through rotation of the outer tubular assembly causes the nip roller to pivot radially about its pivotal mounting toward a drive cylinder, but when the outer tubular assembly is not rotating, the nip roller pivots to a non-operative or maintenance position as shown in FIGS. 50 and 51. The nip rollers can be releasably locked in the non-operative maintenance position by a releasable detent lock 363 provided on the pivotal arms 360. Operation of the tensioner in the non-operative position of the pivotal arms reduces the tension in the weft yarns being laid down on the warp sheet. The detent lock includes a pin on the lock arm that can be selectively engaged in a detent (not seen) in the end of the associated orienting block to selectively retain the lock arm in the non-operative position. Removal of the pin from the detent of course permits the lock arms to pivot as the centrifugal force dictates. Locking the pivot arms and consequently the nip rollers in the non-operative position is important when it is desirable to use weft yarns having low tensile strength to prevent the yarns from breaking. A fabric produced with the nip rollers in the non-operative position would have a non-uniform appearance with a wavy pattern in the fabric.

Figure 40:
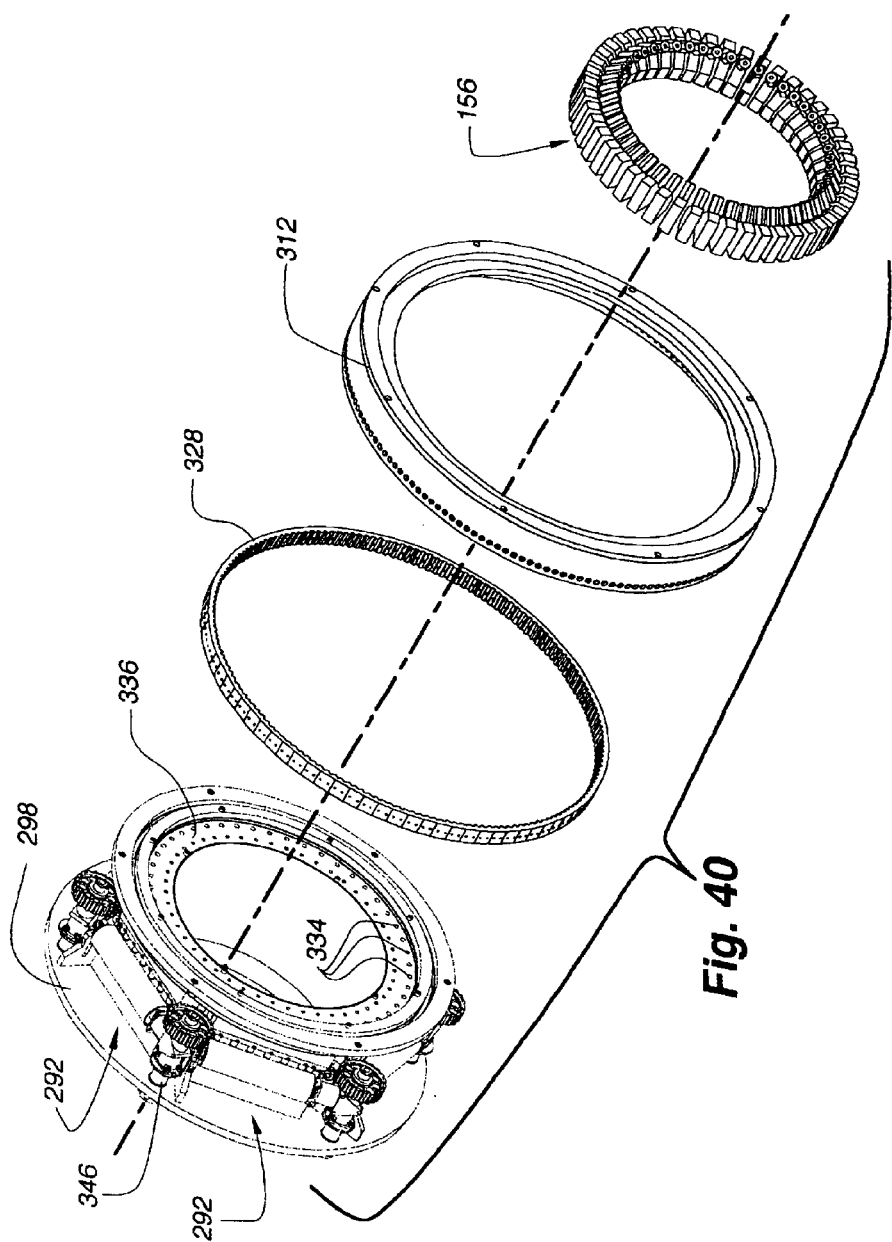
FIG. 40 is an exploded isometric of the tensioning system of FIG. 34.
Figure 41:
FIG. 41 is a side plan view of an internal ring gear used in the tensioner of FIG. 34.
Figure 42:
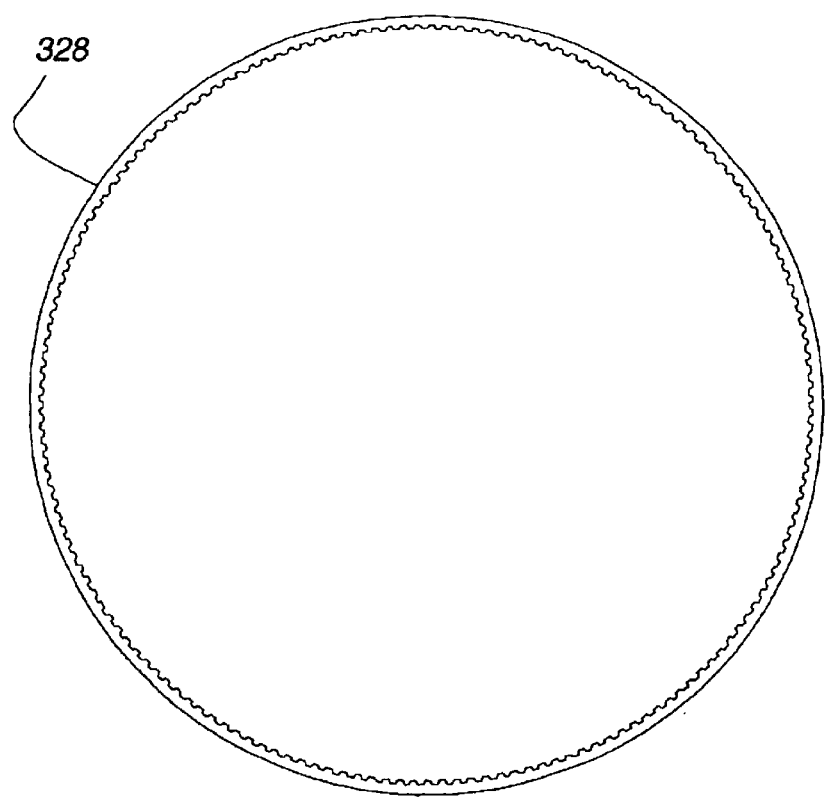
FIG. 42 is a front view of the internal ring gear of FIG. 41.

Coplanar yarns 65 leaving the cylindrical drive rollers 294 are advanced upstream and pass through an associated re-orienting block 307 and subsequently through the circumferentially arranged passages 334 in the yarn redistributing ring 336 (FIGS. 40, 43, and 44). The yarn re-orienting blocks 307 are structurally identical to the yarn orienting blocks 306 but are mounted on the downstream face of the redistributing ring in a reverse orientation to the orienting blocks. In other words, the downstream face of an orienting block 306 becomes the upstream face of a re-orienting block 307 and the upstream face of an orienting block becomes the downstream face of a re-orienting block. In this manner, the co-planar yarns leaving the drive roller 294 are fed into the coplanar openings in the downstream face of the re-orienting blocks 307 and emerge through the arcuate array of openings in the upstream face of a re-orienting block. The arcuate array of openings are aligned with corresponding passages 334 in the redistributing ring 336 so the yarns then pass into associated nozzles in the nozzle assembly 156.

As mentioned previously, the nozzle assembly 156 is secured to the upstream face of the yarn redistributing ring with each nozzle 144 in the nozzle assembly being aligned and associated with a passage 334 through the yarn redistributing ring so that each yarn is fed in and through its associated nozzle before passing downwardly onto the lay down ring 96. A low friction sleeve 310 is also positioned and secured in the passages 308 through the yarn reorienting block 307 to facilitate the ease of movement of the yarns through the tensioning assembly.

The operation of the tensioner 290 is probably best described by reference to FIG. 44. It will there be seen that the plurality of weft yarns 65 moving upstream from their weft yarn spools 64 emanate from the upstream end of the upstream drive belt ring 172. The weft yarns emanating from the upstream end of the ring 172 are in a circular array and pass through a gap 368 defined in the extension ring 302 to a preassigned passage 308 through one of the six yarn orienting blocks 306 mounted on the extension ring. The passages 306 opening through the downstream face 350 of the yarn orienting blocks form an arc for receipt of the weft yarns from the ring 172 but as the yarns pass through the yarn orienting block, they become aligned into a coplanar side-by-side relationship and are aligned tangentially with the radially innermost extent of the associated cylindrical yarn drive roller 294. The yarns are pinched against the drive roller with the associated nip roller 296 when the outer rotating tubular assembly 62 is rotating above a predetermined speed so the yarns are advanced upstream due to their frictional engagement with the cylindrical yarn drive roller. The yarns after passing an associated yarn drive unit 292 are fed into a yarn re-orienting block 307 and subsequently into a circular array of passages 334 in the yarn redistributing ring 336 with each of these passages being aligned and associated with an associated nozzle 144 in the nozzle assembly 156 so the yarns can be emitted from the upstream end of the nozzle assembly and deposited onto the lay down ring 96 where they are subsequently applied to the warp sheet 52 in a cross directional manner.

The cylindrical yarn drive rollers 294 are driven at an independent speed from that of the outer rotating tubular assembly 62 by the motor 74 and its drive belt 106 which is operatively engaged with the axially crowned ring 312. The crowned ring having the internal ring gear 328 on its inner surface is meshed with the gears wheels 332 whose rotations are transferred through the drive shafts 344 and bevel gears (not seen) to drive the axle shafts 338 of the drive rollers at a predetermined speed. The desired rotative speed of the drive rollers of course is determined by the factors identified previously with regard to the first described embodiment so as to deliver the weft yarns to the lay down ring 96 under uniform tension and speed.

Although the present invention has been described with a certain degree of particularity, it is understood that the disclosure has been made by way of example, and changes in detail or structure may be made without departing from the spirit of the invention as defined in the appended claims.

What is claimed is:

1. An apparatus for wrapping weft yarns around a cylindrically configured warp sheet of warp yarns comprising in combination:

an elongated tube rotatable about its longitudinal axis, said tube circumferentially surrounding said cylindrically configured warp sheet of warp yarns such that said warp yarns can be moved linearly in a downstream direction through said rotatable tube, means for moving said warp sheet of warp yarns linearly through said rotatable tube, a plurality of spools of weft yarn secured to said tube in circumferentially spaced relationship, guide systems for confining and guiding said weft yarns in an upstream direction to an upstream location on said tube, a lay down member at said upstream location for receiving weft yarns from said spools and depositing the weft yarns on said warp sheet as said tube is rotated and said warp sheet is moved linearly past said upstream location, and a weft yarn tensioning system for creating substantially uniform tension in said weft yarns before they are deposited onto said lay down member, said tensioning system including at least one driven roller for engagement with at least some of said weft yarns to advance said weft yarns that are in engagement therewith in an upstream direction at a predetermined speed.

2. The apparatus of claim 1 wherein said weft yarns are disposed in a circular array as they are guided to said upstream location and further including an alignment member for arranging said at least some of said weft yarns into a coplanar relationship aligned substantially tangentially to said at least one driven roller downstream from said at least one driven roller.

3. The apparatus of claim 2 wherein there are a plurality of said driven rollers spaced circumferentially around said warp sheet and distinct sets of weft yarns associated with each driven roller.

4. The apparatus of claim 3 further including power means for rotating said elongated tube independently of said driven rollers.

5. The apparatus of claim 4 further including a system for rotating said driven rollers at substantially identical speeds.

6. The apparatus of claim 4 wherein said power means includes two motors, one for rotating the elongated tube and one for rotating said driven rollers.

7. The apparatus of claim 6 further including a system for rotating said driven rollers at substantially identical speeds.

8. The apparatus of claim 7 wherein said system includes an internal ring gear and a plurality of pinion gears operatively associated with said drive rollers such that rotation of said internal ring gear effects rotation of said drive rollers at substantially identical speeds.

9. The apparatus of claim 3, 5 or 8 further including a pinch roller associated with each drive roller adapted to engage said weft yarns to hold the weft yarns against the surface of an associated drive roller.

10. The apparatus of claim 9 wherein said pinch rollers are pivotally mounted on said rotating tube in a position to be centrifugally pivoted into engagement with weft yarns as they engage said drive rollers.

11. The apparatus of claim 10 further including a lock system for locking the pinch roller in a non-engaging relationship with the weft yarns.

12. The apparatus of claim 2 further including a weft yarn redistributing system for arranging said weft yarns in a circular array upstream from said upstream location.

13. The apparatus of claim 11 wherein there are a plurality of said driven rollers spaced circumferentially around said warp sheet and distinct sets of weft yarns associated with each driven roller, there further including an alignment member associated with each driven roller.

* * * * *